(12) United States Patent
Funayama et al.

(10) Patent No.: US 7,045,864 B2
(45) Date of Patent: May 16, 2006

(54) SEMICONDUCTOR INTEGRATED CIRCUIT DEVICE

(75) Inventors: Kota Funayama, Hitahinaka (JP); Yasuko Yoshida, Sayama (JP); Masaru Nakamichi, Hitachinaka (JP); Akio Nishida, Tachikawa (JP)

(73) Assignees: Renesas Technology Corp., Tokyo (JP); Hitachi ULSI Systems Co., Ltd., Tokyo (JP)

(*) Notice: Subject to any disclaimer, the term of this patent is extended or adjusted under 35 U.S.C. 154(b) by 242 days.

(21) Appl. No.: 10/170,432

(22) Filed: Jun. 14, 2002

(65) Prior Publication Data
US 2003/0006433 A1 Jan. 9, 2003

(30) Foreign Application Priority Data
Jul. 9, 2001 (JP) .............................. 2001-207975

(51) Int. Cl.
*H01L 29/76* (2006.01)

(52) U.S. Cl. ................. 257/369; 257/377; 257/382; 257/384; 257/393; 257/903; 257/904; 438/630; 438/682

(58) Field of Classification Search ............... 257/393, 257/903–904
See application file for complete search history.

(56) References Cited

U.S. PATENT DOCUMENTS

| | | | | | |
|---|---|---|---|---|---|
| 5,159,416 | A | * | 10/1992 | Kudoh | 257/384 |
| 5,350,933 | A | * | 9/1994 | Yoshihara | 257/69 |
| 5,521,860 | A | * | 5/1996 | Ohkubo | 365/154 |
| 5,578,854 | A | * | 11/1996 | Chen et al. | 257/349 |
| 5,777,920 | A | * | 7/1998 | Ishigaki et al. | 365/154 |
| 6,178,110 | B1 | * | 1/2001 | Hayashi | 365/154 |
| 6,686,274 | B1 | * | 2/2004 | Shimazu et al. | 438/653 |

FOREIGN PATENT DOCUMENTS

JP  9-199720  7/1997

* cited by examiner

Primary Examiner—Tom Thomas
Assistant Examiner—José R. Díaz
(74) Attorney, Agent, or Firm—Antonelli, Terry, Stout and Kraus, LLP.

(57) ABSTRACT

A semiconductor integrated circuit device, e.g., a memory cell of an SRAM, is formed of a pair of inverters having their input and output points connected in a crisscross manner and being formed of drive n-channel MISFETs and load p-channel MISFETs. The n-channel MISFETs and p-channel MISFETs have their back gates supplied with power supply voltage and a ground voltage, respectively. The MISFETs are formed with a metal silicide layer on the gate electrodes G and source regions (hatched areas) and without the formation of a metal silicide layer on the drain regions, respectively, whereby the leakage current of the MISFETs due to a voltage difference between the drain regions and wells can be reduced, and, thus, the power consumption can be reduced.

5 Claims, 72 Drawing Sheets

PERIPHERAL CIRCUIT FORMING AREA

MEMORY SELL FORMING AREA

PERIPHERAL CIRCUIT FORMING AREA

MEMORY SELL FORMING AREA

SEMICONDUCTOR INTEGRATED CIRCUIT DEVICE

BACKGROUND OF THE INVENTION

The present invention relates to a semiconductor integrated circuit device; and, more particularly, the invention relates to a technique for use in the fabrication of a semiconductor integrated circuit device, including an SRAM (Static Random Access Memory).

Cache memories of personal computers and workstations use an SRAM, the memory cells of which are each formed of six MISFETs (Metal Insulator Semiconductor Field Effect Transistors). More specifically, a memory cell is made up of a flip-flop circuit for storing 1-bit of data and two data transfer MISFETs, and the flip-flop circuit is formed of a pair of drive MISFETs and a pair of load MISFETs, for example.

Each MISFET has its source-drain regions overlaid with a silicide layer, which reduces the resistance of the source-drain regions and also reduces the contact resistance with plugs which are formed on the regions. The MISFET also has its gate electrode overlaid with a silicide layer, which reduces the resistance of the gate electrode.

The silicide layer is formed in a self-alignment manner (technique of salicide structure) by, for example, depositing a metallic film on the source-drain regions and gate electrode, and inducing the reaction of silicification in the contact section between the source-drain regions (silicon substrate) and the metallic film and in the contact section between the gate electrode (silicon layer) and the metallic film. Japanese Patent Unexamined Publication No. Hei 9(1997)-199720 describes a technique for forming a silicide layer on the source-drain regions and gate electrode.

SUMMARY OF THE INVENTION

In the recent trend toward higher integration and microstructuring of semiconductor integrated circuit devices, transistors are becoming to have much smaller dimensions in the width of the gate electrode and the junction depth of the source-drain regions thereof. Semiconductor integrated circuit devices of the type used for portable telephone units and hand-held personal computers, for example, are required to intensively reduce their power consumption due to their reliance on power supplied from batteries.

The inventors of the present invention, who are studying and developing semiconductor integrated circuit devices of low power consumption, have encountered a problem of degraded yield of production due to a failure to attain a demanded low power consumption, e.g., a target standby current of 5 μA. An intensive study of the cause of this problem has revealed that a leakage current attributable to the silicide layer contributes to this problem.

Specifically, a cross-sectional observation of MISFETs of a memory cell using a SEM (Scanning Electron Microscope) has revealed that some portions of the silicide layer penetrate into regions under the junction plane of the source-drain regions (regions a and b in FIG. 47), as will be explained in detail later. Conceivably, these portions create leakage currents, increasing the standby current of the whole chip (memory cell array).

The study has also revealed that there are portions at the connection nodes of the six MISFETs (storage nodes A and B in FIG. 1) at which a voltage difference occurs between the nodes (source and drain) and the semiconductor substrate (well), so that a leakage current is prone to arise, particularly in these portions, as will be explained in detail later.

An object of the present invention is to provide a technique that is capable of reducing the leakage current of a semiconductor integrated circuit device, e.g., the memory cells of an SRAM.

Another object of the present invention is to provide a technique that is capable of reducing the power consumption of a semiconductor integrated circuit device, e.g., the memory cells of an SRAM.

These and other objects and novel features of the present invention will become apparent from the following description and the accompanying drawings.

Among the features of the present invention disclosed in this specification, representative aspects will be described brief as follows.

(1) The inventive semiconductor integrated circuit device comprises memory cells, each formed of a pair of n-channel MISFETs having their gate electrodes and drains connected in a crisscross manner, and being formed with and without the formation of a metal silicide layer on the gate electrodes and source regions and on the drain regions, respectively.

(2) The inventive semiconductor integrated circuit device comprises memory cells, each formed of a pair of inverters having their input and output points connected in a crisscross manner, and each formed of a drive n-channel MISFET and a load p-channel MISFET, and a pair of transfer n-channel MISFETs, which are connected to the input points and output points of the inverters and are formed with and without the formation of a metal silicide layer on the gate electrodes and on the source-drain regions, respectively.

(3) The inventive semiconductor integrated circuit device comprises memory cells, each formed of a pair of inverters having their input and output points connected together, and each formed of an n-channel MISFET and a p-channel MISFET having their gate electrodes connected together and being formed with a metal silicide layer on the gate electrode connecting region.

(4) The inventive semiconductor integrated circuit device comprises memory cells, each formed of a pair of inverters having their input and output points connected together, and each formed of an n-channel MISFET and a p-channel MISFET, which are formed in a first semiconductor region and second semiconductor region, respectively, isolated by a isolation region, which have gate electrodes extending from the first and second semiconductor regions up to the top of the isolation region, and which are formed with and without the formation of a metal silicide layer on the gate electrode portions above the isolation region and on the gate electrode portions above the first and second semiconductor regions, respectively.

(5) The inventive semiconductor integrated circuit device includes a first area for forming a memory cell, which is made up of a pair of n-channel MISFETs having their gate electrodes and drains connected in a crisscross manner, and a second area for forming an n-channel MISFET and p-channel MISFET of a logic circuit, and which is formed with and without the formation of a metal silicide layer on the gate electrodes and source-drain regions of the MISFETs of the logic circuit and on the gate electrodes and source-drain regions of the n-channel MISFET pair, respectively.

(6) The inventive semiconductor integrated circuit device comprises an inverter, which is formed of an n-channel MISFET and a p-channel MISFET, both of which are formed with and without the formation of a metal silicide layer on the gate electrodes and source regions and on the drain regions, respectively.

(7) The inventive semiconductor integrated circuit device comprises a MISFET having its one end connected to an external terminal and being formed with and without the formation of a metal silicide layer on the gate electrode and one source-drain region unconnected to the external terminal out of the source-drain regions and on another source-drain region connected to the external terminal, respectively.

DETAILED DESCRIPTION OF THE PREFERRED EMBODIMENTS

Embodiments of this invention will be explained in detail with reference to the drawings. Throughout all of the figures, items having the same functions are referred to by the same symbols, and an explanation thereof will not be repeated.

First Embodiment

Figure 1:
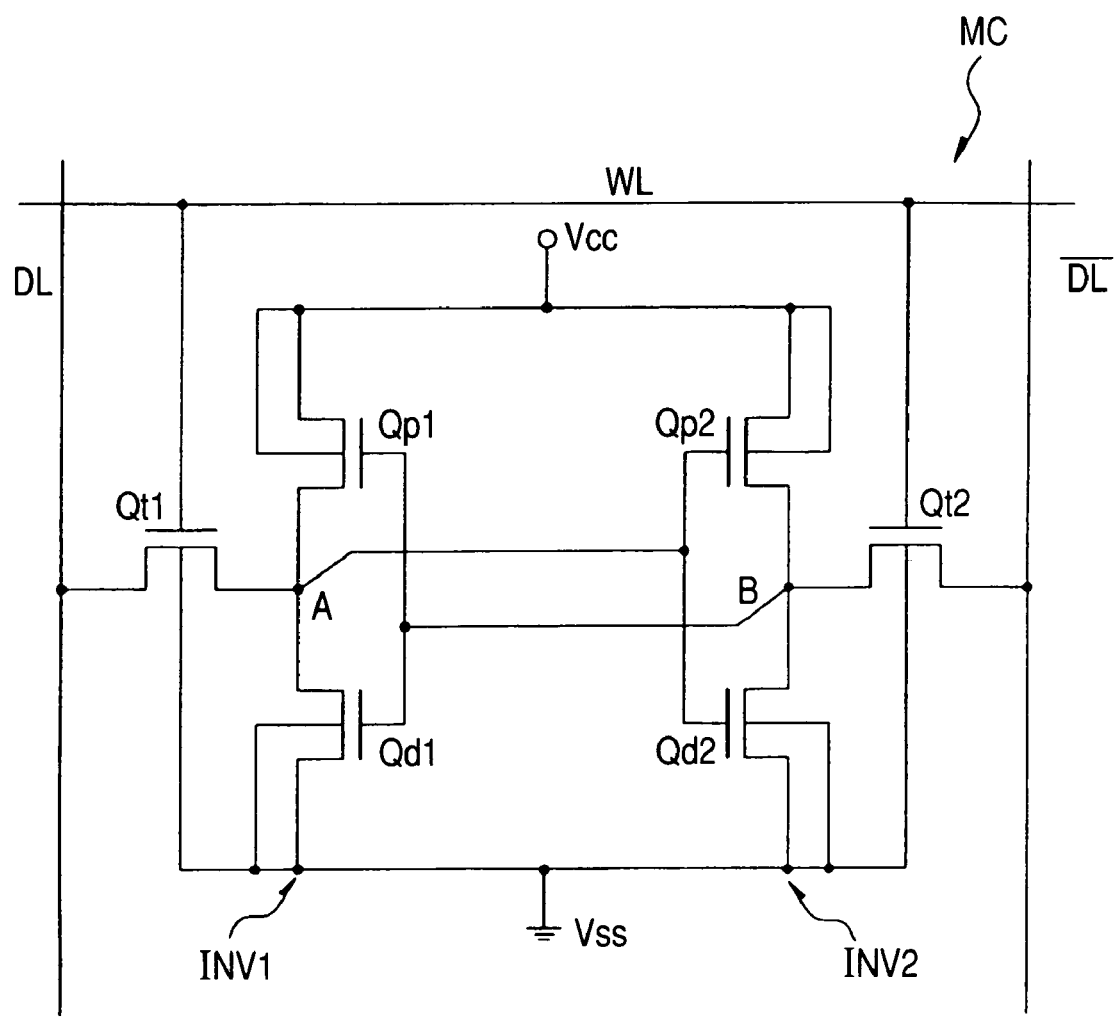
FIG. 1 is a schematic circuit diagram showing an equivalent circuit of the SRAM memory cell based on a first embodiment of this invention.
Figure 2:
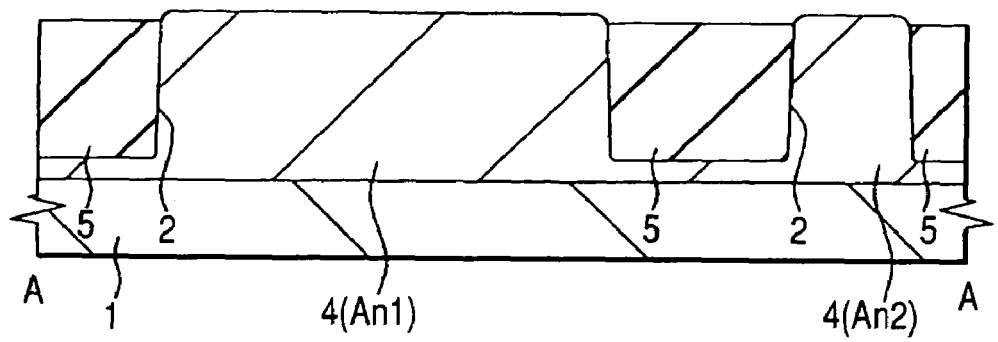
FIG. 2 through FIG. 5 are cross-sectional diagrams showing the principal portions of the substrate, respectively, of the SRAM memory cell of the first embodiment, as seen along lines A—A, B—B, C—C and D—D in FIG. 6, during a step in the fabrication thereof.
Figure 3:
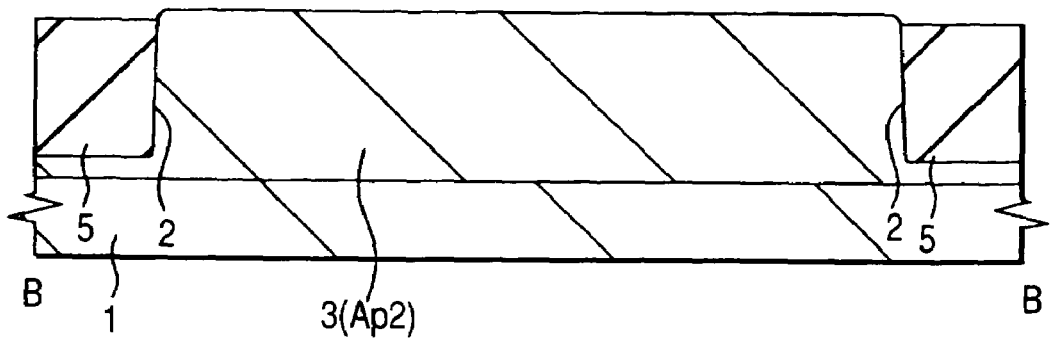
Figure 4:
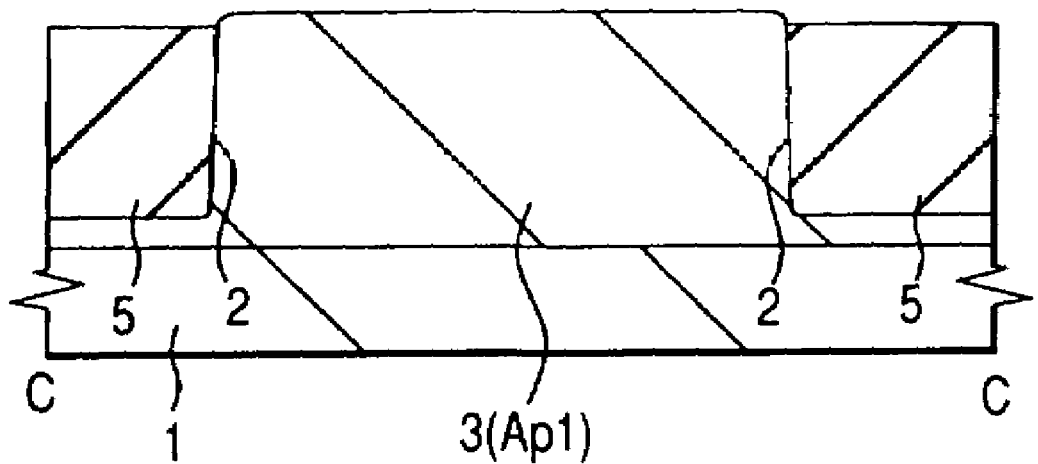
Figure 5:
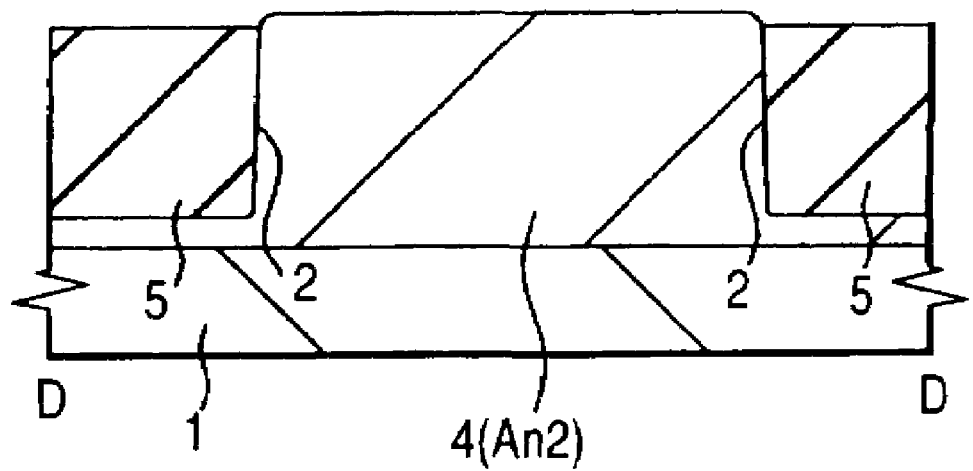

FIG. 1 shows the equivalent circuit of the SRAM memory cell based on the first embodiment of this invention. The memory cell MC is formed of a pair of drive MISFETs Qd1 and Qd2, a pair of load MISFETs Qp1 and Qp2, and a pair of transfer MISFETs Qt1 and Qt2. It is located at the intersection of a pair of complementary data lines (data lines DL and /DL) and a word line WL. The drive MISFETs Qd1 and Qd2 and transfer MISFETs Qt1 and Qt2 are n-channel MISFETs, and the load MISFETs Qp1 and Qp2 are p-channel MISFETs.

Among the six MISFETs of the memory cell MC, the drive MISFET Qd1 and load MISFET Qp1 form a CMOS inverter INV1, and the drive MISFET Qd2 and load MISFET Qp2 form another CMOS inverter INV2. The CMOS inverters INV1 and INV2 have their input and output terminals (storage nodes A and B) connected in a crisscross manner to form a flip-flop circuit for storing 1-bit of data.

The load MISFET Qp1 and drive MISFET Qd1 are connected in series between the power supply voltage Vcc and the ground voltage Vss to form the storage node A at their connection point. The load MISFET Qp2 and drive MISFET Qd2 are connected in series between the power supply voltage Vcc and the ground voltage Vss to form the storage node B at their connection point. The load MISFET Qp1 and drive MISFET Qd1 have their gate electrodes connected to the storage node B, while the load MISFET Qp2 and drive MISFET Qd2 have their gate electrodes connected to the storage node A. The load MISFETs Qp1 and Qp2 have their back gates supplied with the power supply voltage Vcc (driving voltage), while the drive MISFETs Qd1 and Qd2 have their back gates (semiconductor substrate or well) supplied with the ground voltage Vss (reference voltage).

The flip-flop circuit has its one input/output terminal (storage node A) connected to one of the source-drain regions of the transfer MISFET Qt1, and its other input/output terminal (storage node B) connected to one of the source-drain regions of the transfer MISFET Qt2. The transfer MISFET Qt1 has its other source-drain region connected to the data line DL, and the transfer MISFET Qt2 has its other source-drain region connected to the data line /DL. The transfer MISFETs Qt1 and Qt2 have their back gates supplied with the ground voltage Vss.

In operation, when one CMOS inverter INV1 has a high (H) level on its storage node A, the drive MISFET Qd2 turns on, causing another CMOS inverter INV2 to have a low (L) level on its storage node B. Consequently, the drive MISFET Qd1 turns off, and the high level of the storage node A is retained. Namely, a latch circuit formed by the CMOS inverter pair INV1 and INV2 in crisscross connection holds the voltage levels of both of the storage nodes A and B, and 1-bit of data is stored while supply of the power voltage is maintained.

In case the storage node A is high, i.e., the drive MISFET Qd1 has a high level on its drain, while it has the supply of ground voltage Vss on its back gate, there arises a voltage difference between the drain of Qd1 and the substrate (well). In this case, the storage node B is low, i.e., the load MISFET Qp2 has a low level on its drain, while it has the power supply voltage Vcc on its back gate, so that there arises a voltage difference between the drain of Qp2 and the substrate (well).

In another case where the storage node B is high, a voltage difference arises between the drain of Qd2 and the substrate (well) and a voltage difference arises between the drain of Qp1 and the substrate (well).

The transfer MISFETs Qt1 and Qt2 are controlled to have the conductive or non-conductive state by having their gate electrodes connected to the word line WL. The word line WL having a high level turns on the transfer MISFETs Qt1 and Qt2, connecting the flip-flop circuit to the complementary data lines (DL, /DL), and 1-bit of data of the memory cell MC in terms of voltage levels (high or low) on the storage nodes A and B is read out to the data line pair DL and /DL.

In case the storage node A is high, i.e., the transfer MISFET Qt1 is high at its one end (storage node A), while it has the ground voltage Vss on its back gate, there arises a voltage difference between one end (source-drain regions) of Qt1 and the substrate (well). In another case where the storage node B is high, there arises a voltage difference between one end (source-drain regions) of Qt2 and the substrate (well).

In writing 1-bit of data into the memory cell MC, the word line WL is brought to the high level to turn on the transfer MISFETs Qt1 and Qt2 so that voltage levels on the data line pair DL and /DL are transferred to the storage nodes A and B.

In case the data line DL is high, i.e., the transfer MISFET Qt1 is high at its other end (source-drain region), while it has the ground voltage Vss on its back gate, there arises a voltage difference between the other end (source-drain region) of Qt1 and the substrate (well). In another case where the data line /DL is high, i.e., the transfer MISFET Qt2 is high at its other end (source-drain region), while it has the ground voltage Vss on its back gate, there arises a voltage difference between the other end (source-drain region) of Qt2 and the substrate (well).

Next, the SRAM memory cell of this embodiment will be explained in connection with its fabrication process, with reference to FIG. 2 through FIG. 46.

Figure 6:
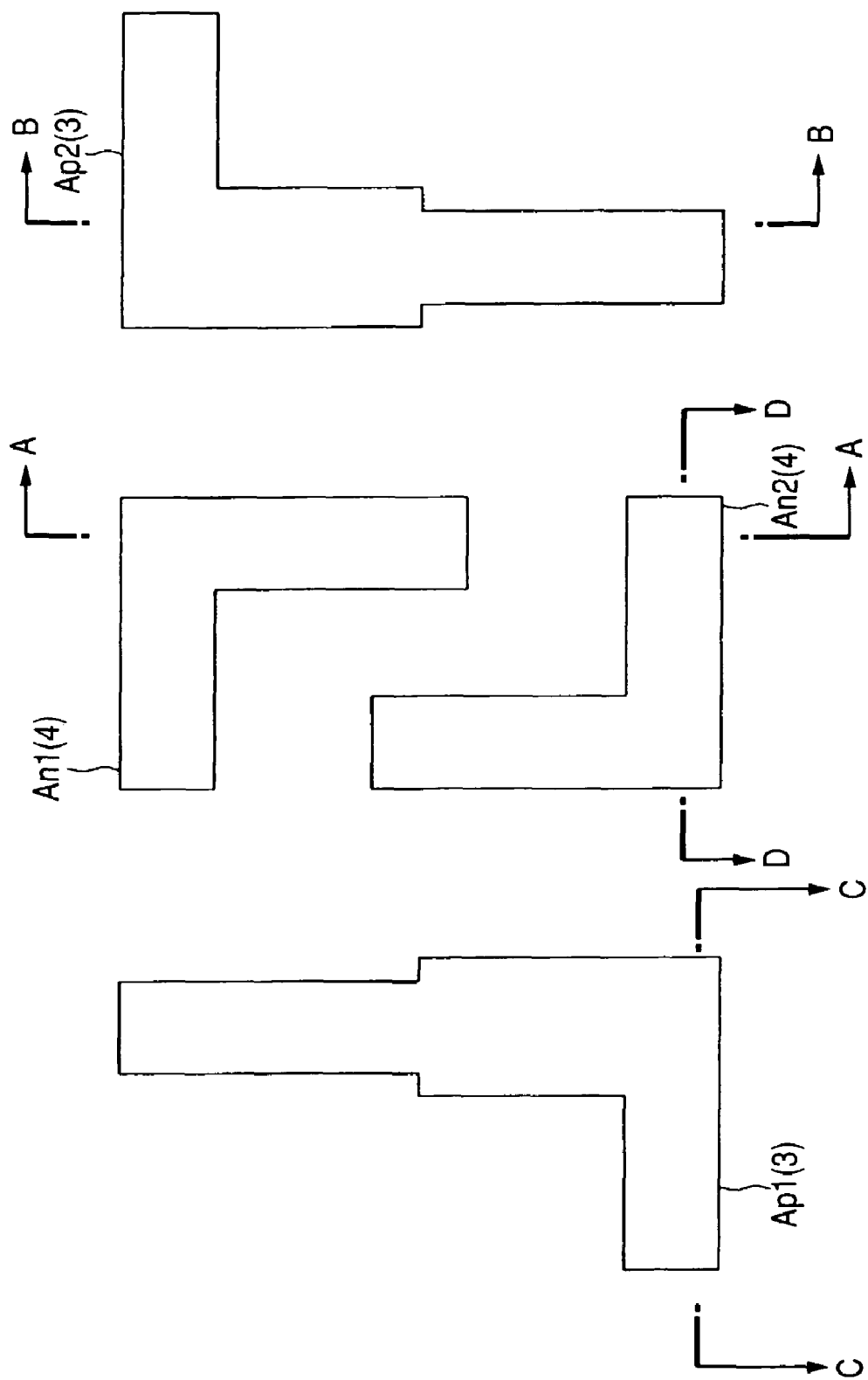
FIG. 6 is a plan view of the principal portions of the substrate, showing the configuration of the SRAM memory cell of the first embodiment, at a step in the fabrication thereof.

First, a device isolation 2 is formed in a semiconductor substrate 1, as shown in FIG. 2 through FIG. 6. FIG. 6 is a plan view of the substrate 1, showing an area where one memory cell is formed, and FIG. 2, FIG. 3, FIG. 4 and FIG. 5 show the cross sections taken along the lines A—A, B—B, C—C and D—D, respectively, of FIG. 6. The isolation 2 is formed as follows.

The semiconductor substrate 1, which is p-type monocrystalline silicon having a resistivity of around 1–10 Ω cm, for example, is etched to form an isolation groove of about 250 nm in depth.

The substrate 1 is treated for thermal oxidation at about 1000° C. so that a thin silicon oxide film of about 10 nm (not shown) is formed on the inner wall of the groove. This silicon oxide film is intended to mend the damage caused by dry etching on the groove inner wall and to relieve the stress appearing on the border between the substrate 1 and a silicon oxide film 5, which will be buried in the groove in the next processing step.

Next, a silicon oxide film 5 of around 450–500 nm in thickness is deposited on the substrate 1 to fill the groove based on the CVD (Chemical Vapor Deposition) process, and the surface of the silicon oxide film 5 on the groove is polished so as to be flat using the CMP (Chemical Mechanical Polishing) process.

Figure 7:
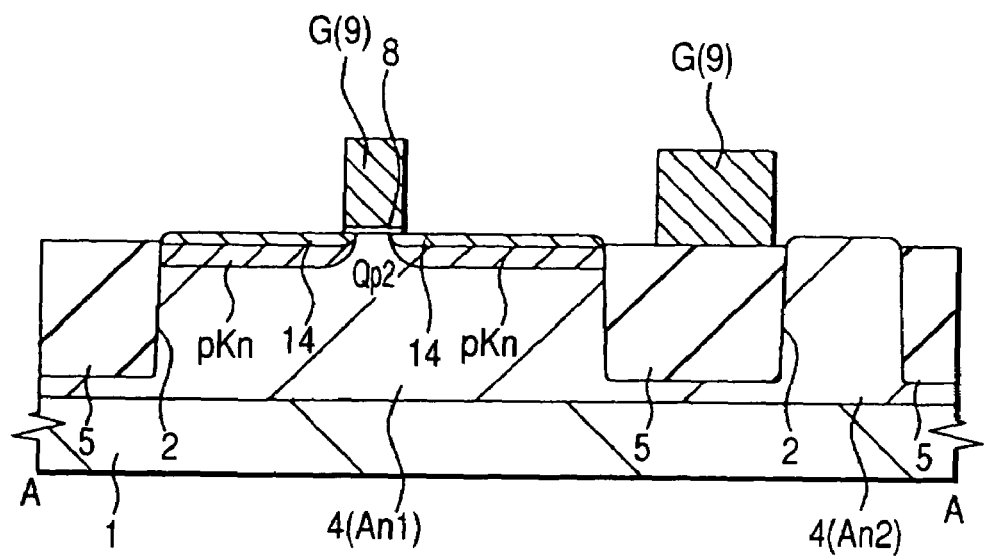
FIG. 7 through FIG. 10 are cross-sectional diagrams showing the principal portions of the substrate, respectively, of the SRAM memory cell of the first embodiment, as seen along lines A—A, B—B, C—C and D—D in FIG. 11, during a step in the fabrication thereof.
Figure 8:
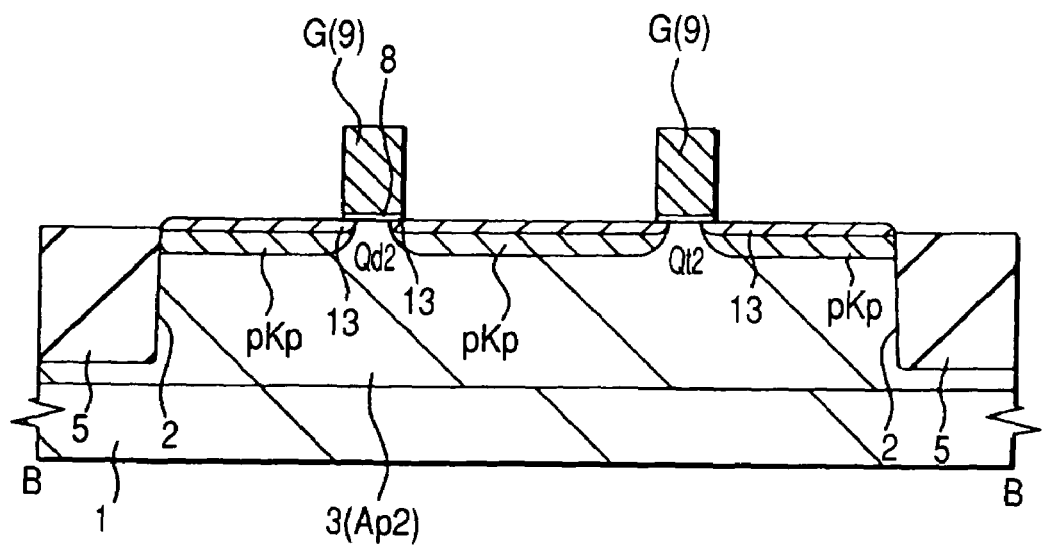
Figure 9:
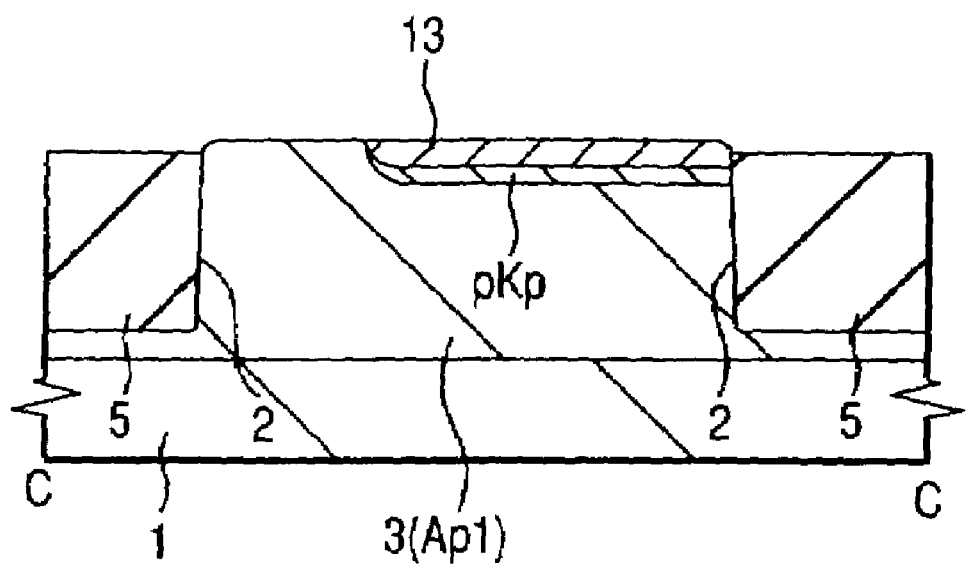
Figure 10:
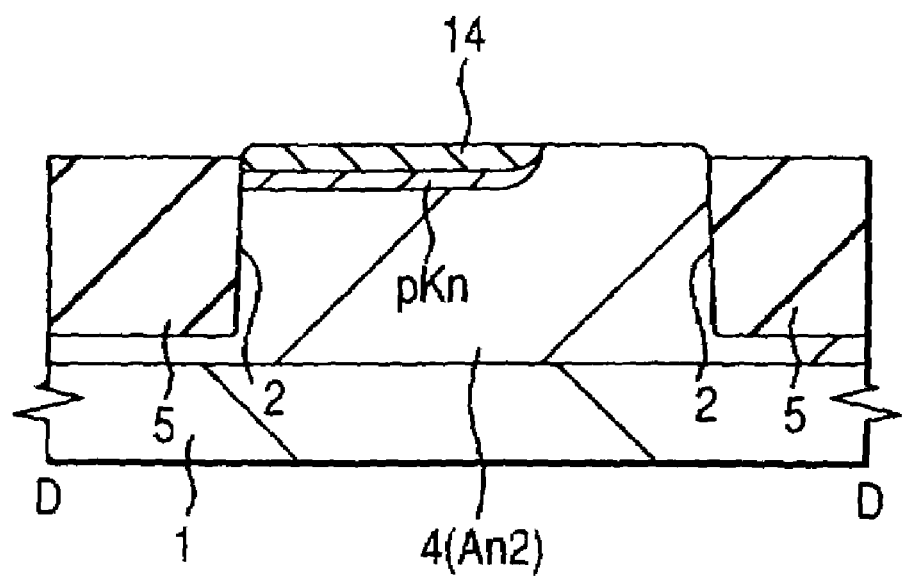

P-type impurity (boron) and n-type impurity (e.g., phosphor) are implanted by ion implantation into the substrate 1, and these impurities are diffused by the annealing process at about 1000° C., thereby to form two p-type wells 3 (Ap1, Ap2) and two n-type wells 4 (An1, An2) on the substrate 1, as shown in FIG. 6. These active regions An1, An2, Ap1 and Ap2 are surrounded by the isolation groove 2 filled with the silicon oxide film 5. Among the active regions, the p-type regions (Ap1, Ap2), for example, are connected underneath the isolation 2, as shown in FIG. 7.

Among the six MISFETs (Qt1, Qt2, Qd1, Qd2, Qp1, Qp2) of the memory cell MC, the n-channel MISFETs (Qt1, Qd1) are formed on the active region Ap1 (p-type well 3), the n-channel MISFETs (Qt2, Qd2) are formed on the active region Ap2 (p-type well 3), the p-channel MISFET (Qp2) is formed on the active region An1 (n-type well 4), and the p-channel MISFET (Qp1) is formed on the active region An2 (n-type well 4), as will be explained in detail later.

Figure 11:
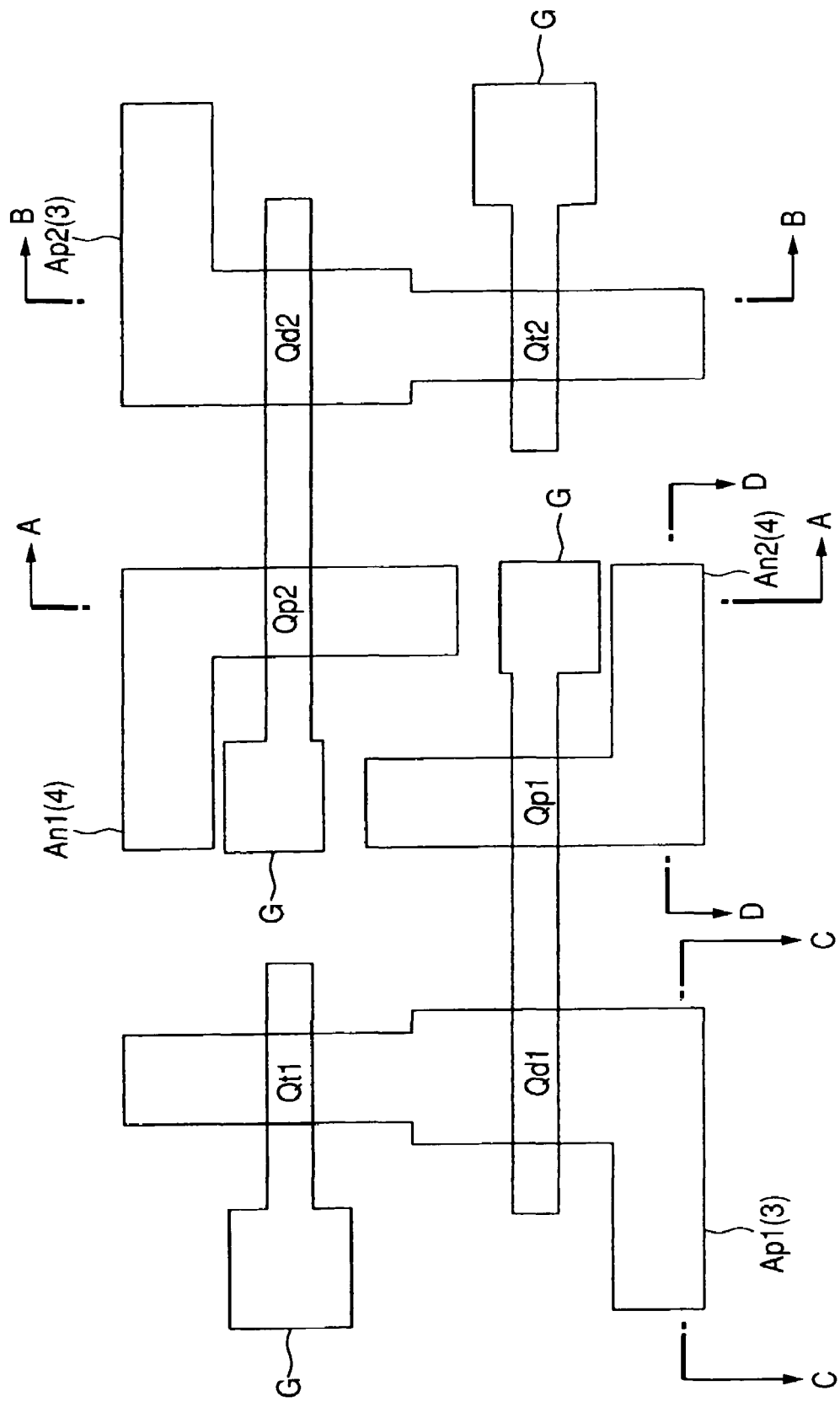
FIG. 11 is a plan view of the principal portions of the substrate, showing the configuration of the SRAM memory cell of the first embodiment, at a step in the fabrication thereof.
Figure 12:
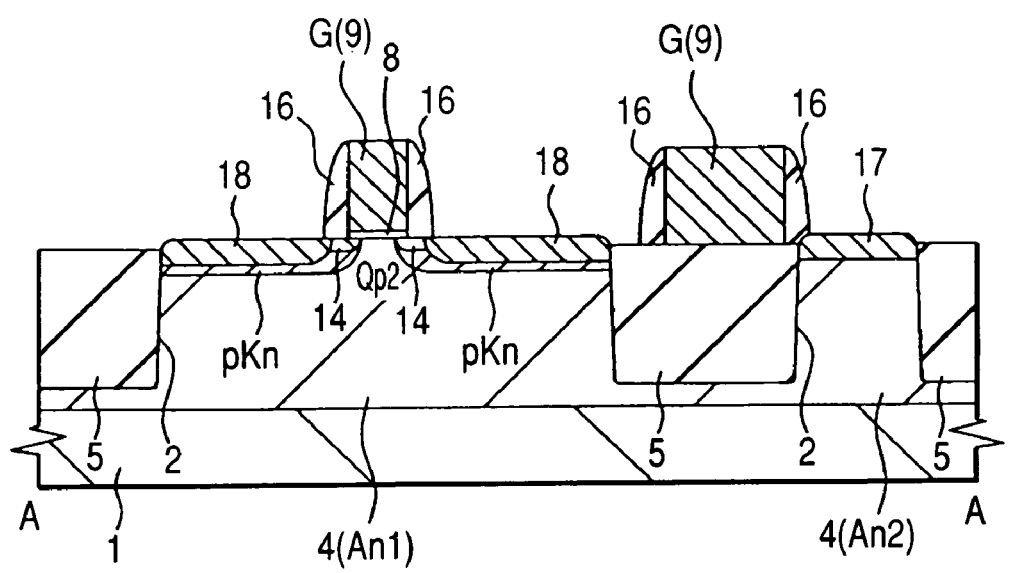
FIG. 12 through FIG. 15 are cross-sectional diagrams showing the principal portions of the substrate of the SRAM memory cell of the first embodiment, as seen along lines A—A, B—B, C—C and D—D, respectively, in FIG. 16 during a step in the fabrication thereof.
Figure 13:
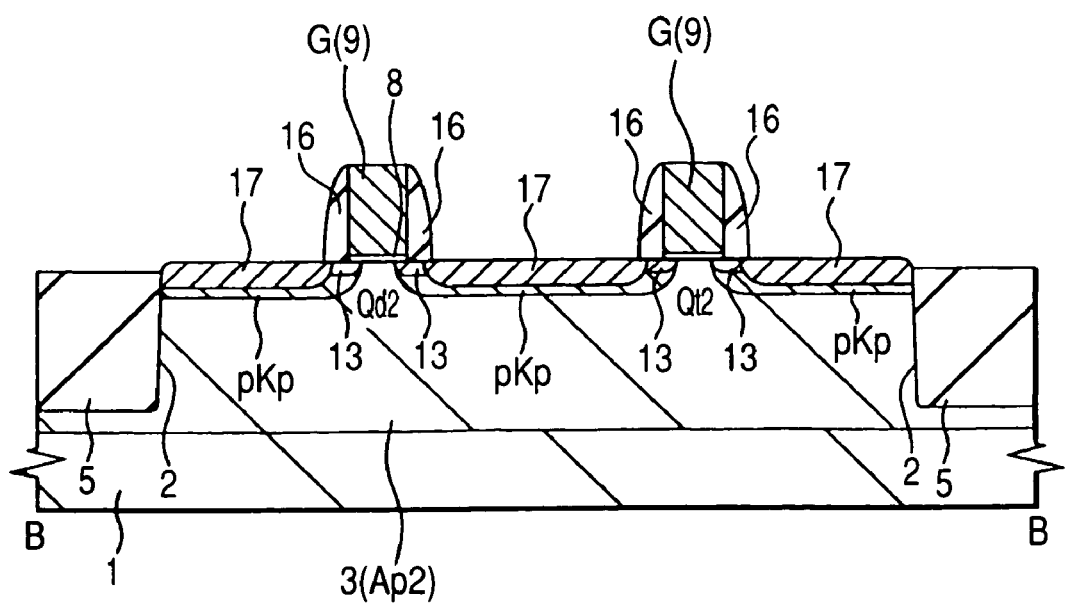

Next, on the main surface of the substrate 1, gate electrodes G of the n-channel MISFETs (Qt1, Qd1, Qt2, Qd2)

and p-channel MISFETs (Qp1, Qp2) are formed by being interposed by a gate oxide film 8, as shown in FIG. 7 through FIG. 11. FIG. 11 shows the area where one memory cell is formed, and FIG. 7, FIG. 8, FIG. 9 and FIG. 10 show the cross sections taken along the lines A—A, B—B, C—C and D—D, respectively, of FIG. 11.

Initially, the surface of the substrate 1 (p-type well and n-type well) is treated for cleaning with a cleaning liquid having a fluoride acid, and, thereafter, is subjected to thermal oxidation at about 800° C. so that a clean gate oxide film 8 of about 6 nm in thickness is formed on the surface of the p-type well 3 and n-type well 4.

Next, gate electrodes G are formed on the gate oxide film 8 as follows. First, a low-resistance poly-silicon film 9 of about 100 nm in thickness is deposited on the gate oxide film 8 by the CVD process. Next, the poly-silicon film 9 is treated for dry etching using a mask of photoresist (not shown), thereby to form gate electrodes G of poly-silicon film.

The gate electrodes G of the transfer MISFET Qt1 and drive MISFET Qd1 are formed on the active region Ap1, and the gate electrodes G of the transfer MISFET Qt2 and drive MISFET Qd2 are formed on the active region Ap2, as shown in FIG. 11. The gate electrode G of the load MISFET Qp2 is formed on the active region An1, and the gate electrode G of the load MISFET Qp1 is formed on the active region An2. These gate electrodes are formed to extend in a direction orthogonal to the A—A direction in the figure. The gate electrodes G of the load MISFET Qp1 and drive MISFET Qd1 are connected together, and the gate electrodes G of the load MISFET Qp2 and drive MISFET Qd2 are connected together.

Next, n-type impurity (phosphor or arsenic) is implanted into the p-type well 3 on both side regions of the gate electrode G, thereby to form $n^-$-type semiconductor regions 13, and p-type impurity (boron) is implanted into the n-type well 4, thereby to form $p^-$-type semiconductor regions 14.

Next, p-type impurity (boron) is implanted by skew ion implantation into the p-type well 3 on both side regions of the gate electrode G, thereby to form p-type pocket ion regions pKp. N-type impurity (phosphor) is implanted by skew ion implantation into the n-type well 4 on both side regions of the gate electrode G, thereby to form n-type pocket ion regions pKn. These pocket ion regions pKp and pKn extend from the ends of the source-drain regions ($n^+$-type semiconductor regions 17 and $p^+$-type semiconductor regions 18 explained later) up to the bottom of the gate electrodes, and they have conductivity types opposite to the corresponding source-drain regions. The pocket ion regions pKp and pKn are intended to retard the occurrence of the punch-through phenomenon, which results in the cutoff of current between the source and drain even though the channel is not formed due to the overgrowth of the depletion layer from the source-drain regions. Forming regions (pocket ion regions) of impurity opposite in conductivity type to the source-drain regions beneath the channel region suppresses the widening of the depletion layer from the source-drain regions.

Next, a silicon nitride film of around 40 nm in thickness is deposited on the substrate 1 by the CVD process, and it is treated for anisotropic etching, thereby to form side wall spacers 16 on the side walls of the gate electrodes G, as shown in FIG. 12 through FIG. 16.

Figure 14:
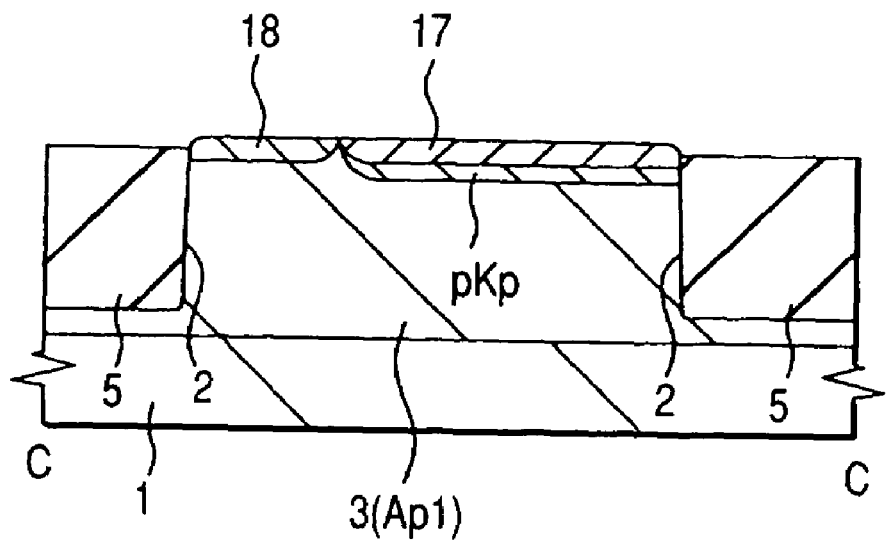
Figure 15:
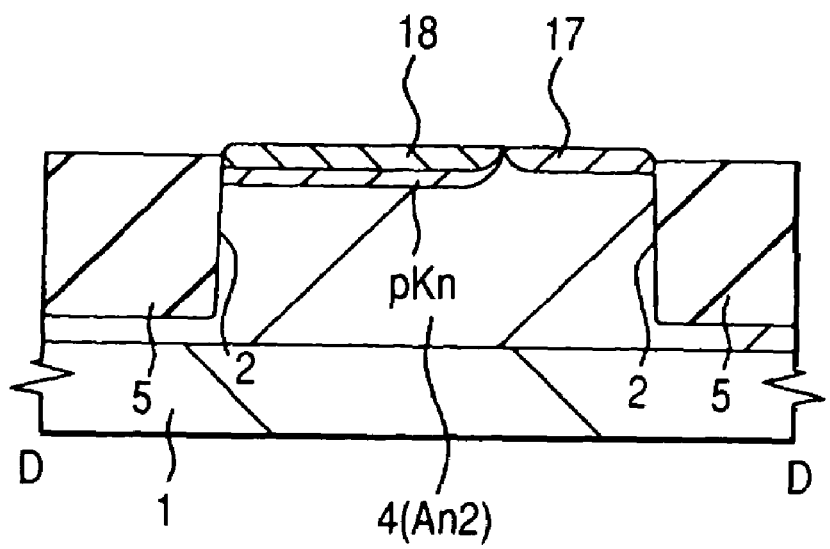
Figure 16:
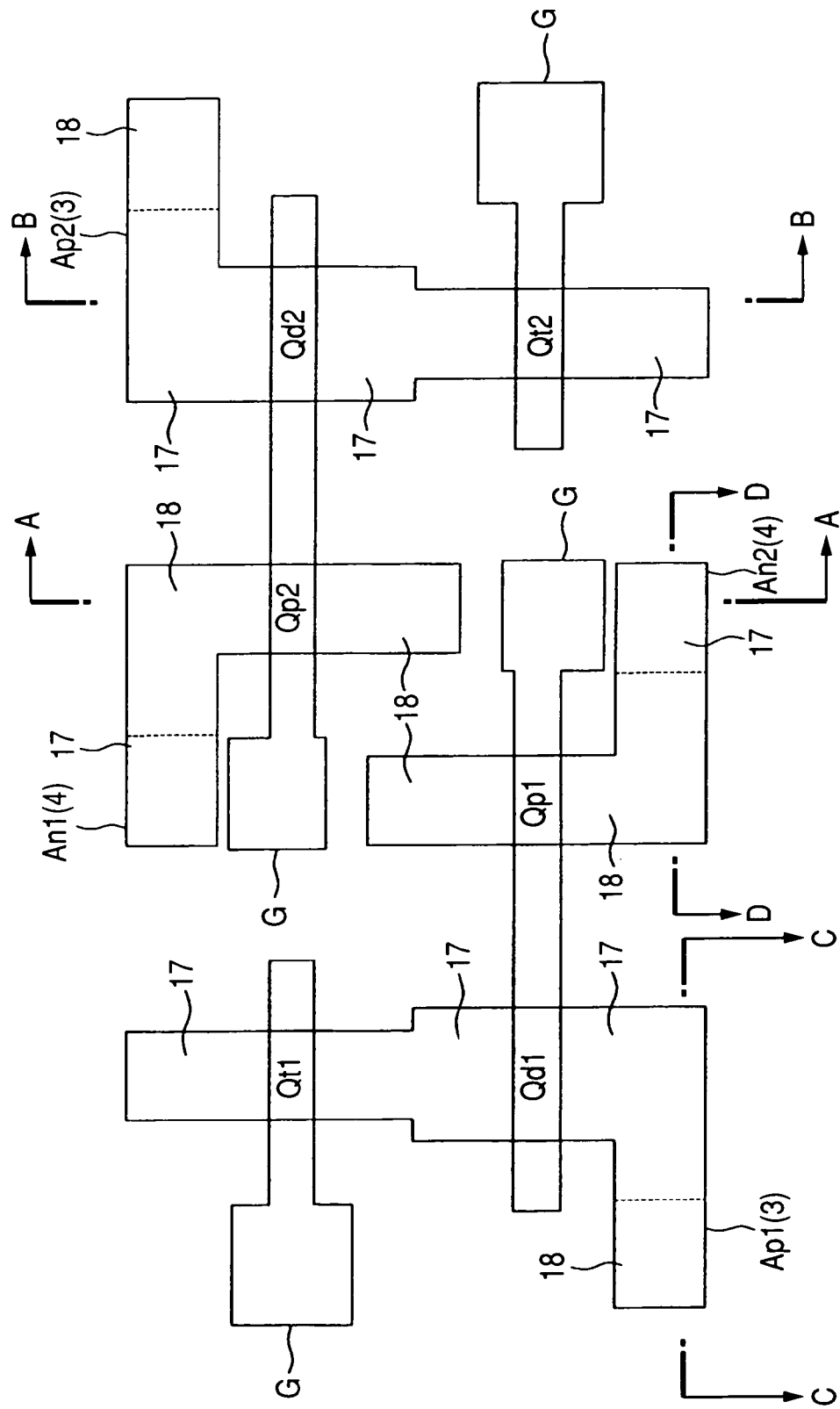
FIG. 16 is a plan view of the principal portions of the substrate, showing the configuration of the SRAM memory cell of the first embodiment, at a step in the fabrication thereof.
Figure 17:
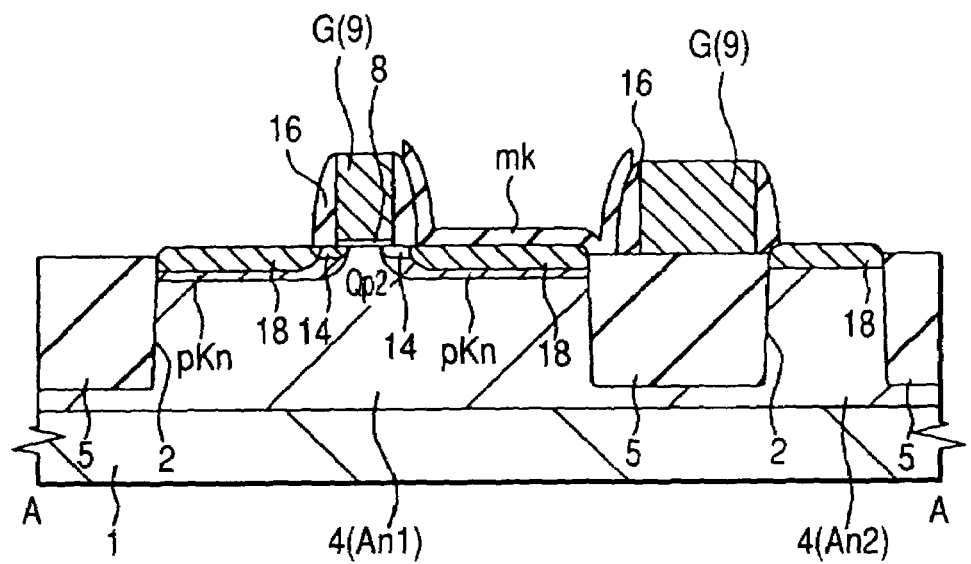
FIG. 17 through FIG. 20 are cross-sectional diagrams showing the principal portions of the substrate, respectively, of the SRAM memory cell of the first embodiment, as seen along lines A—A, B—B, C—C and D—D, respectively, in FIG. 21 during a step in the fabrication thereof.
Figure 18:
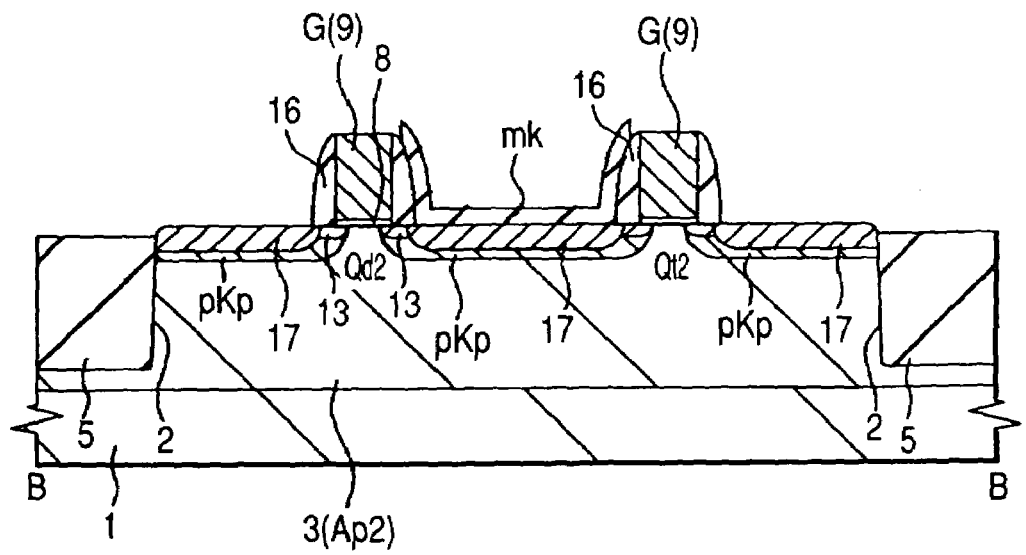
Figure 19:
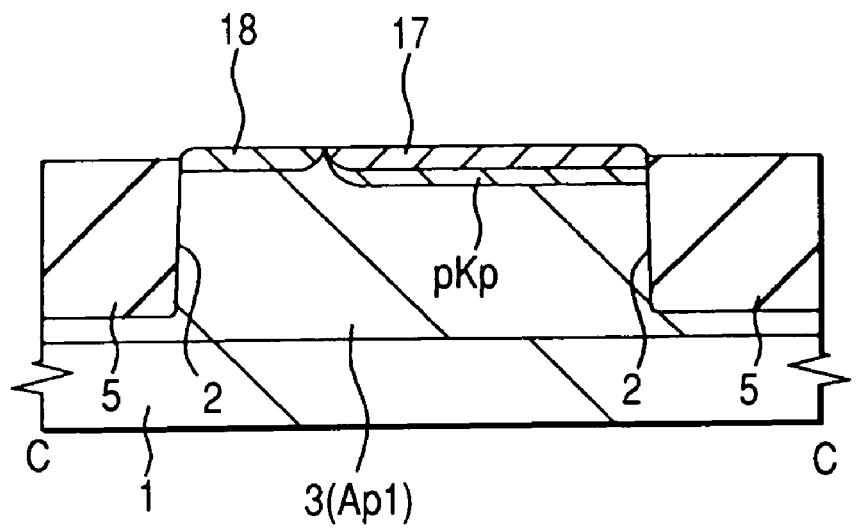
Figure 20:
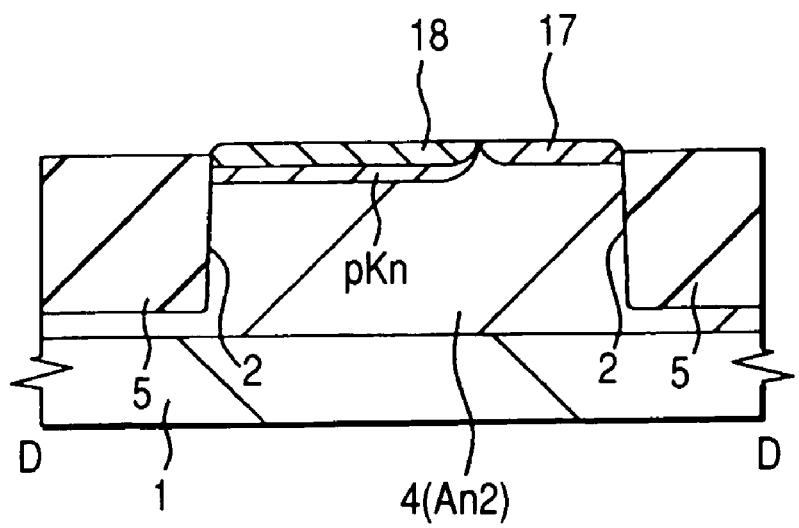

Next, n-type impurity (phosphor or arsenic) is implanted by ion implantation into the p-type wells 3, thereby to form $n^+$-type semiconductor regions 17 (source and drain), and p-type impurity (boron) is implanted into the n-type wells 4, thereby to form $p^+$-type semiconductor regions 18 (source and drain). FIG. 16 is a plan view of the substrate 1, showing the area where one memory cell is formed, and FIG. 12, FIG. 13, FIG. 14 and FIG. 15 show the cross sections taken along the lines A—A, B—B, C—C and D—D, respectively, of FIG. 16.

For feeding the voltages to the n-type wells 4 (An1, An2) and p-type wells 3 (Ap1, Ap2), $n^+$-type semiconductor regions 17 and $p^+$-type semiconductor regions 18 are formed for the n-type wells 4 and p-type wells 3, respectively. These semiconductor regions (17,18) are formed to attach to the respective active regions (An1, An2, Ap1, Ap2) as shown in FIG. 14, FIG. 15 and FIG. 16, although these regions may be formed in the peripheral section of the memory cell array.

As a result of the foregoing processing steps, six MISFETs (drive MISFETs Qd1 and Qd2, transfer MISFETs Qt1 and Qt2, and load MISFETs Qp1 and Qp2) of a memory cell are completed.

Figure 21:
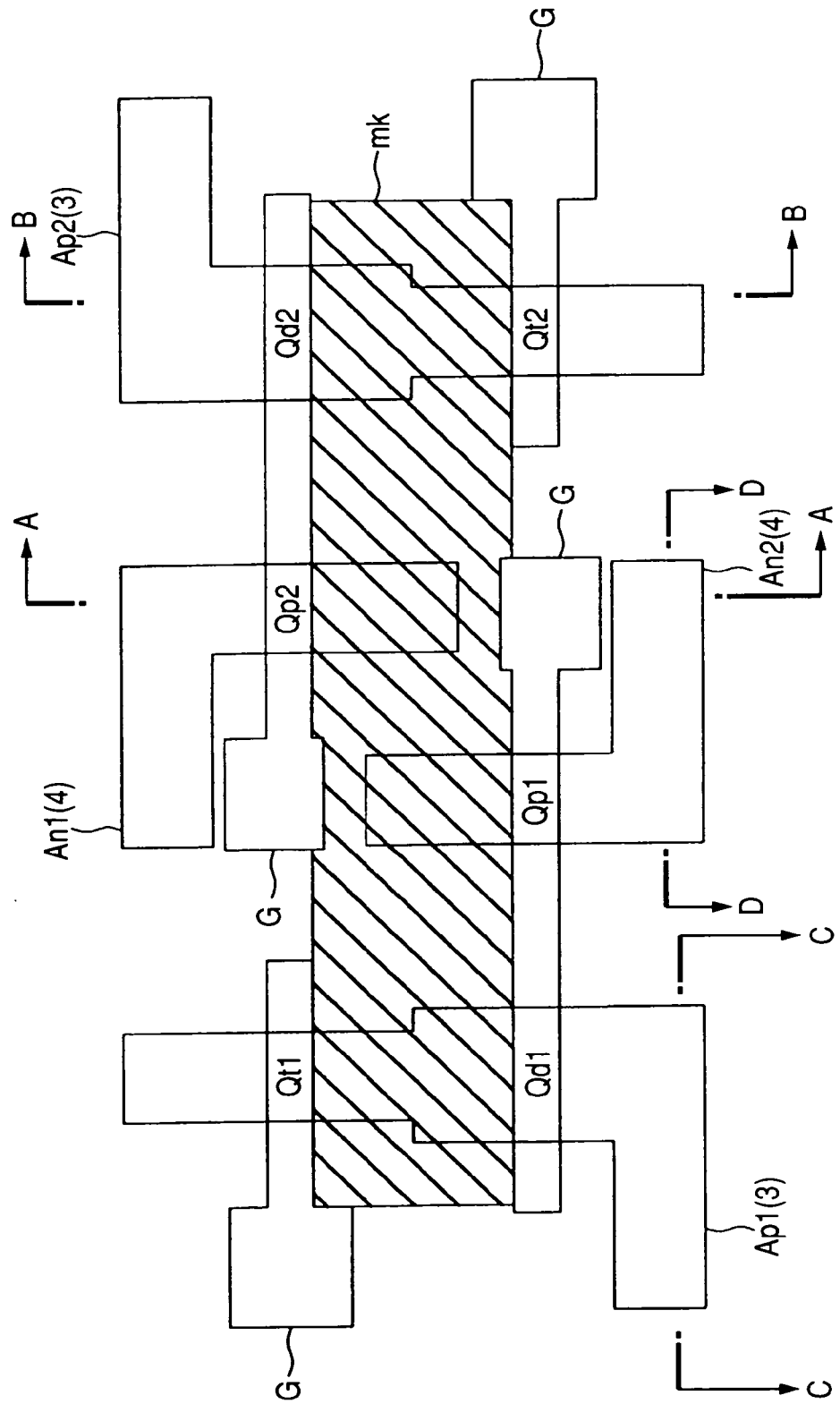
FIG. 21 is a plan view of the principal portions of the substrate, showing the configuration of the SRAM memory cell of the first embodiment, at a step in the fabrication thereof.
Figure 22:
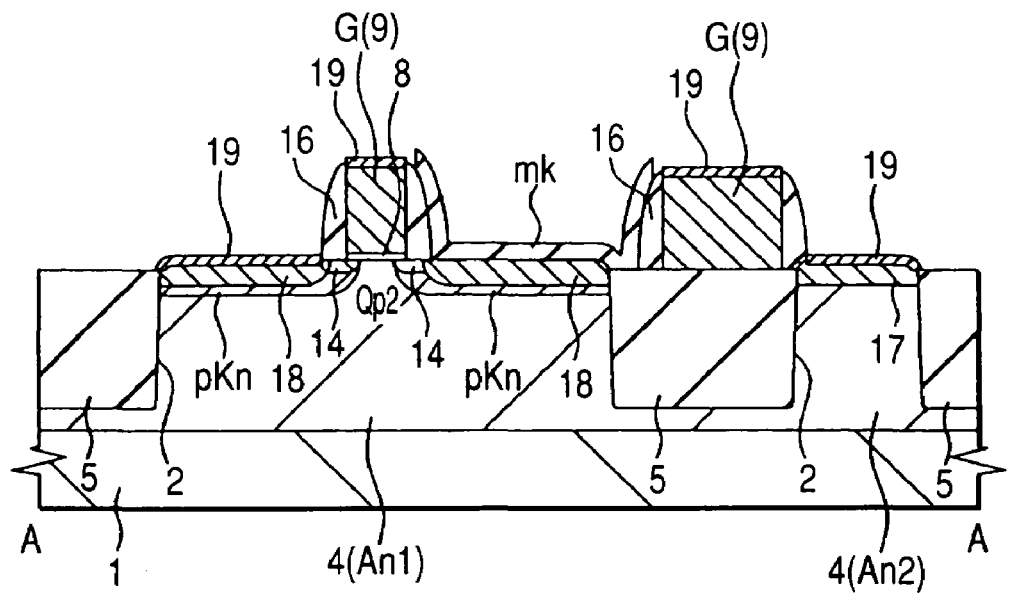
FIG. 22 through FIG. 25 are cross-sectional diagrams showing the principal portions of the substrate, respectively, of the SRAM memory cell of the first embodiment, as seen along lines A—A, B—B, C—C and D—D, respectively, in FIG. 26 during a step in the fabrication thereof.
Figure 23:
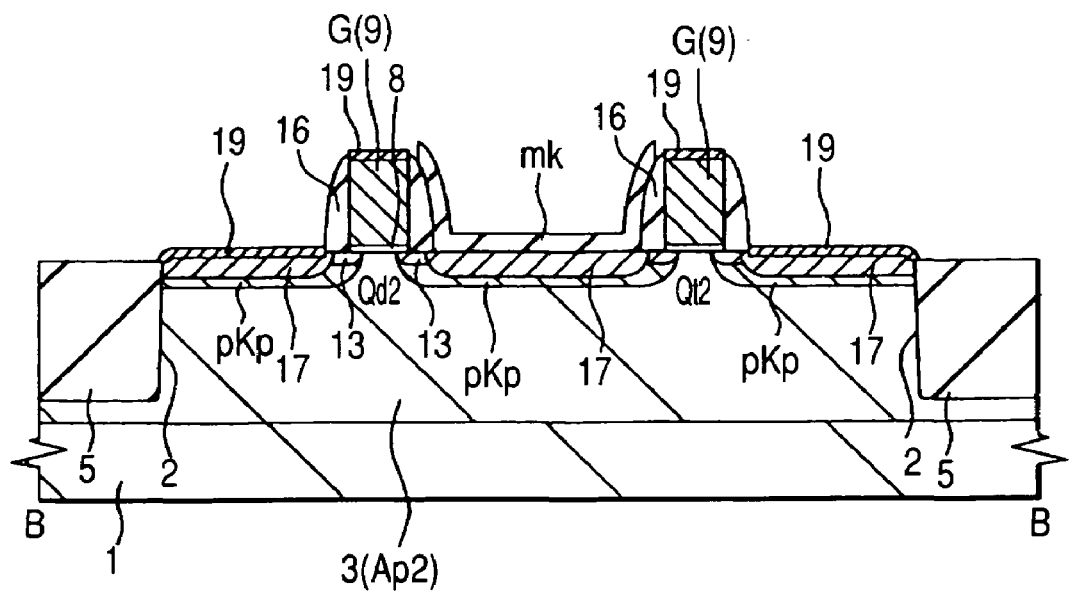

Subsequently, a silicon oxide film is deposited on the substrate 1 by the CVD process, and it is treated for dry etching using a mask of photoresist (not shown), thereby to form a mask film mk of silicon oxide, as shown in FIG. 17 through FIG. 21. FIG. 21 is a plan view of the substrate 1, showing the area where one memory cell is formed, and FIG. 17, FIG. 18, FIG. 19 and FIG. 20 show the cross sections taken along the lines A—A, B—B, C—C and D—D, respectively, of FIG. 21.

The mask film mk is shaped to cover the drain regions of the load MISFETs Qp1 and Qp2 and drive MISFETs Qd1 and Qd2, as shown in FIG. 21. At the formation of the $n^+$-type semiconductor regions 17 (source and drain) and $p^+$-type semiconductor regions 18 (source and drain), the wells 3 and 4 are treated for ion implantation by being interposed by a through-film of silicon oxide, for example, with the intention of alleviating the damage to the substrate 1, although this is not shown in FIG. 12 through FIG. 15. The through-film after ion implantation may be patterned and used for the mask film mk so as to simplify the process.

Next, a metallic film, e.g., Co film, is deposited on the substrate 1 by a sputtering process. The substrate 1 is treated for annealing at 600° C. for 1 minute, thereby to form a CoSi layer 19 to cover the contact sections between the exposed portions of substrate 1 ($n^+$-type semiconductor regions 17 and $p^+$-type semiconductor regions 18) and the Co film and between the gate electrodes G and the Co film. Instead of the CoSi layer according to this embodiment, another metallic silicide layer, e.g., TiSi layer derived from a Ti film, may be formed.

The CoSi layer (simply called a "silicide layer") 19 is absent on the drain regions of the load MISFETs Qp1 and Qp2 and drive MISFETs Qd1 and Qd2 due to the presence of the mask film mk on these regions, as described above.

Figure 24:
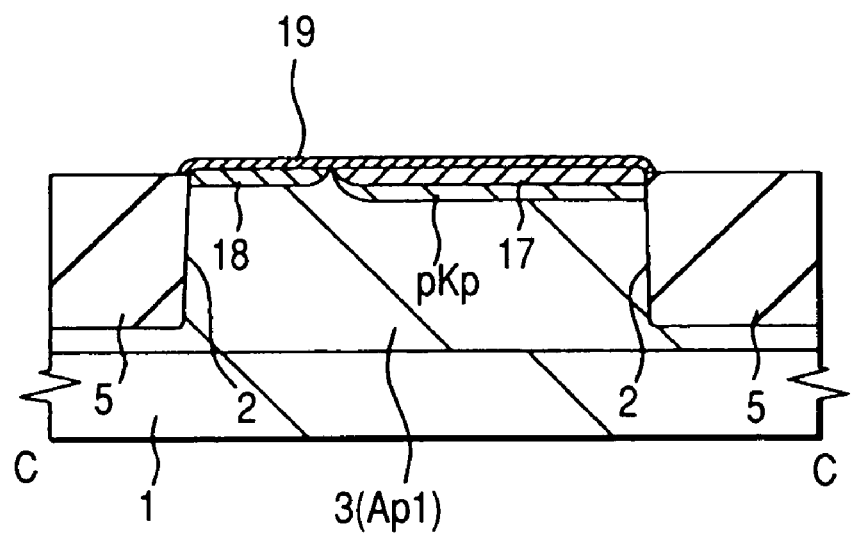
Figure 25:
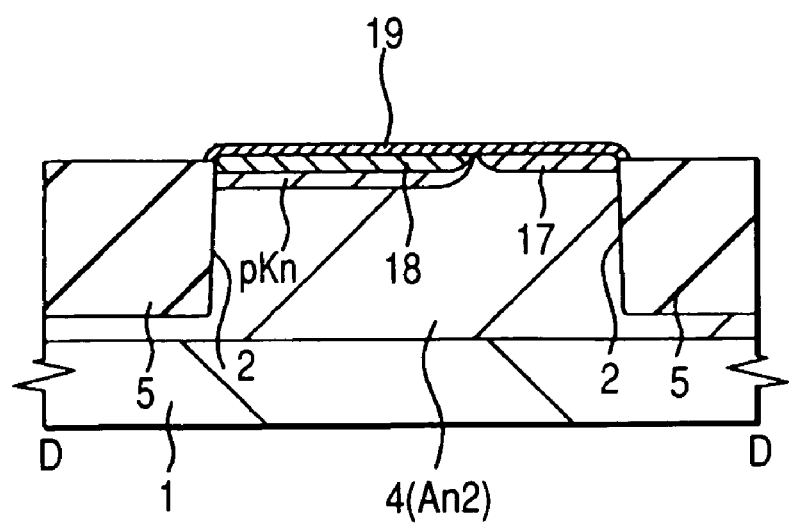

The silicide layer 19 covers the source regions of the load MISFETs Qp1 and Qp2 and drive MISFETs Qd1 and Qd2 and one of the ends of the transfer MISFETs Qt1 and Qt2, and it also covers the semiconductor regions 17 and 18 for feeding the voltages to the wells (refer to FIG. 24 and FIG. 25).

Figure 26:
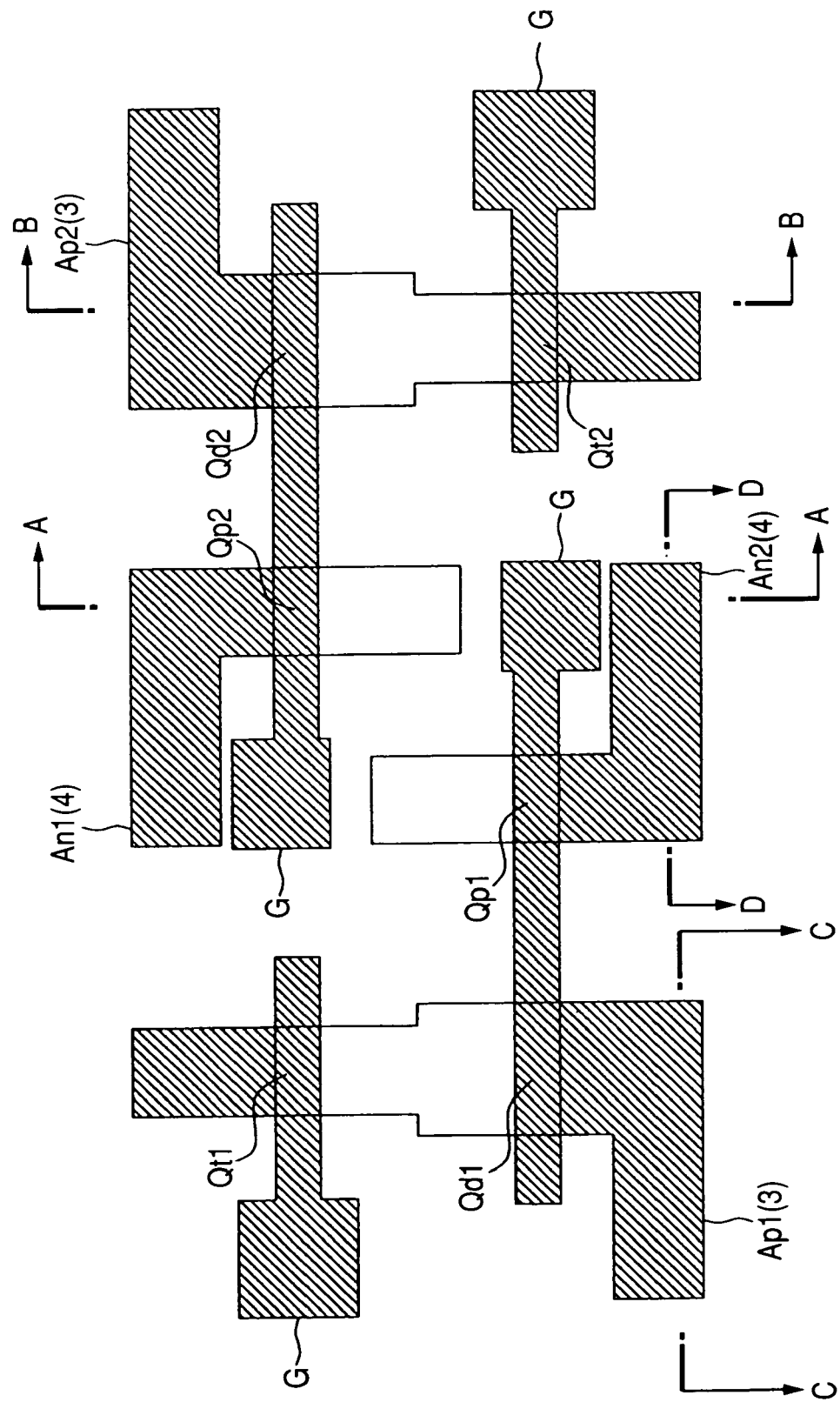
FIG. 26 is a plan view of the principal portions of the substrate, showing the configuration of the SRAM memory cell of the first embodiment, at a step in the fabrication thereof.
Figure 27:
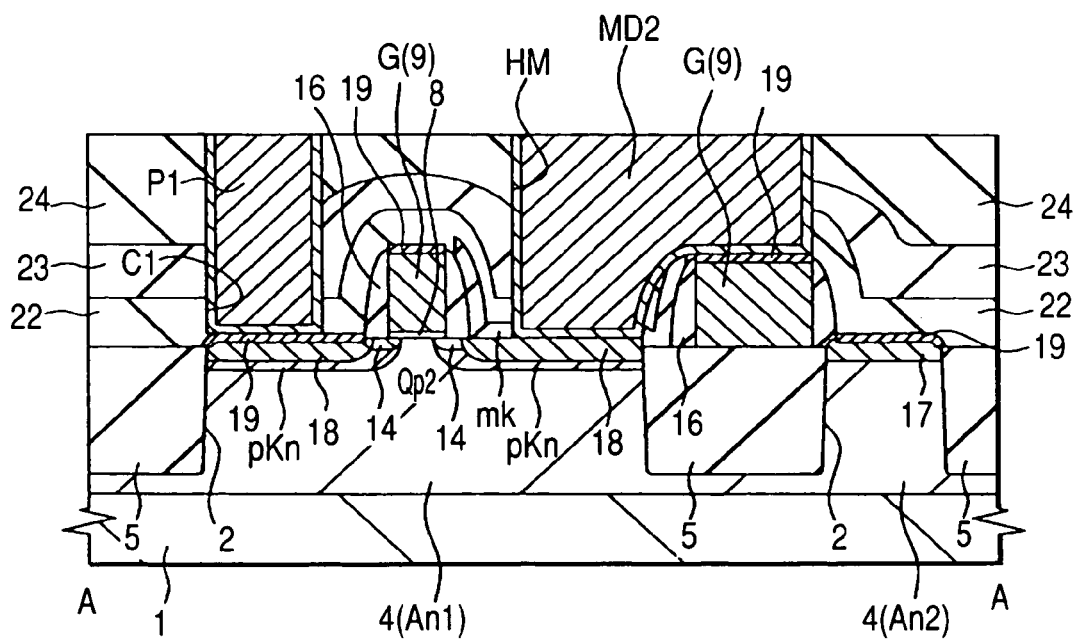
FIG. 27 through FIG. 30 are cross-sectional diagrams showing the principal portions of the substrate of the SRAM memory cell of the first embodiment, as seen along lines A—A, B—B, C—C and D—D, respectively, in FIG. 31 during a step in the fabrication thereof.
Figure 28:
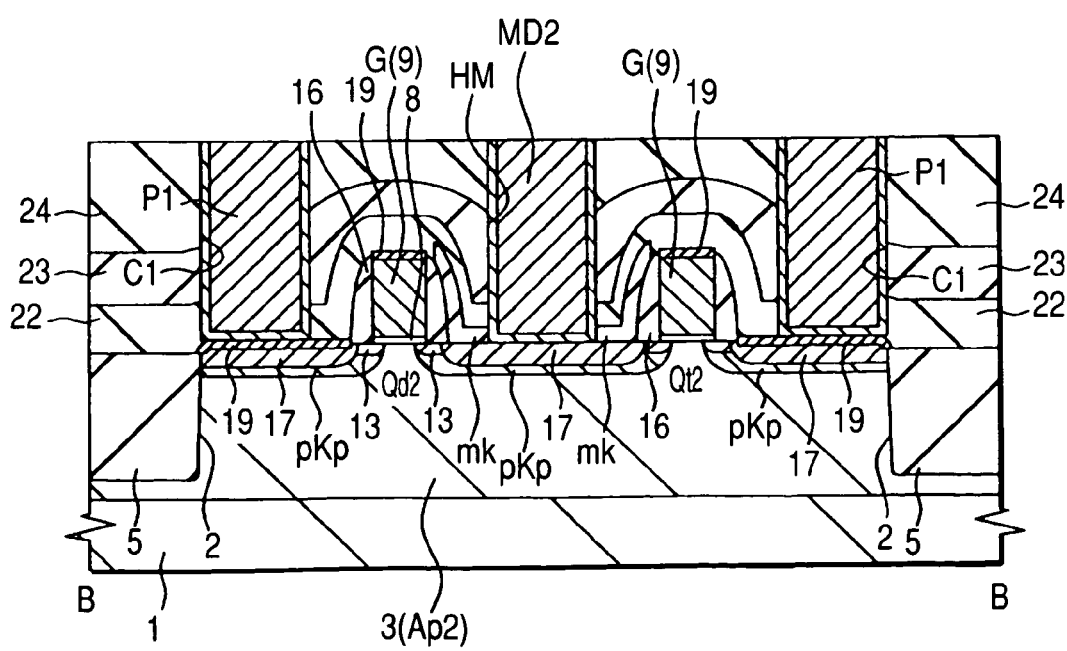
Figure 29:
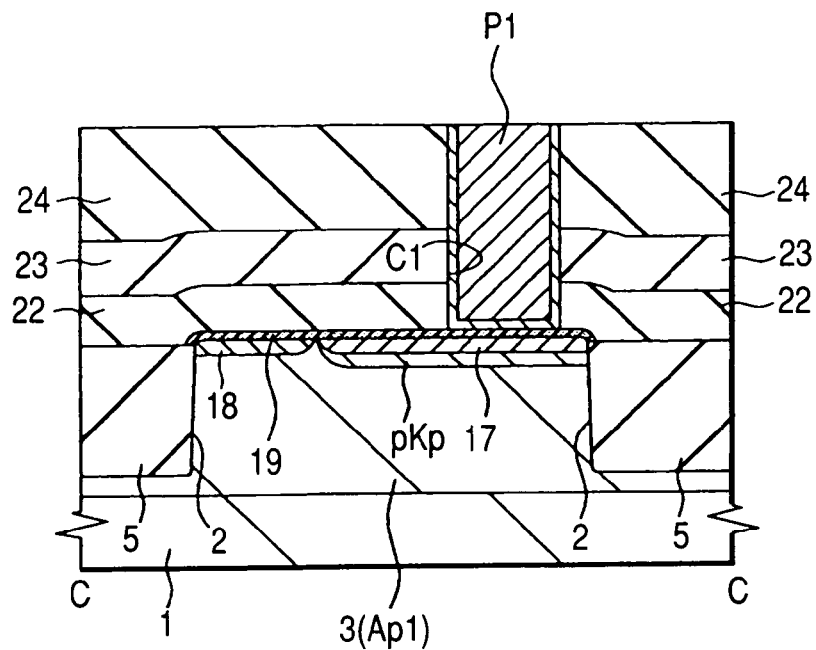
Figure 30:
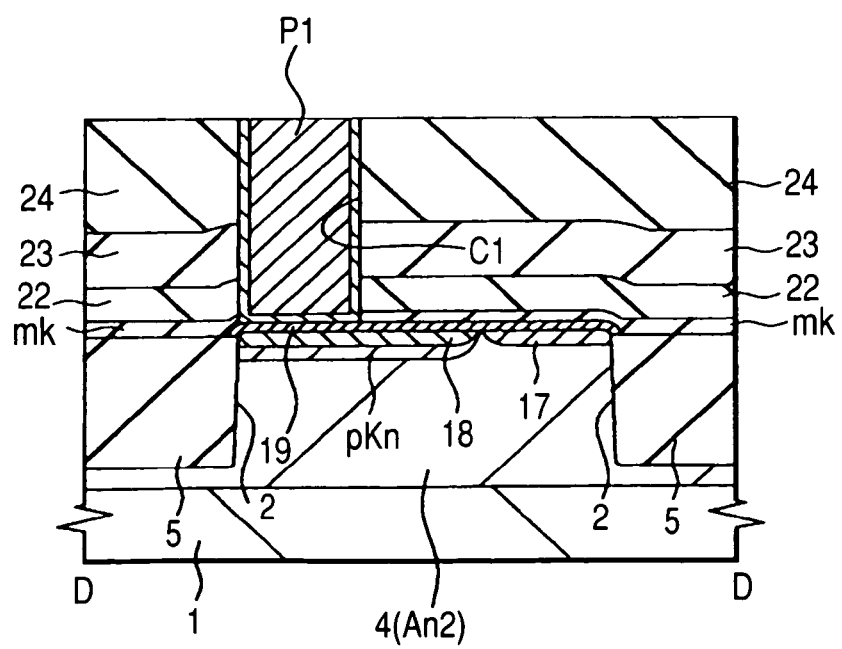

Next, the remaining Co film is etched off, and the substrate 1 is treated for annealing at 700–800° C. for about 1 minute so that the silicide layer 19 turns (into CoSi!2 layer) to have a reduced resistivity. The silicide layer 19 is formed as shown in FIG. 22 through FIG. 26. FIG. 26 is a plan view of the substrate 1, showing the area where one memory cell is formed, and FIG. 22, FIG. 23, FIG. 24 and FIG. 25 show the cross sections taken along the lines A—A, B—B, C—C and D—D, respectively, of FIG. 26. The areas where the silicide layer 19 is formed are shown by hatching in FIG. 26 (mask film mk is not shown).

Next, a silicon nitride film 22 of around 50 nm in thickness is deposited on the substrate 1 by the CVD process, as shown in FIG. 27 through FIG. 31. A PSG (Phosphor Silicate Glass) film 23 is applied to the silicon nitride film 22. The substrate 1 is treated for annealing so that the film 23 is flattened, a silicon oxide film 24 is deposited on it to a thickness of around 700–800 nm by the CVD process, and the film 24 is polished by the CMP (Chemical Mechanical Polishing) process to have a flat surface. The silicon oxide film 24 is made from tetra-ethoxysilane, for example, based on the plasma CVD process. The silicon nitride film 22 serves as an etching stopper at the time of formation of contact holes C1, etc. in the later processing steps. The PSG film 23, silicon oxide film 24 and silicon nitride film 22 become an inter-layer insulation film between the gate electrodes G and the first-layer lines M1.

Next, the silicon oxide film 24 and PSG film 23 are treated for dry etching with a mask of photoresist (not shown); and, next, the silicon nitride film 22 is treated for dry etching, thereby to form contact holes C1 and line grooves HM over the $n^+$-type semiconductor regions 17 (source and drain) and $p^+$-type semiconductor regions 18 (source and drain). Contact holes C1 are formed over the gate electrodes G of the transfer MISFETs Qt1 and Qt2. One line groove HM will extend from the top of the drain of the drive MISFET Qd1 up to the top of the gate electrode of the drive MISFET Qd2 by way of the top of the drain of the load MISFET Qp1. Another line groove HM will extend from the top drain of the drive MISFET Qd2 (load MISFET Qp2) up to the top of the gate electrode of the drive MISFET Qd1 (load MISFET Qp1) by way of the top of the drain of the load MISFET Qp2 (refer to FIG. 31).

Figure 31:
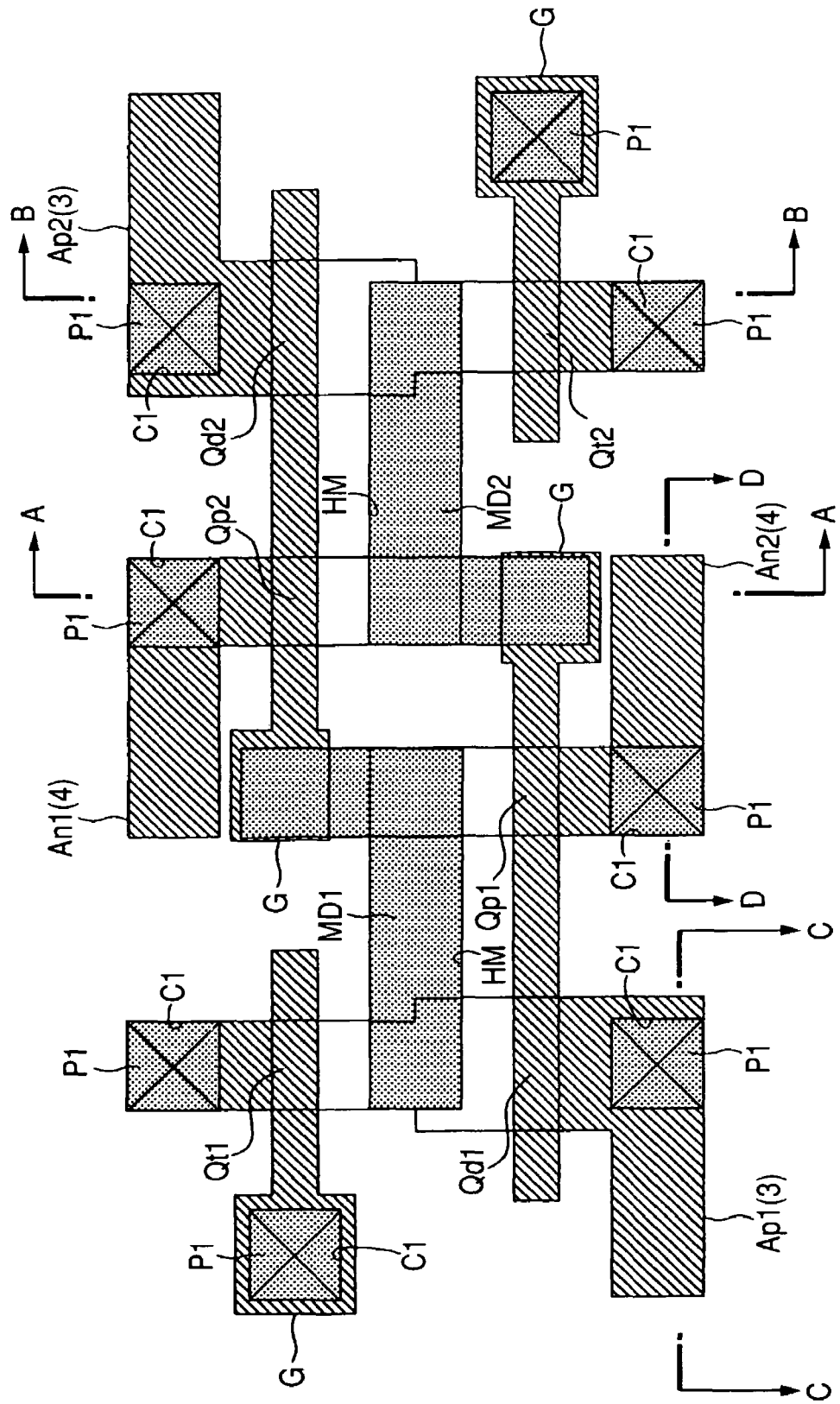
FIG. 31 is a plan view of the principal portions of the substrate, showing the configuration of the SRAM memory cell of the first embodiment, at a step in the fabrication thereof.
Figure 32:
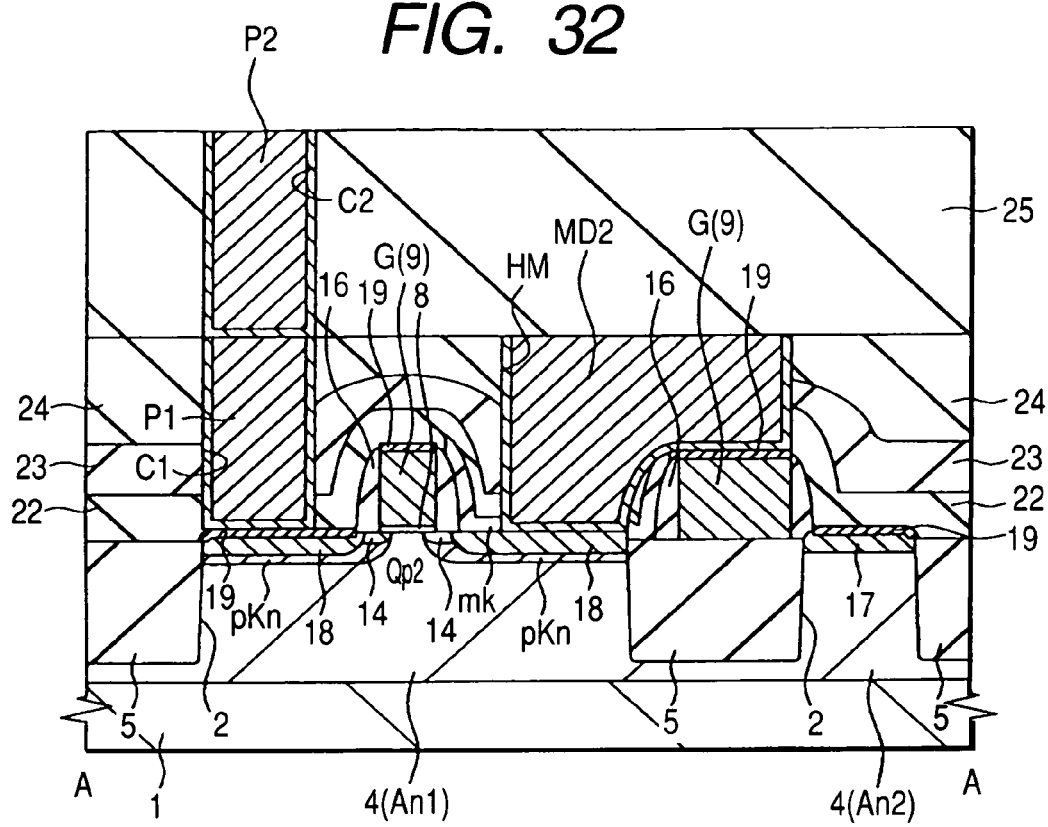
FIG. 32 through FIG. 35 are cross-sectional diagrams showing the principal portions of the substrate of the SRAM memory cell of the first embodiment, as seen along lines A—A, B—B, C—C and D—D, respectively, in FIG. 36 during a step in the fabrication thereof.
Figure 33:
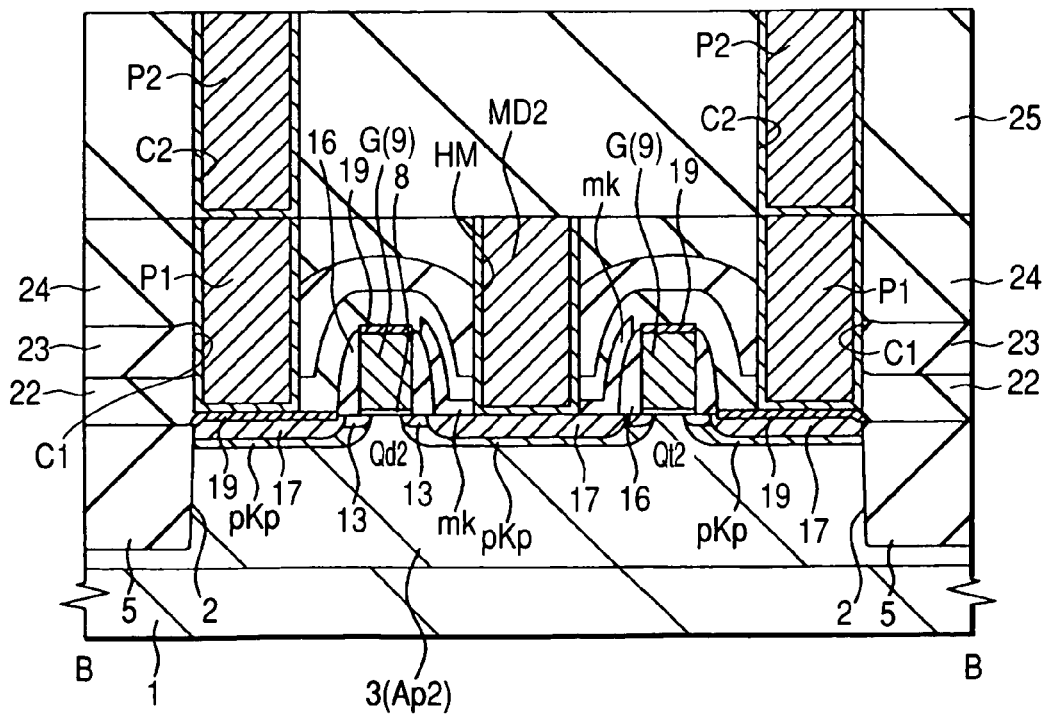
Figure 34:
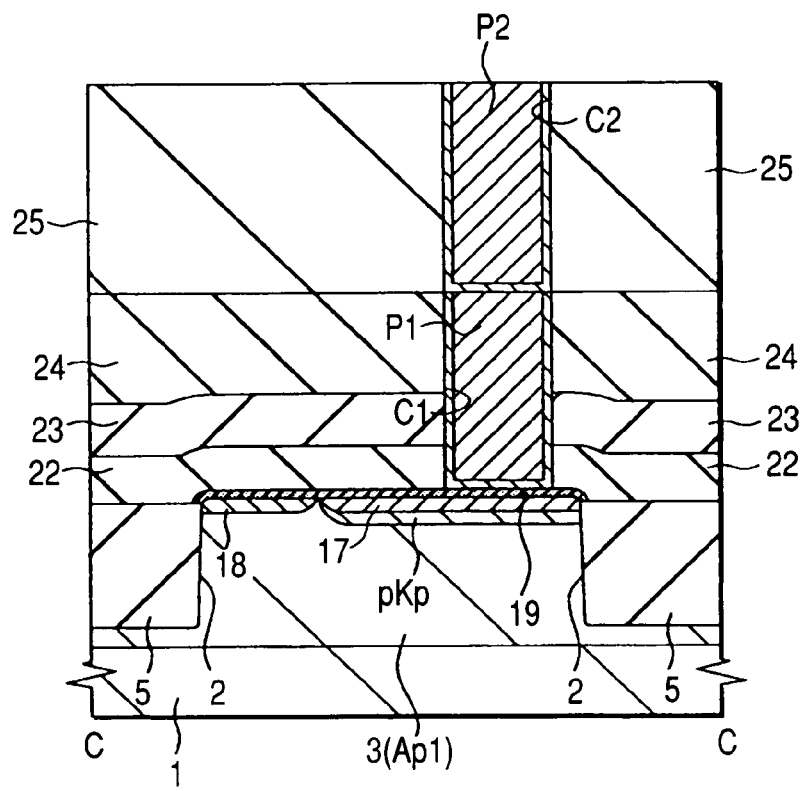
Figure 35:
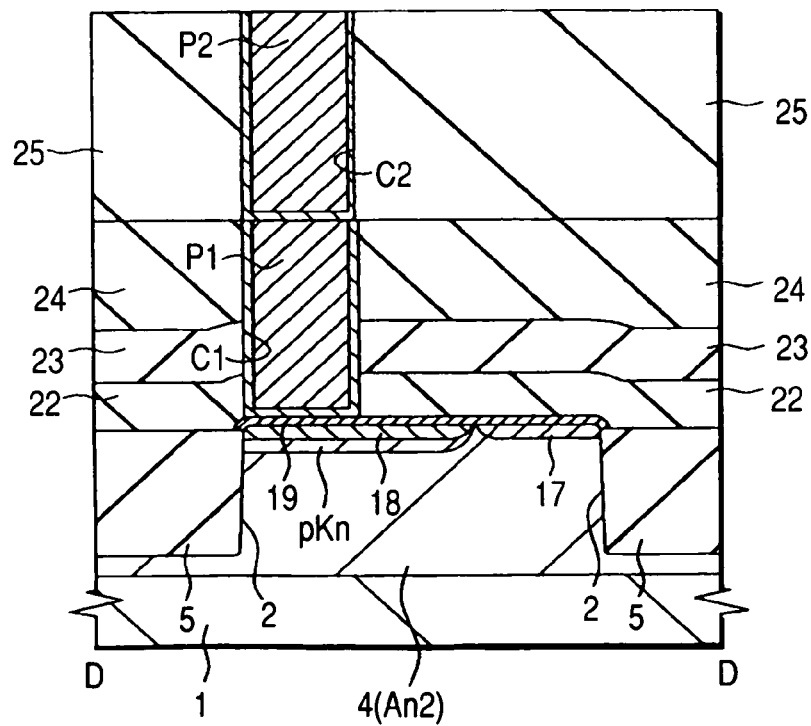

Next, a conductor film is buried into the contact holes C1 and line grooves HM, thereby to form plugs P1 and lines MD1 and MD2 as follows. First, a Ti film of about 10 nm (not shown) and a TiN film of about 50 nm are formed sequentially by a sputtering process on the silicon oxide film 24 inclusive of the inside of the contact holes C1 and line grooves HM, and the substrate 1 is treated for annealing at 500–700° C. for 1 minute. A W film is deposited by the CVD process, and it is treated by an etch-back or CMP process until the surface of the silicon oxide film 24 is exposed, thereby to remove the Ti film, the TiN film and the W film from the outside of the contact holes C1 and line grooves HM. Consequently, plugs P1 are formed in the contact holes C1 and lines MD1 and MD2 are formed in the line grooves HM. FIG. 31 is a plan view of the substrate 1, showing the area where one memory cell is formed, and FIG. 27, FIG. 28, FIG. 29 and FIG. 30 show the cross sections taken along the lines A—A, B—B, C—C and D—D, respectively, of FIG. 31.

Figure 36:
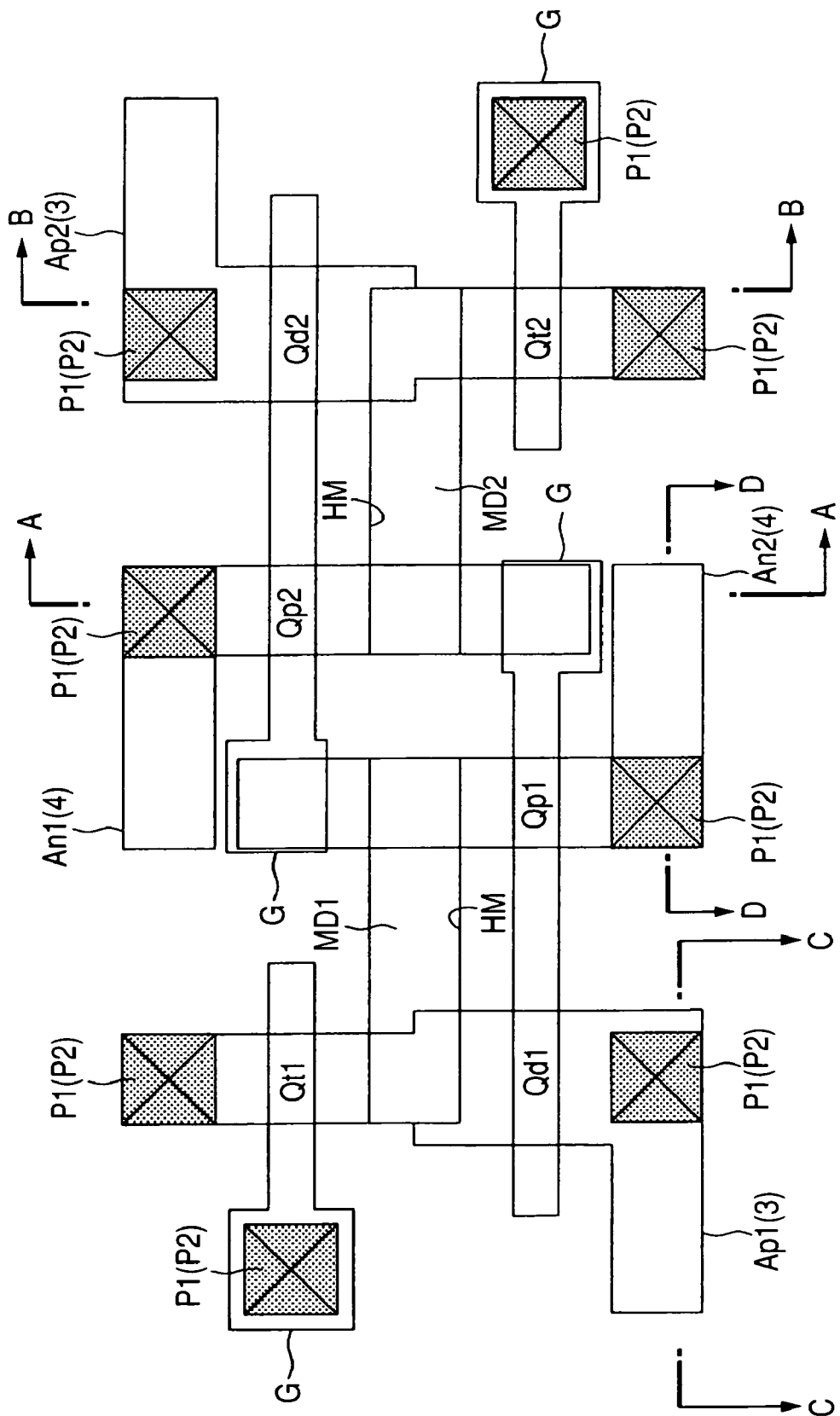
FIG. 36 is a plan view of the principal portions of the substrate, showing the configuration of the SRAM memory cell of the first embodiment, at a step in the fabrication thereof.
Figure 37:
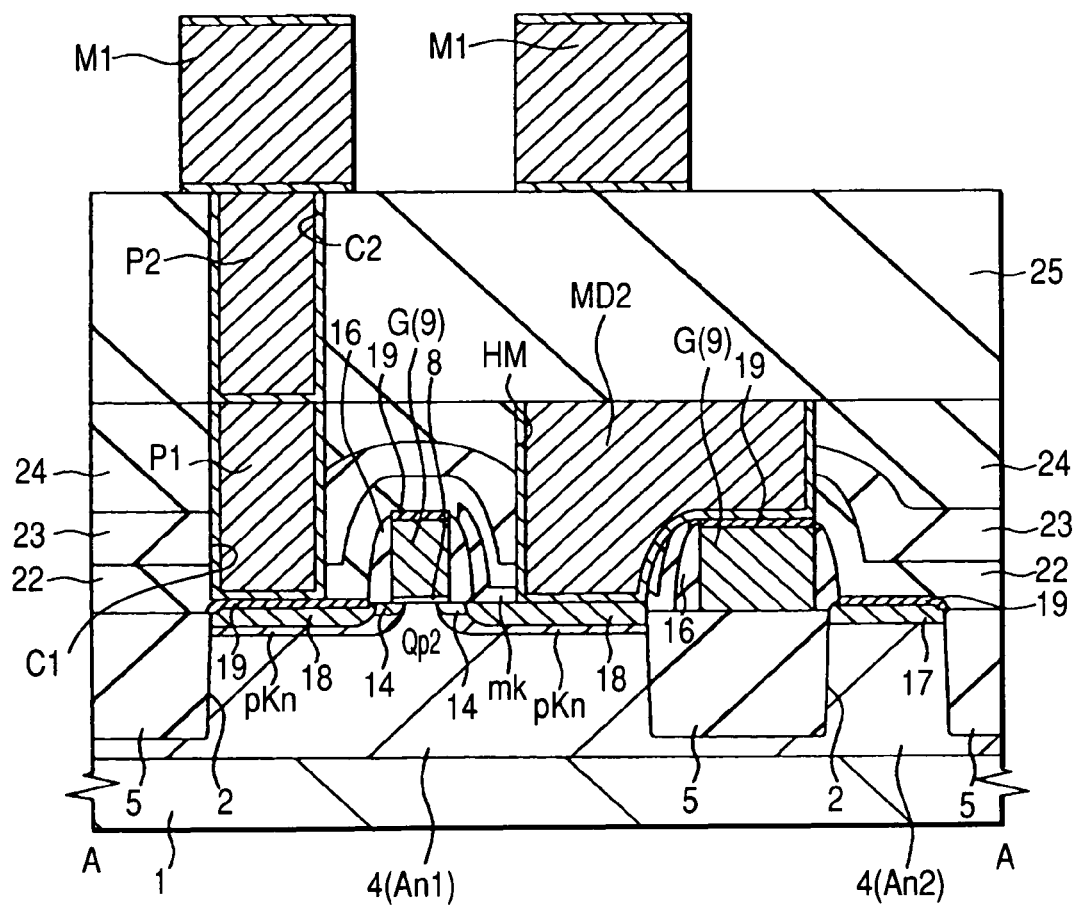
FIG. 37 through FIG. 40 are cross-sectional diagrams showing the principal portions of the substrate of the SRAM memory cell of the first embodiment, as seen along lines A—A, B—B, C—C and D—D, respectively, in FIG. 41, during a step in the fabrication thereof.
Figure 38:
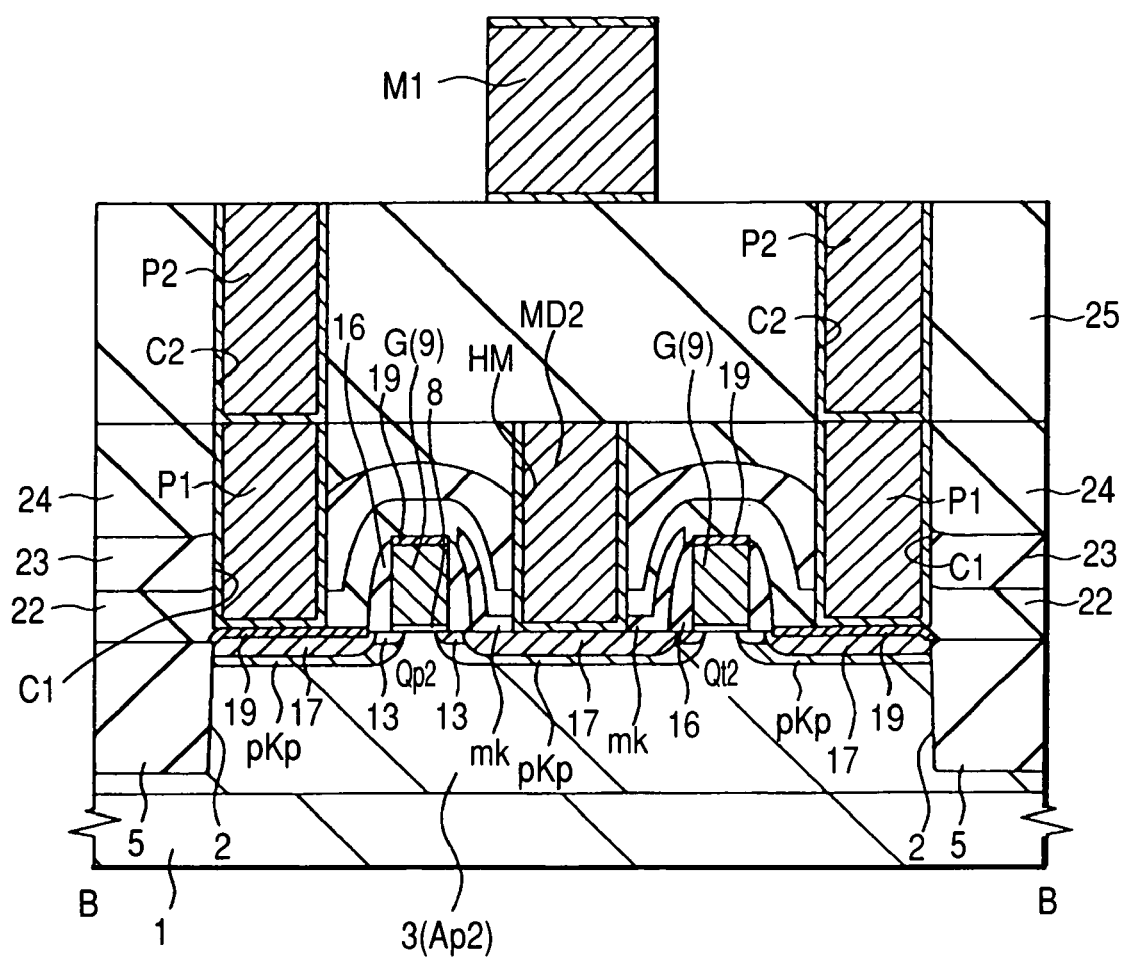
Figure 39:
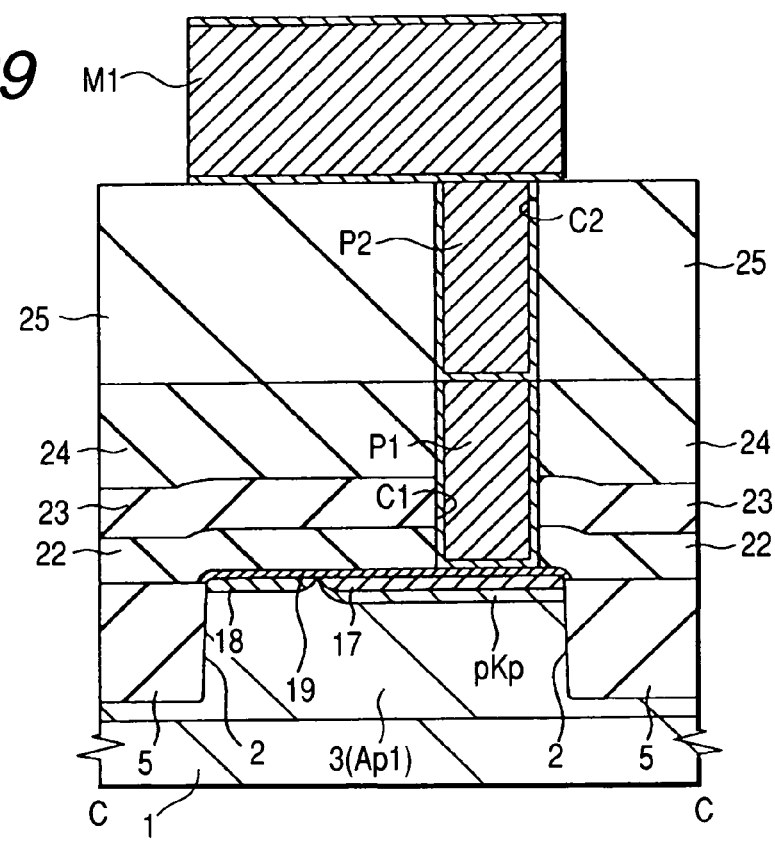
Figure 40:
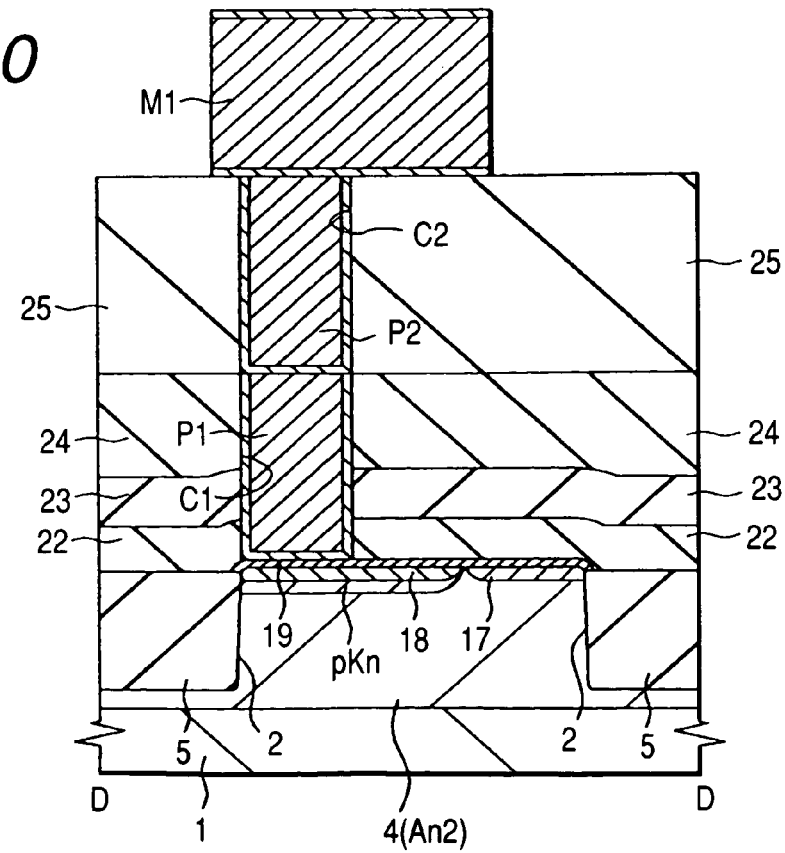

Next, a silicon oxide film 25 is deposited on the substrate 1 by the CVD process, as shown in FIG. 32 through FIG. 36. The silicon oxide film 25 on the plugs P1 is etched off to form contact holes C2. FIG. 36 is a plan view of the substrate 1, showing the area where one memory cell is formed, and FIG. 32, FIG. 33, FIG. 34 and FIG. 35 show the cross sections taken along the lines A—A, B—B, C—C and D—D, respectively, of FIG. 36.

Next, a conductor film is buried into the contact holes C2 so as to form plugs P2 as follows. First, a Ti film of about 10 nm (not shown) and a TiN film of about 50 nm are formed by a sputtering process sequentially on the silicon oxide film 25, inclusive of the inside of the contact holes C2, and the substrate 1 is treated for annealing at 500–700° C. for 1 minute. A W film is deposited by the CVD process, and it is treated by an etch-back or CMP process until the surface of the silicon oxide film 25 is exposed, thereby to remove the Ti film, the TiN film and the W film from the outside of the contact holes C2 and form plugs P2.

Figure 41:
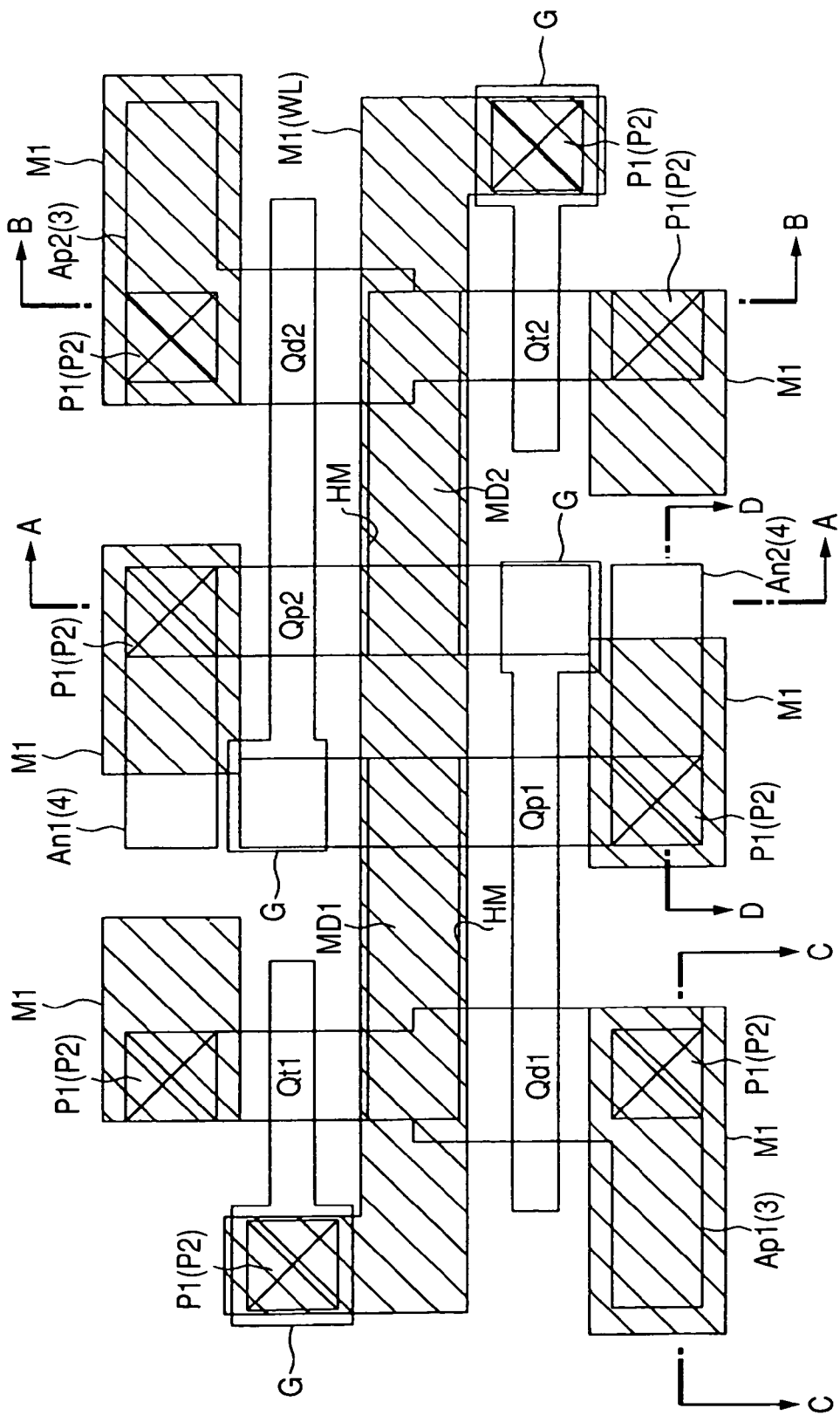
FIG. 41 is a plan view of the principal portions of the substrate, showing the configuration of the SRAM memory cell of the first embodiment, at a step in the fabrication thereof.
Figure 42:
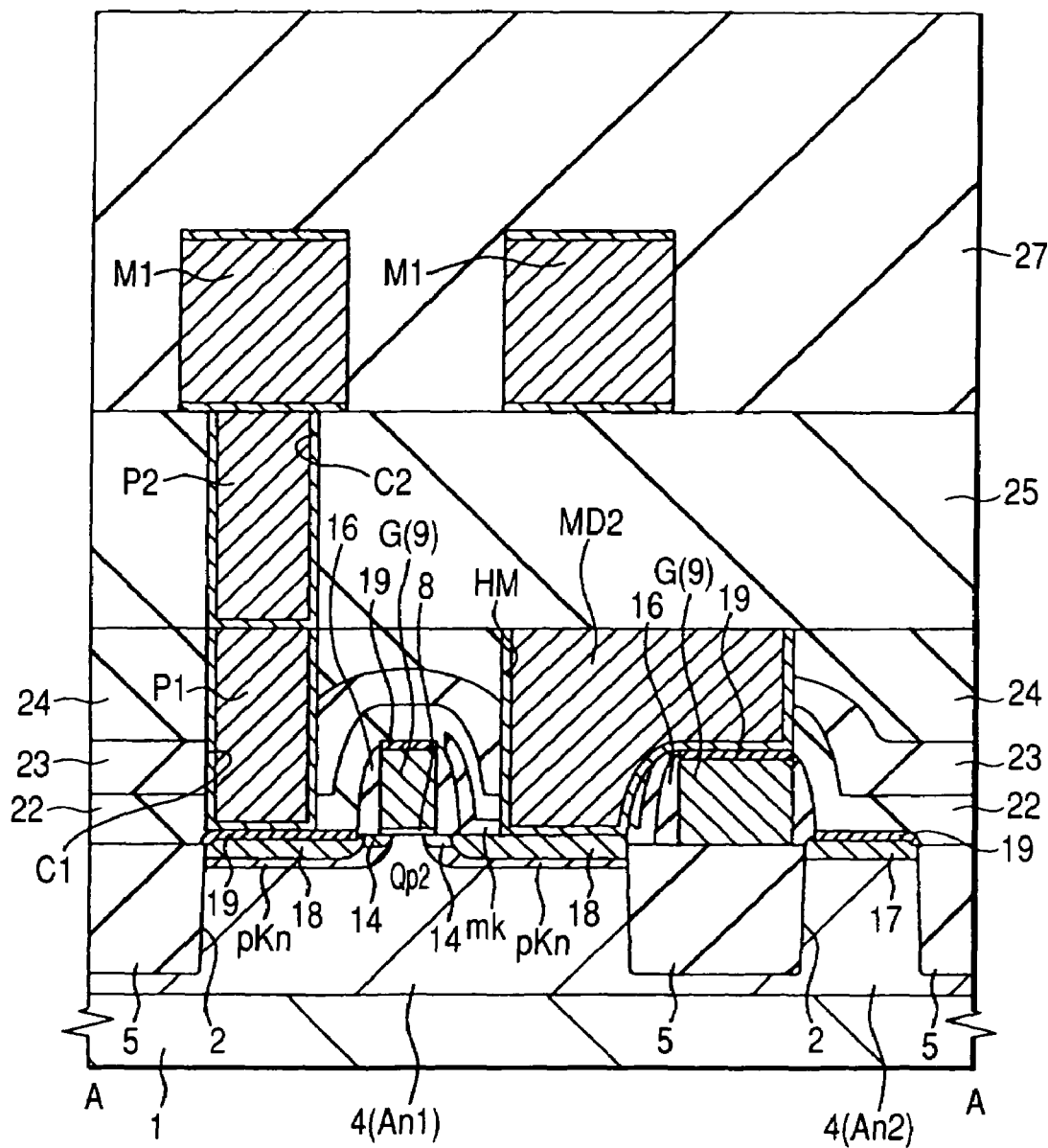
FIG. 42 through FIG. 45 are cross-sectional diagrams showing the principal portions of the substrate of the SRAM memory cell of the first embodiment, as seen along lines A—A, B—B, C—C and D—D, respectively, in FIG. 46, during a step in the fabrication thereof.
Figure 43:
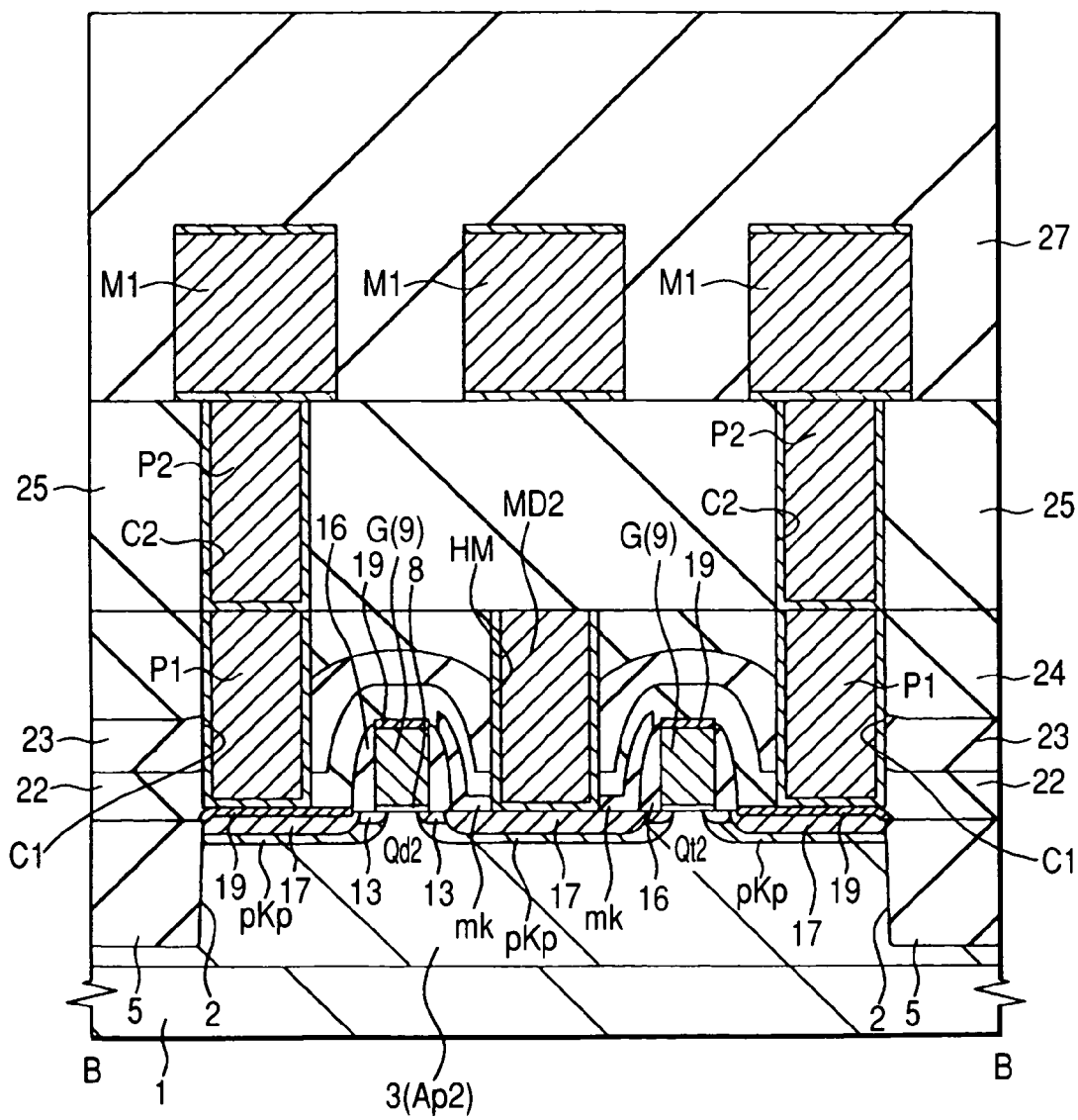

Next, first-layer lines M1 are formed on the silicon oxide film 25 and the plugs P2, as shown in FIG. 37 through FIG. 41. FIG. 41 is a plan view of the substrate 1, showing the area where one memory cell is formed, and FIG. 37, FIG. 38, FIG. 39 and FIG. 40 show the cross sections taken along the lines A—A, B—B, C—C and D—D, respectively, of FIG. 41.

In forming the first-layer lines M1, a Ti film of about 10 nm (not shown) and a TiN film of about 50 nm are formed sequentially by the sputtering process, and the substrate 1 is treated for annealing at 500–700° C. for 1 minute. A W film is deposited by the CVD process, and it is patterned into the first-layer lines M1. Among the first-layer lines M1, a line M1 that connects between the gate electrodes G of the transfer MISFETs Qt1 and Qt2 by way of the plugs P1 and P2 becomes a word line WL.

Figure 44:
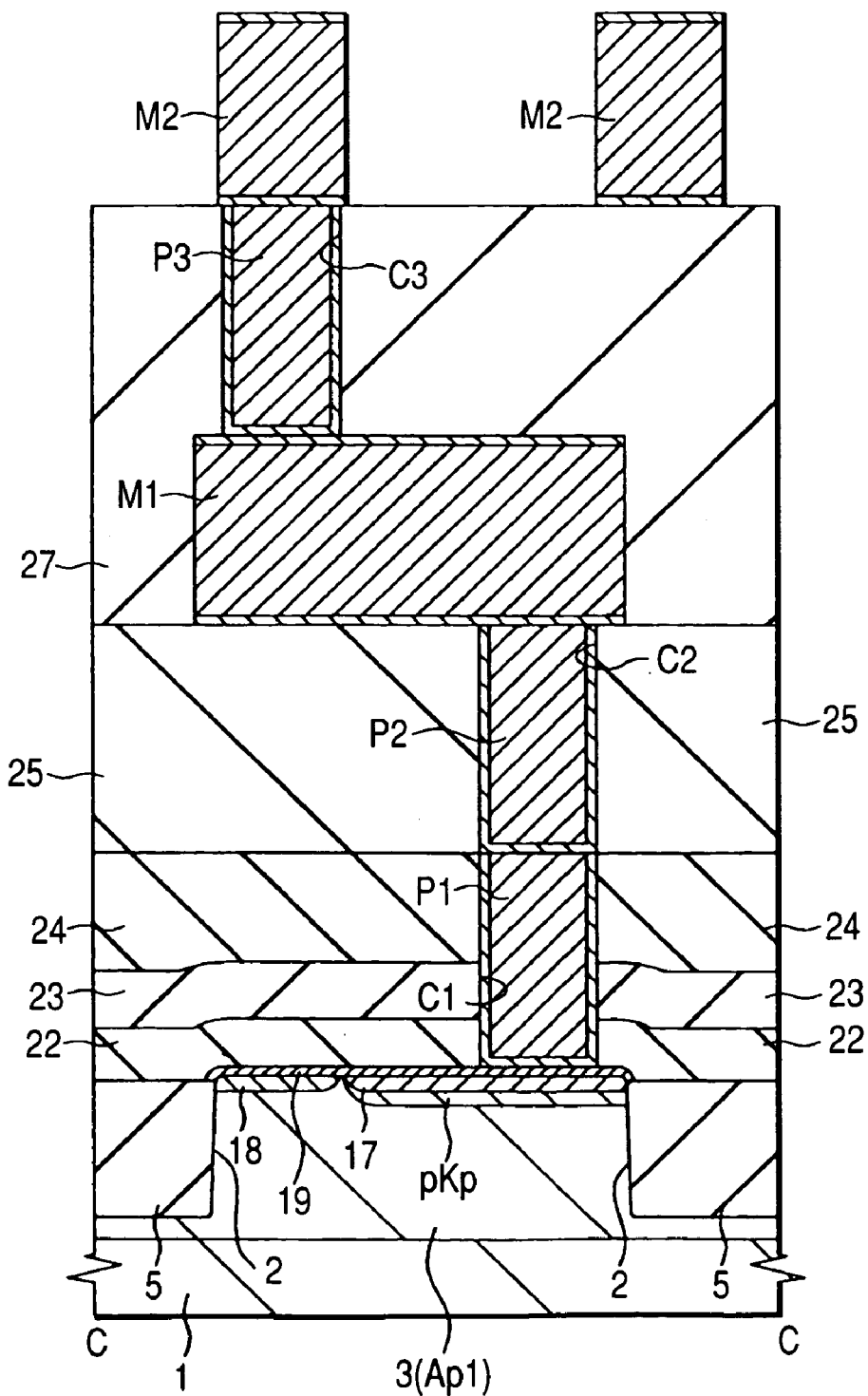
Figure 45:
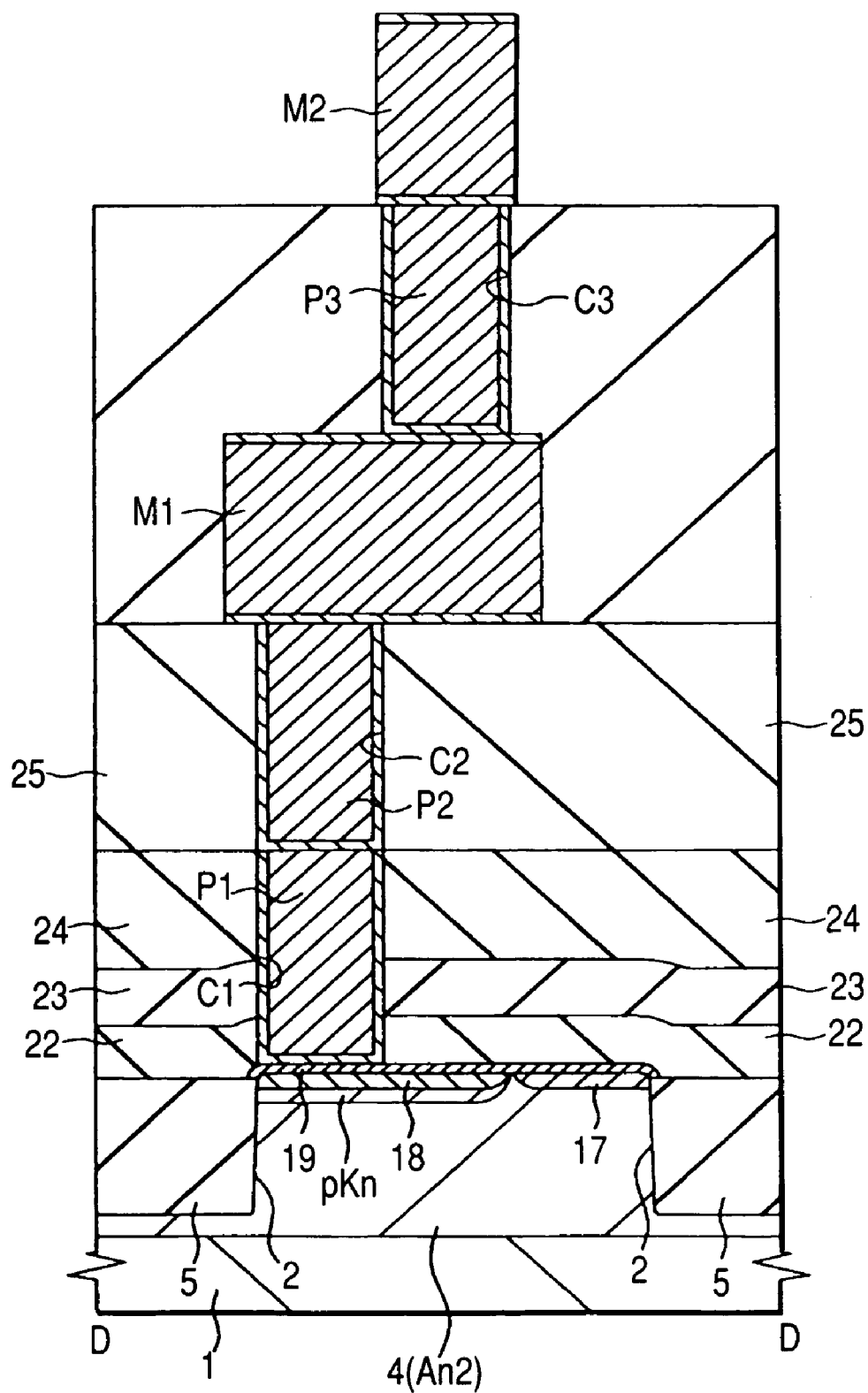
Figure 46:
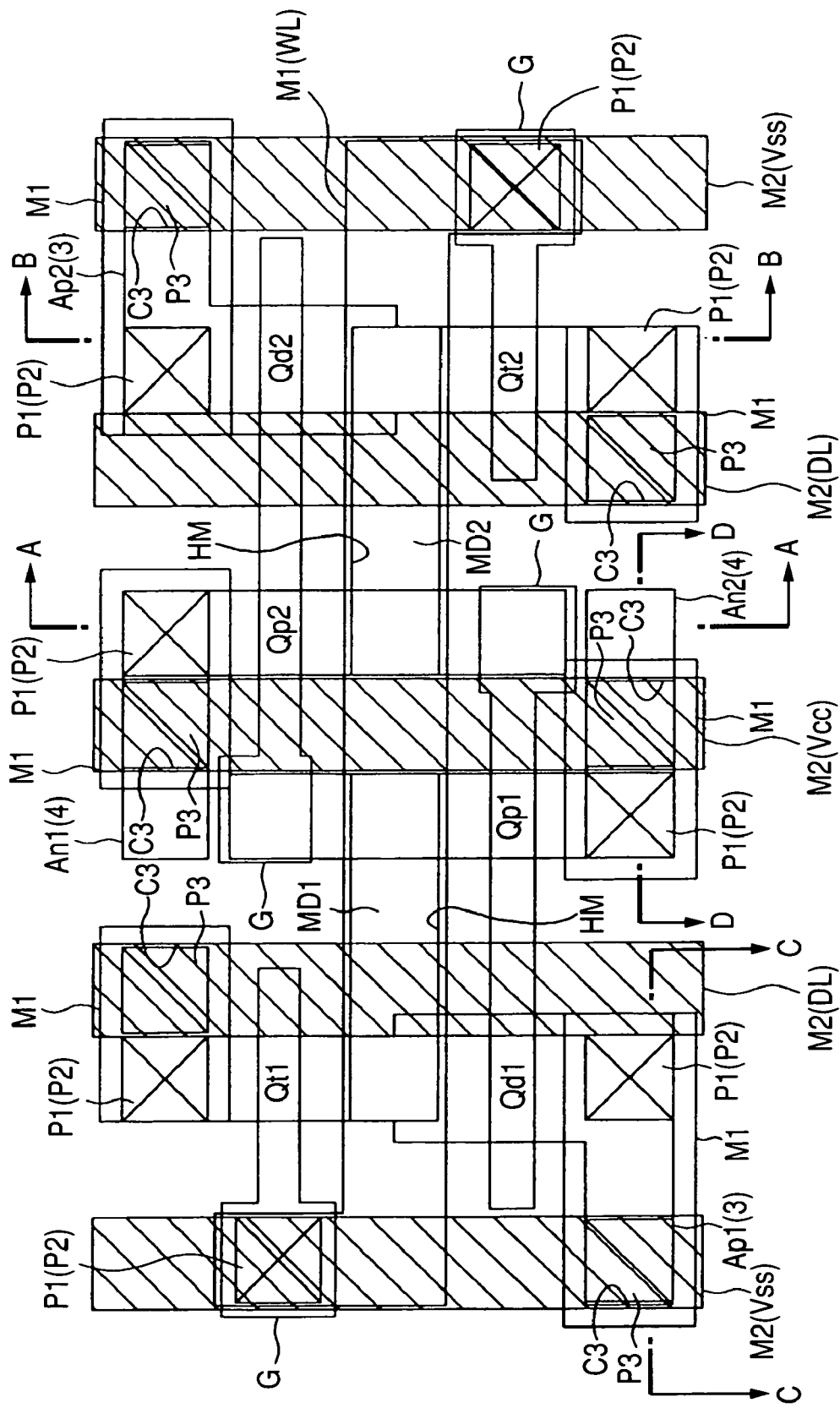
FIG. 46 is a plan view of the principal portions of the substrate, showing the configuration of the SRAM memory cell of the first embodiment, at a step in the fabrication thereof.

Next, a silicon oxide film 27 is formed on the first-layer lines M1 and the silicon oxide film 25 by the CVD process, and, thereafter, the film 27 on the first-layer lines M1 is etched off to form contact holes C3, as shown in FIG. 42 through FIG. 46. FIG. 46 is a plan view of the substrate 1, showing the area where one memory cell is formed, and FIG. 42, FIG. 43, FIG. 44 and FIG. 45 show the cross sections taken along the lines A—A, B—B, C—C and D—D, respectively, of FIG. 46.

Next, a conductor film is buried into the contact holes C3 so as to form plugs P3 in the same manner as the plugs P2.

Next, second-layer lines M2 are formed on the silicon oxide film 27 and the plugs P3 as follows. First, a Ti film of about 10 nm (not shown) and a TiN film of about 50 nm are formed sequentially by a sputtering process, and the substrate 1 is treated for annealing at 500–700° C. for 1 minute. A W film is deposited by a CVD process, and it is patterned into the second-layer lines M2.

Through the second-layer lines M2, plugs P3, first-layer lines M1 and plugs P2 and P1, the ground voltage Vss is supplied to the sources of the drive MISFETs Qd1 and Qd2. Through the second-layer lines M2, plugs P3, first-layer lines M1 and plugs P2 and P1, the power voltage Vcc is supplied to the sources of the load MISFETs Qp1 and Qp2. The ground voltage Vss and the power supply voltage Vcc are also fed to the n-type wells 4 and p-type wells 3. For example, the ground voltage Vss, which is fed to the plugs P1 on the active region Ap1, is also fed to the p-type wells 3 through the silicide layer 19, as shown in FIG. 44. Similarly, the power supply voltage Vcc, which is fed to the plugs P1 on the active region Ap2, is also fed to the n-type wells 4 through the silicide layer 19, as shown in FIG. 45.

The second-layer lines M2 connected to one of the ends of the drive MISFETs Qd1 and Qd2 become a data line pair DL and /DL.

Figure 111:
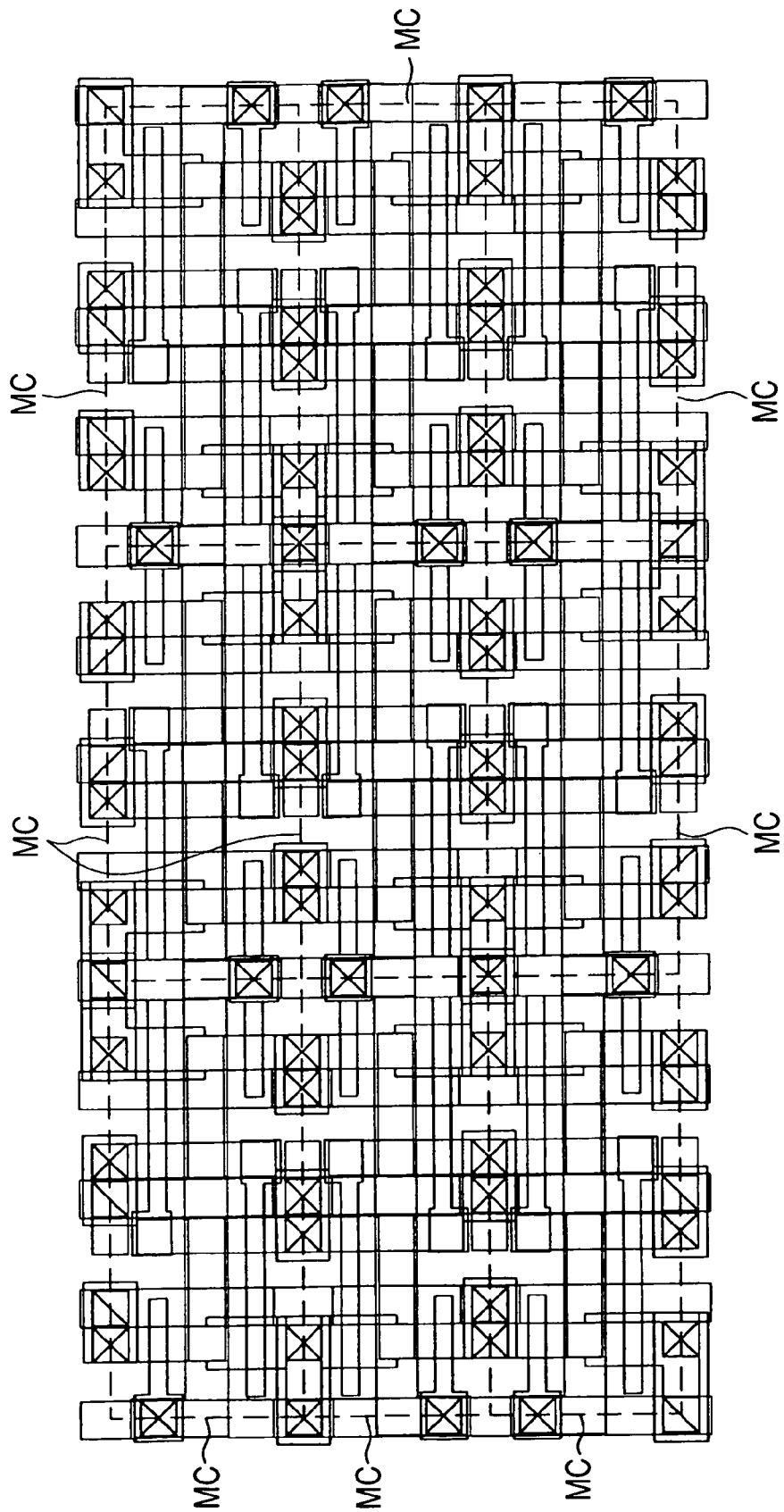
FIG. 111 is a plan view of the principal portion of the substrate of the semiconductor integrated circuit device based on the first embodiment of this invention.

As a result of the foregoing processing steps, the memory cells of the SRAM are almost completed. A plan view of the substrate 1 following the formation of the second-layer lines M2 for multiple memory cells is shown in FIG. 111. Memory cells each having a unit area defined by dashed lines in the figure are laid out in line-symmetric arrangement in this example.

According to this embodiment, the load MISFETs Qp1 and Qp2 and drive MISFETs Qd1 and Qd2 do not have the silicide layer 19 on their drain regions, and, accordingly, the leakage current of the memory cell can be reduced.

Figure 47:
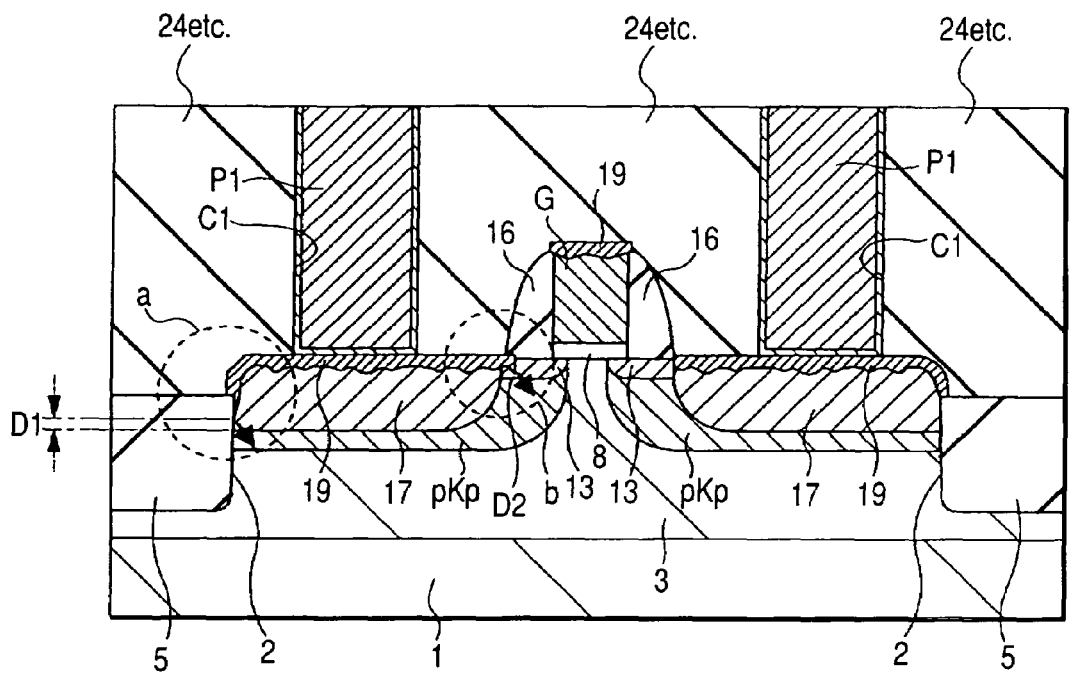
FIG. 47 is a cross-sectional diagram and FIG. 48 is a graph, which illustrate the subject matter of the present invention.

Otherwise, in a case where the silicide layer 19 is formed on the gate electrode G and source-drain regions (17) of an n-channel MISFET, as shown in FIG. 47, the surface of the isolation 2 will retreat from the surface of the semiconductor substrate (p-type well 3) due to the phenomenon of recession. The silicide layer 19 provided on the p-type well 3 will also be formed on the exposed side wall of source-drain regions (indicated by a in the figure), resulting in a reduced distance D1 from the bottom of the silicide layer 19 to the bottom of source-drain regions, so that a leakage current is prone to arise. In case the side wall spacer 16 has its film thickness reduced by the cleaning process or the like after the formation of the $n^+$-type semiconductor regions 17 and before the formation of the silicide layer 19, the silicide layer will be overlaid on the shallow $n^-$-type semiconductor region 13 (indicated by b in the figure), resulting in a reduced distance D2 from the bottom of the silicide layer 19 to the bottom of $n^-$-type semiconductor region 13, so that a leakage current is prone to arise.

Figure 48:
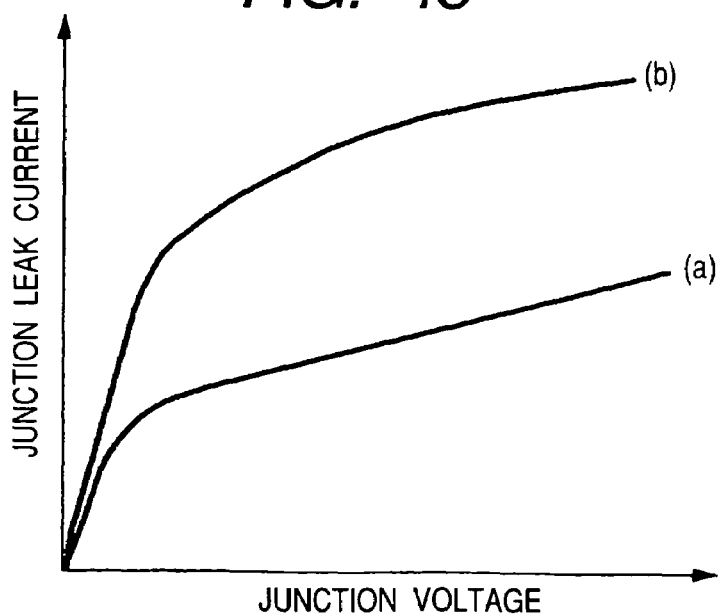
Figure 49:
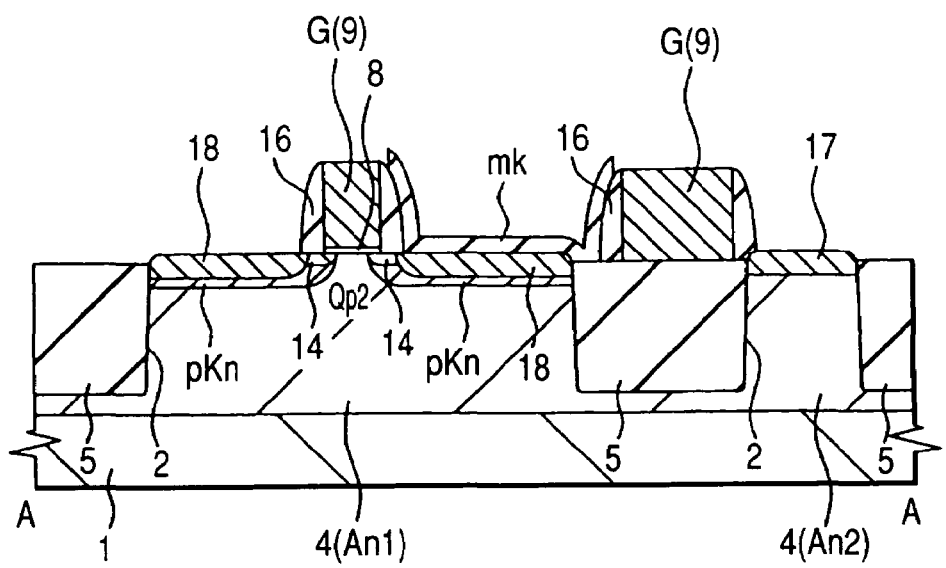
FIG. 49 through FIG. 52 are cross-sectional diagrams showing the principal portions of the substrate of an SRAM memory cell based on a second embodiment of this invention, as seen along lines A—A, B—B, C—C and D—D, respectively, in FIG. 53, during a step in the fabrication thereof.
Figure 50:
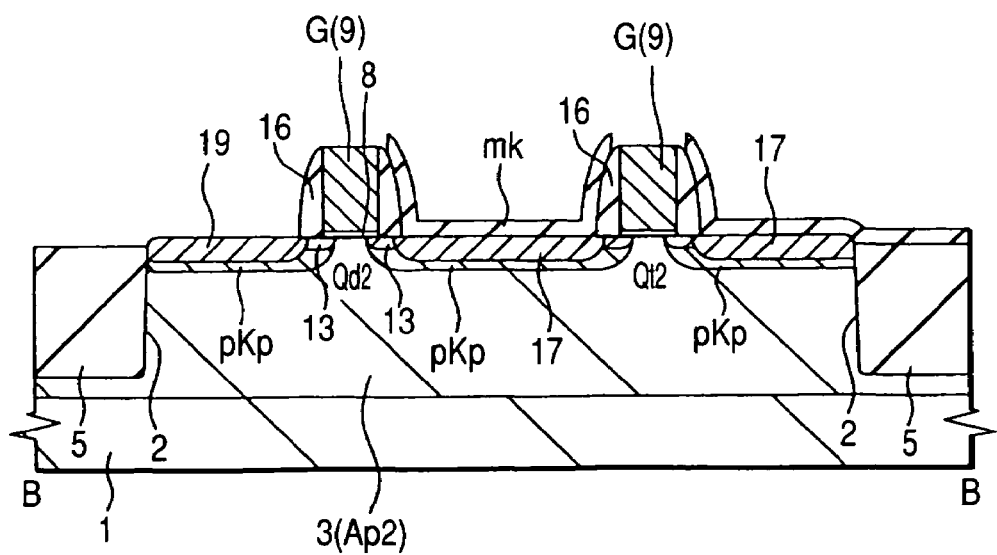
Figure 51:
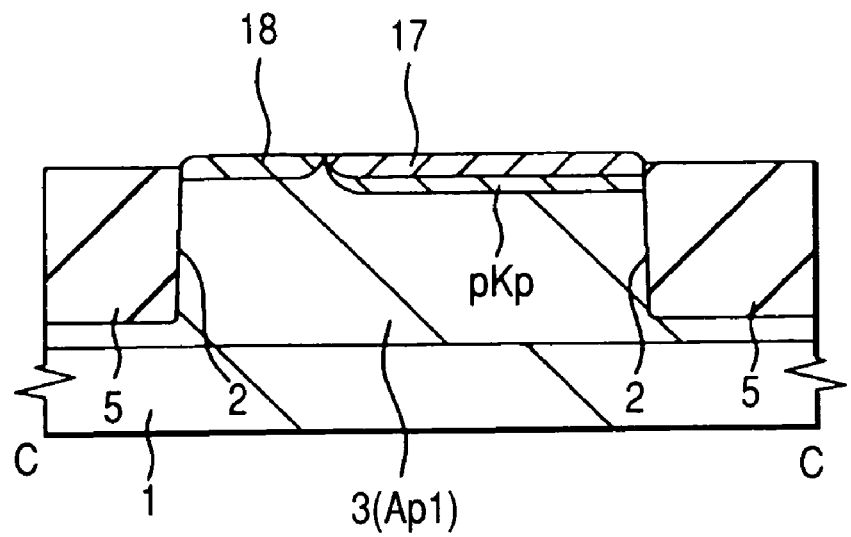
Figure 52:
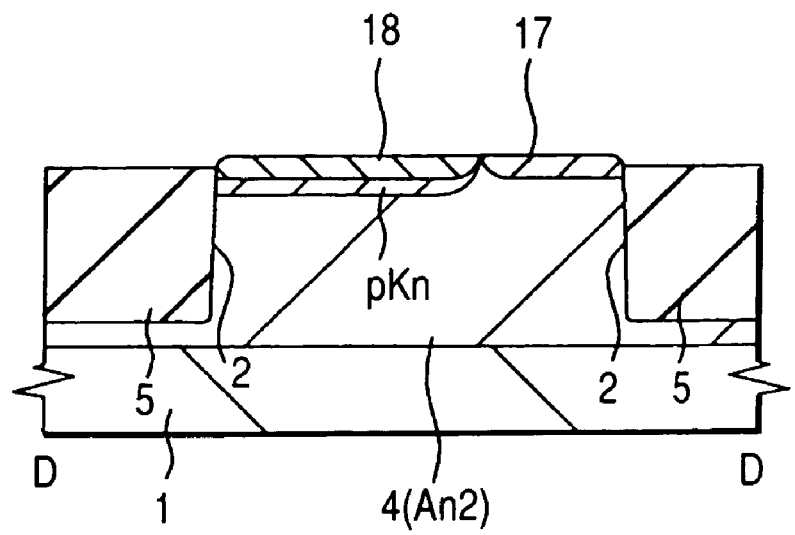

In the case of a normal MISFET, the junction leakage current increases moderately with an increase in the junction voltage, as shown by curve (a) in the graph of FIG. 48. Whereas, if the junction leakage current increases drastically with an increase in the junction voltage, as shown by curve (b), the MISFET will be defective.

Since the drive MISFETs Qd1 and Qd2 have their back gates supplied with the ground voltage Vss, while one of their drains is at high level, a voltage difference exists between the drain and the substrate (well) in one of Qd1 and Qd2, and, consequently, the leakage current is prone to increase. However, this embodiment, in which the silicide layer 19 is excluded from the drain regions of the drive MISFETs Qd1 and Qd2, can reduce the leakage current.

Since the load MISFETs Qp1 and Qp2 have their back gates supplied with the power supply voltage Vcc, and one of their drains is at low level, a voltage difference occurs between the drain and the substrate (well) in one of the load MISFETs Qp1 and Qp2, and, consequently, the leakage current is prone to increase. However, this embodiment, in which the silicide layer 19 is excluded from the drain regions of the load MISFETs Qp1 and Qp2, can reduce the leakage current.

In this embodiment, the six MISFETs of the SRAM memory cell are laid out as shown in FIG. 31, and one end (source-drain region) of the transfer MISFET Qt1, which is common to the drain region of the load MISFET Qp1, does not have the silicide layer 19 on it. Similarly, one end (source-drain region) of the transfer MISFET Qt2 does not have the silicide layer 19 on it. Accordingly, these MISFETs can have their leakage currents reduced.

Since the transfer MISFETs Qt1 and Qt2 have their back gates supplied with the ground voltage Vss, and one end (on the side of storage node A or B in FIG. 1) of the transfer MISFETs Qt1 and Qt2 is at a high level, a voltage difference occurs between the one end (source-drain region) and the substrate (well) in one of the MISFETs Qt1 and Qt2, and, consequently, the leakage current is prone to increase. However, this embodiment, in which the silicide layer 19 is formed to isolate one of the ends of transfer MISFETs Qt1 and Qt2, can reduce the leakage current.

On the other hand, the silicide layer 19 is formed on the semiconductor regions (17,18), and the ground voltage Vss and power supply voltage Vcc can be supplied from the plugs P1 to the n-type wells 4 and p-type wells 3 through the layer 19 (refer to FIG. 44 and FIG. 45).

Second Embodiment

An SRAM memory cell based on a second embodiment of this invention will be explained in connection with its process of fabrication with reference to FIG. 49 through FIG. 58. The processing steps, except for those which involve the formation of mask film mk and the silicide layer 19, are identical to the first embodiment as described in conjunction with FIG. 2 through FIG. 16 and FIG. 27 through FIG. 46, and a repeated explanation thereof will be omitted.

Figure 53:
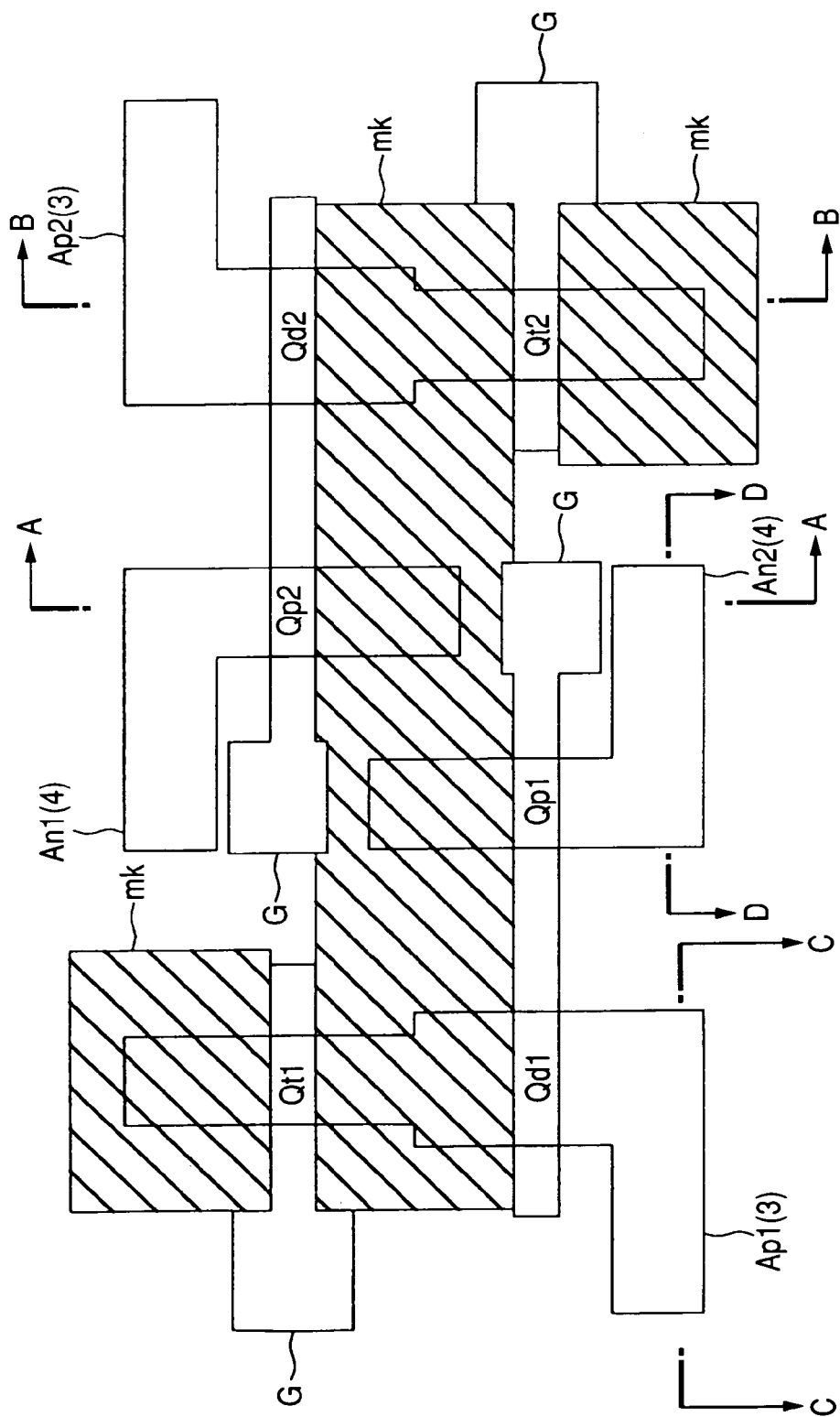
FIG. 53 is a plan view of the principal portions of the substrate, showing the configuration of the SRAM memory cell of the second embodiment, at a step in the fabrication thereof.
Figure 54:
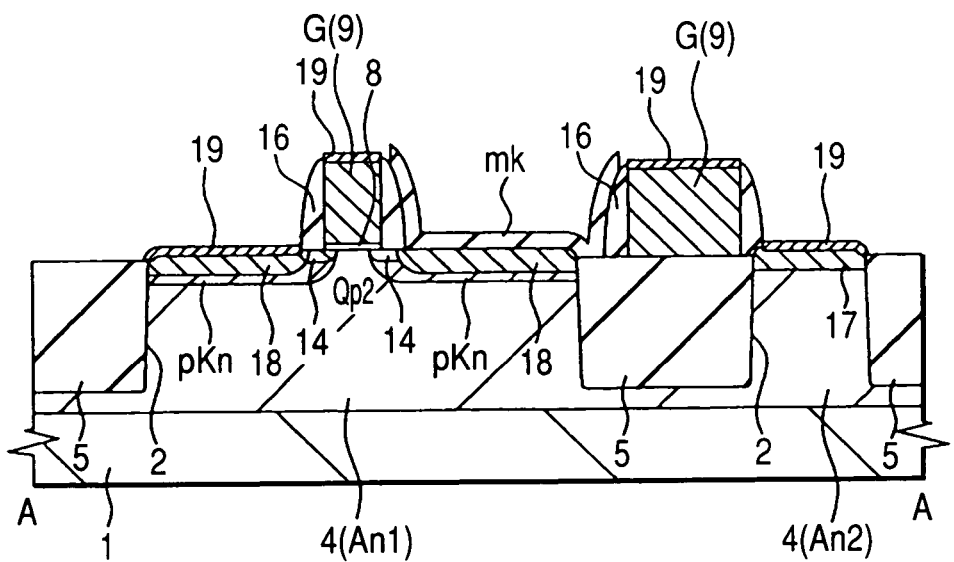
FIG. 54 through FIG. 57 are cross-sectional diagrams showing the principal portions of the substrate of the SRAM memory cell of the second embodiment, as seen along lines A—A, B—B, C—C and D—D, respectively, in FIG. 58, during a step in the fabrication thereof.

First, a semiconductor substrate 1 is prepared in a manner identical to that described in conjunction with FIG. 12 through FIG. 16 for the first embodiment, and a silicon oxide film is deposited on it by a CVD process. The silicon oxide film is treated for dry etching with a mask of photoresist (not shown), thereby to form a mask film mk of silicon oxide, as shown in FIG. 49 through FIG. 53. FIG. 53 is a plan view of the substrate 1, showing an area where one memory cell is formed, and FIG. 49, FIG. 50, FIG. 51 and FIG. 52 show the cross sections taken along the lines A—A, B—B, C—C and D—D, respectively, of FIG. 53.

The mask mk is shaped to cover the drain regions of the load MISFETs Qp1 and Qp2 and drive MISFETs Qd1 and Qd2 and the other ends (on the side of data line connection) of the transfer MISFETs Qt1 and Qt2, as shown in FIG. 53. Using the through film of ion implantation for the mask film mk can simplify the process also in this embodiment.

Next, a metallic film, e.g., Co film, is deposited on the substrate 1 by the sputtering process. The substrate 1 is treated for annealing at 600° C. for 1 minute, thereby to form a silicide layer 19 to cover the contact sections between the exposed portions of the substrate 1 ($n^+$-type semiconductor regions 17 and $p^+$-type semiconductor regions 18) and the Co film and between the gate electrodes G and the Co film.

The silicide layer 19 is absent on the drain regions of the load MISFETs Qp1 and Qp2 and drive MISFETs Qd1 and Qd2 due to the presence of the mask film mk on these regions, as described above. Similarly, the silicide layer 19 is absent on the other ends (on the side of data line connection) of the transfer MISFETs Qt1 and Qt2, due to the presence of the mask film.

Figure 56:
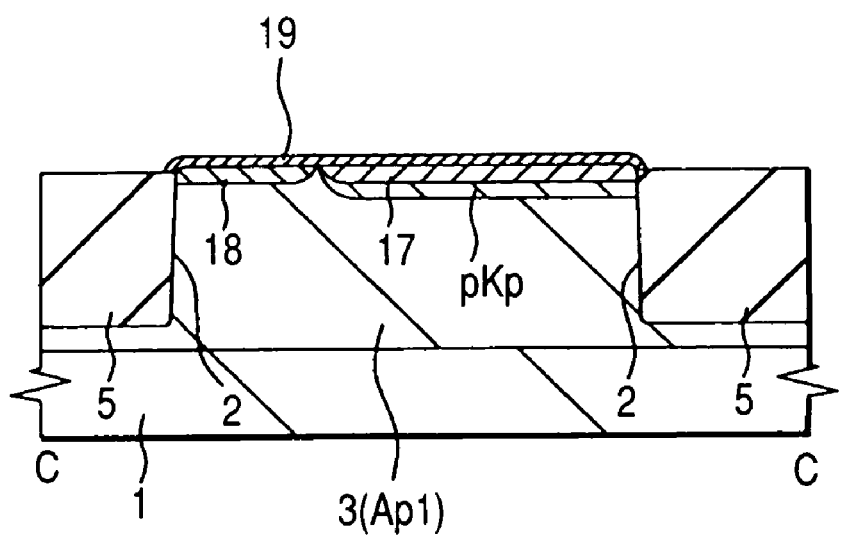
Figure 57:
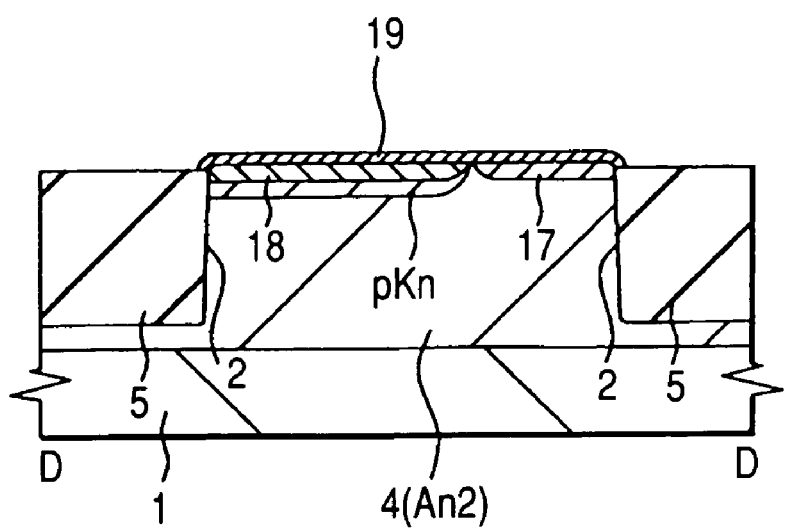

The silicide layer 19 covers the source regions of the load MISFETs Qp1 and Qp2 and drive MISFETs Qd1 and Qd2, as in the case of the first embodiment, and it also covers the semiconductor regions 17 and 18 for feeding the voltages to the wells as explained in conjunction with the first embodiment (refer to FIG. 56 and FIG. 57).

Figure 58:
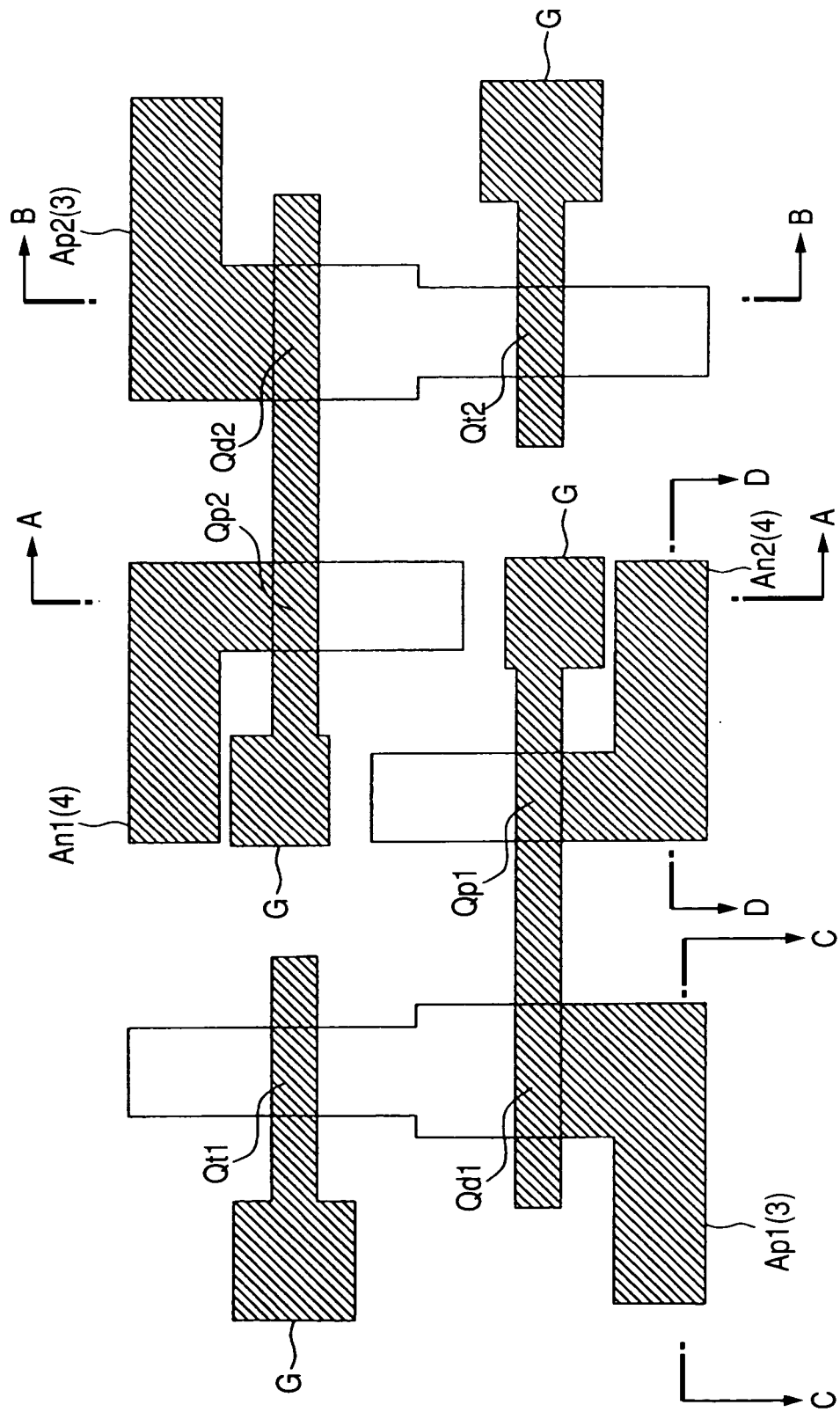
FIG. 58 is a plan view of the principal portions of the substrate, showing the configuration of the SRAM memory cell of the second embodiment, at a step in the fabrication thereof.
Figure 59:
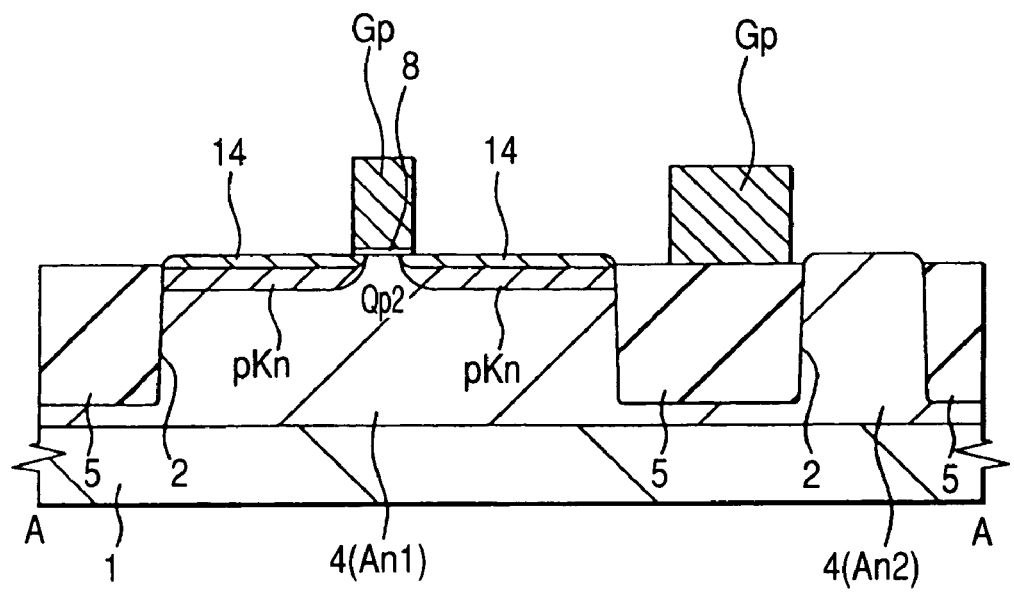
FIG. 59 through FIG. 62 are cross-sectional diagrams showing the principal portions of the substrate of an SRAM memory cell based on a third embodiment of this invention, as seen along lines A—A, B—B, C—C and D—D, respectively, in FIG. 63, during a step in the fabrication thereof.
Figure 60:
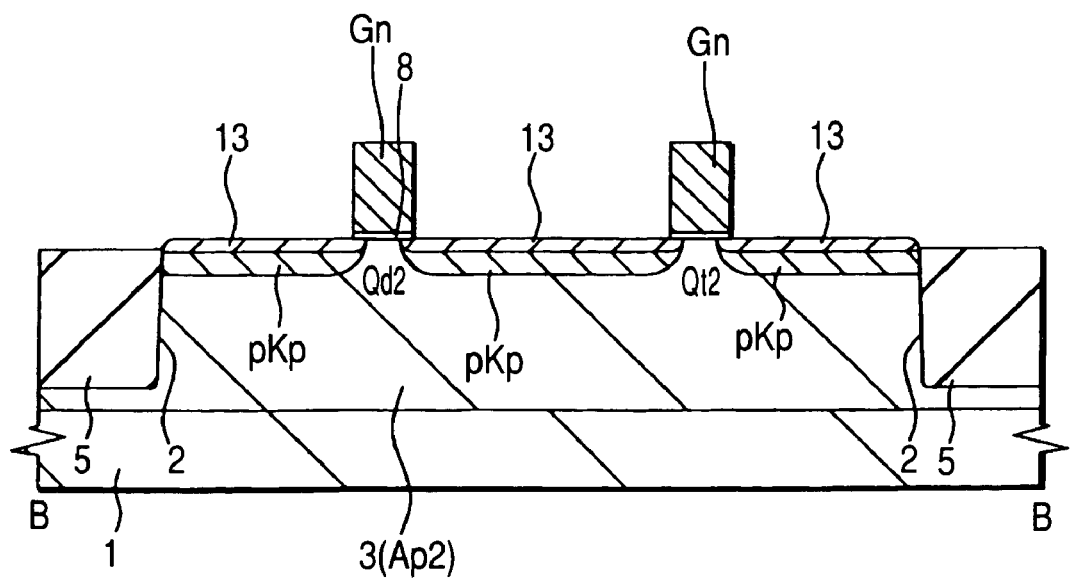
Figure 61:
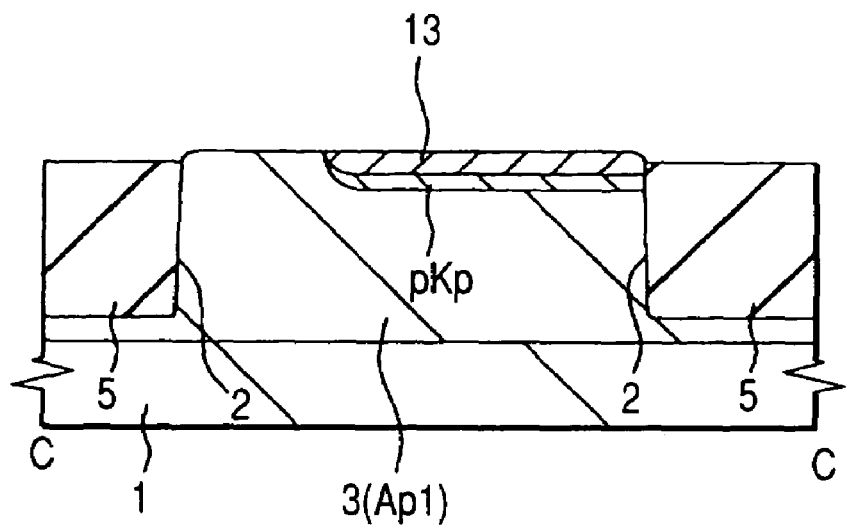
Figure 62:
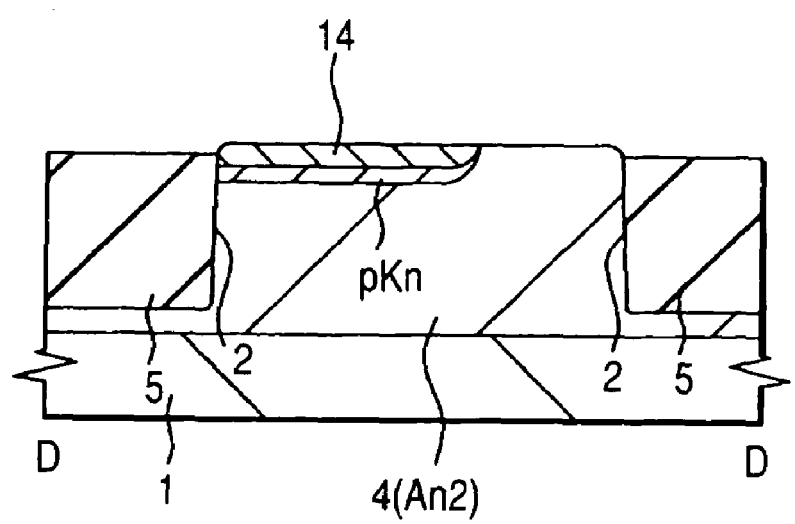

Next, the remaining Co film is etched off, and the substrate 1 is treated for annealing at 700–800° C. for about 1 minute so that the silicide layer 19 is made to have a reduced resistivity. The silicide layer 19 is formed as shown in FIG. 54 through FIG. 58. FIG. 58 is a plan view of the substrate 1, showing the area where one memory cell is formed, and FIG. 54, FIG. 55 FIG. 56 and FIG. 57 show the cross sections taken along the lines A—A, B—B, C—C and D—D, respectively, of FIG. 58. The areas where the silicide layer 19 is formed are shown by hatching in FIG. 58 (mask film mk is not shown).

In this embodiment, the silicide layer 19 is absent on the other ends (on the side of data line connection) of the transfer MISFETs Qt1 and Qt2, and the leakage current of these regions can be reduced, in addition to the effect of leakage current reduction achieved by the first embodiment.

Since the transfer MISFETs Qt1 and Qt2 have their back gates supplied with the ground voltage Vss, and the other end (on the side of data line) of one of the transfer MISFETs Qt1 and Qt2 is at high level in the data read and write operations, a voltage difference occurs between the other end (source-drain region) of one of the MISFETs Qt1 and Qt2 and the substrate 1 (well), and, consequently, the leakage current is prone to increase. In this embodiment, however, the silicide layer 19 is absent on the other ends of transfer MISFETs Qt1 and Qt2, and the leakage current can be reduced. This property is also effective for the standby mode in which data lines are kept high for effecting a fast operation.

The remaining process is identical to the explanation provided in conjunction with FIG. 27 through FIG. 46 of the first embodiment, and so a repeated explanation thereof will be omitted.

Third Embodiment

An SRAM memory cell based on a third embodiment of this invention will be explained in connection with its process of fabrication with reference to FIG. 59 through FIG. 79. This embodiment adopts a dual gate structure in which n-type MISFETs have n-type gate electrodes, and p-type MISFETs have p-type gate electrodes. The processing steps up to the formation of the isolation 2 are identical to the explanation presented in conjunction with FIG. 2 through FIG. 6 of the first embodiment, and so a repeated explanation thereof will be omitted.

First, a semiconductor substrate 1 is prepared in a manner identical to that explained in conjunction with FIG. 12 through FIG. 16 for the first embodiment, and a gate oxide film 8 is formed on it in the same manner as the first embodiment. A low-resistivity poly-silicon film 9 of about 100 nm in thickness is deposited on it by a CVD process. P-type impurity, e.g., boron, is implanted into the poly-silicon film 9, while the active regions Ap1 and Ap2 are covered with a resist film (not shown). As a result, the poly-silicon film 9 on the active regions An1 and An2 becomes p-type. The resist film is removed, and n-type impurity, e.g., phosphor, is implanted into the poly-silicon film 9, while the active regions An1 and An2 are covered with a resist film (not shown). As a result, the poly-silicon film 9 on the active regions Ap1 and Ap2 becomes n-type.

Figure 63:
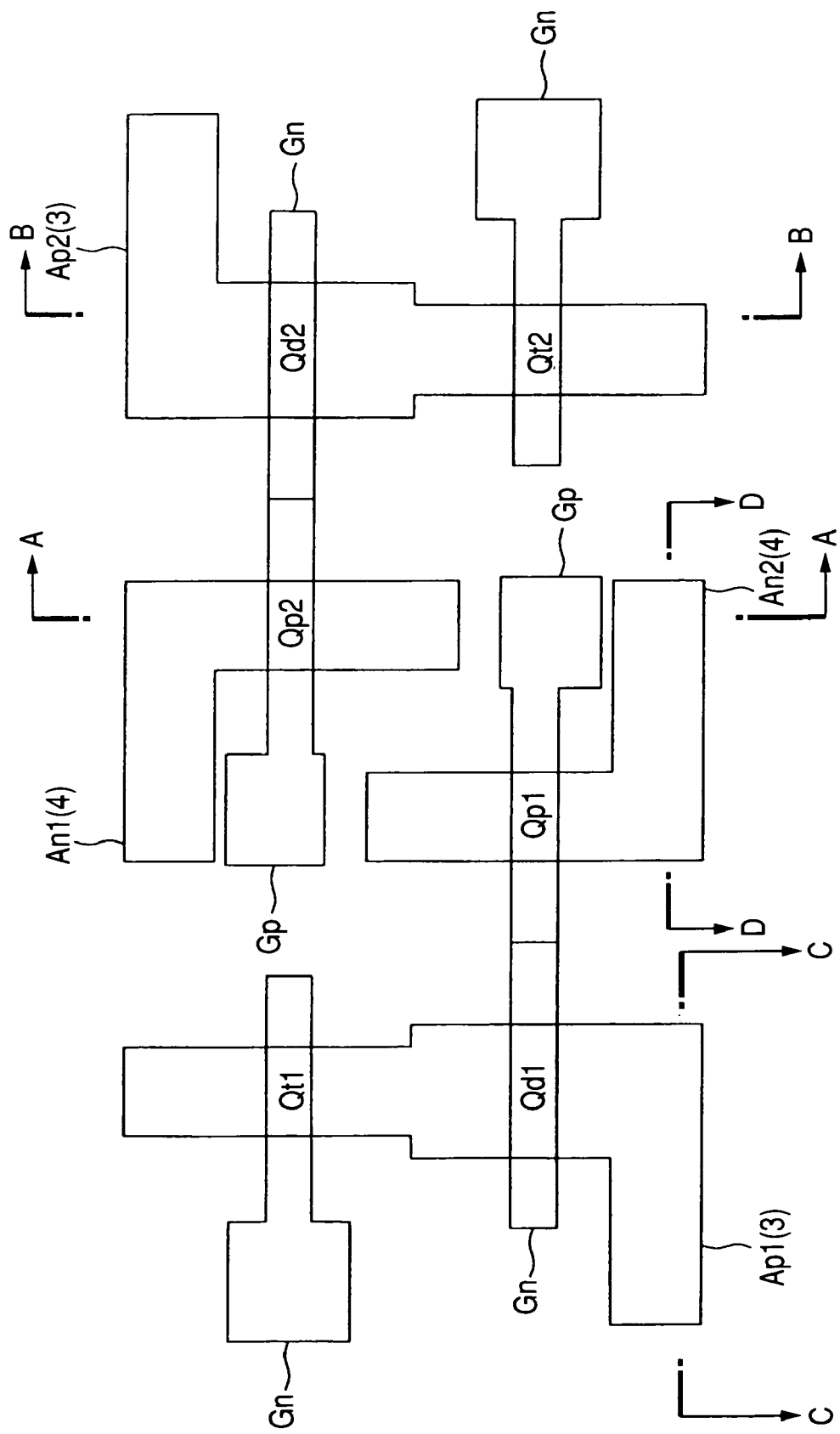
FIG. 63 is a plan view of the principal portions of the substrate, showing the configuration of the SRAM memory cell of the third embodiment, at a step in the fabrication thereof.
Figure 64:
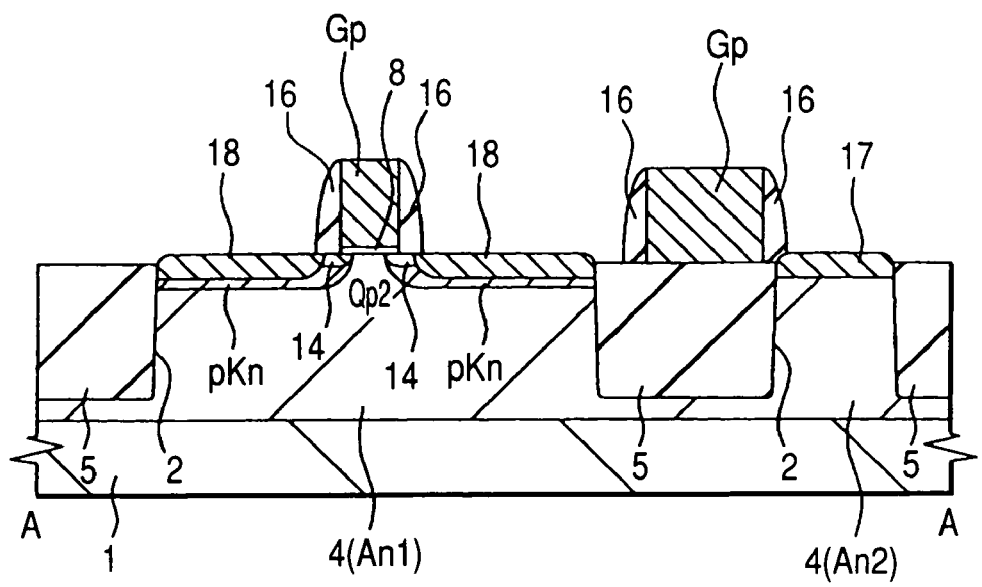
FIG. 64 through FIG. 67 are cross-sectional diagrams showing the principal portions of the substrate of the SRAM memory cell of the third embodiment, as seen along lines A—A, B—B, C—C and D—D, respectively, in FIG. 68, during a step in the fabrication thereof.
Figure 65:
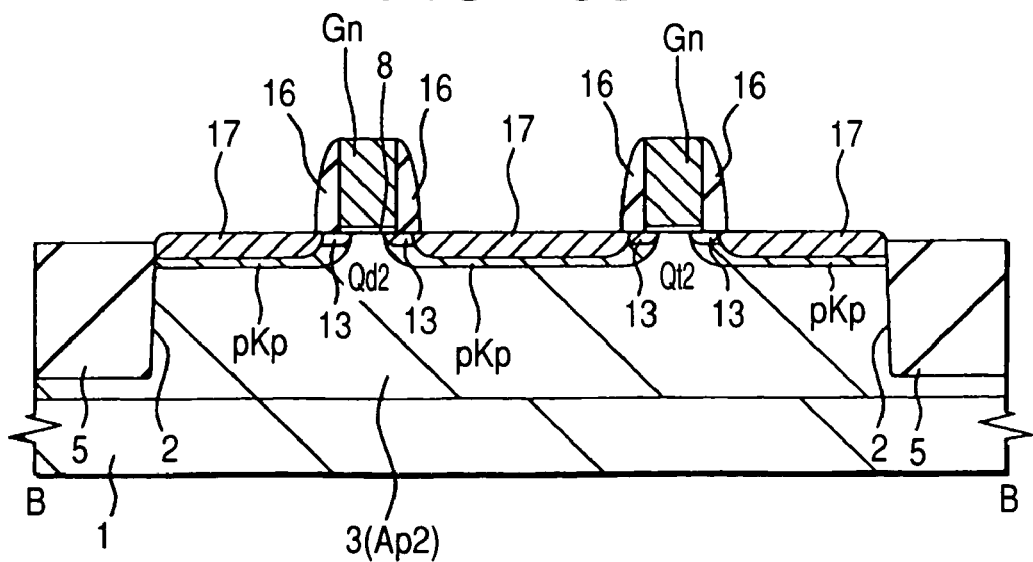
Figure 66:
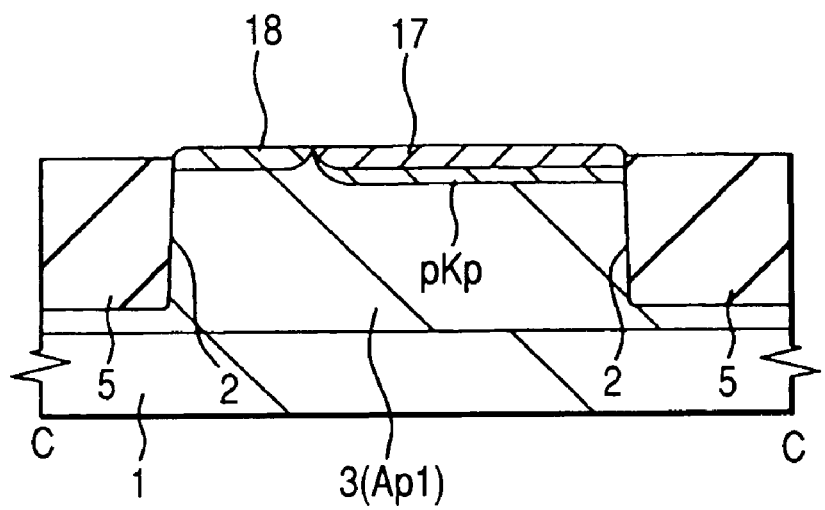
Figure 67:
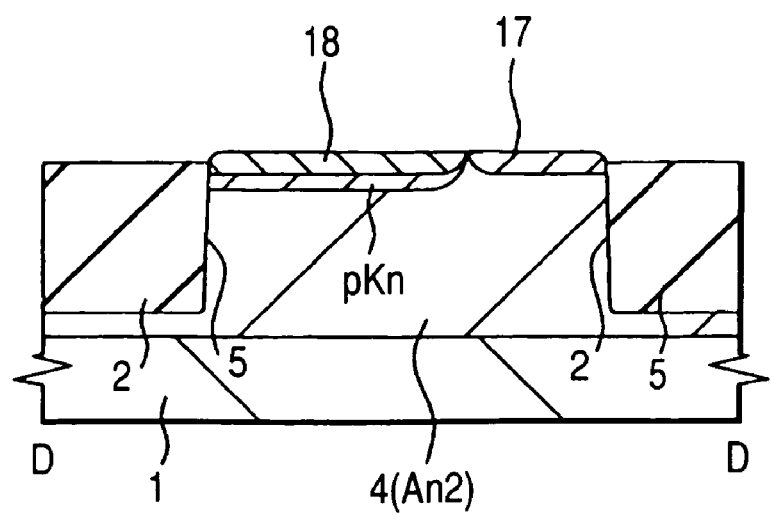

Next, the resulting poly-silicon films 9 are treated for dry etching in the same manner as the first embodiment, thereby to form gate electrodes G, i.e., gate electrodes Gn made from n-type poly-silicon and gate electrodes Gp made from p-type poly-silicon. The gate electrodes Gn and Gp are formed as shown in FIG. 59 through FIG. 63. FIG. 63 is a plan view of the substrate 1, showing an area where one memory cell is formed, and FIG. 59, FIG. 60, FIG. 61 and FIG. 62 show the cross sections taken along the lines A—A, B—B, C—C and D—D, respectively, of FIG. 63.

Figure 79:
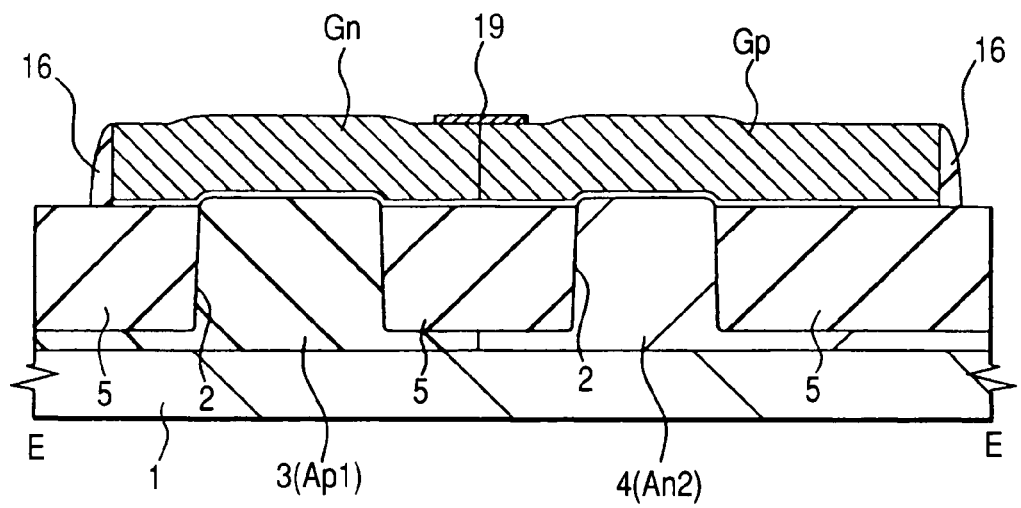
FIG. 79 is a cross-sectional diagram of the principal portion of the substrate of the SRAM memory cell of the third embodiment, as seen along line E—E in FIG. 78, during a step in the fabrication thereof.

The load MISFET Qp1 and drive MISFET Qd1 have their gate electrodes connected together, and the load MISFET Qp2 and drive MISFET Qd2 have their gate electrodes connected together as shown in FIG. 63, resulting in the emergence of a border plane between the gate electrodes Gn and Gp (refer to FIG. 79). The resulting pn-junction in this border region creates a depletion layer.

Figure 68:
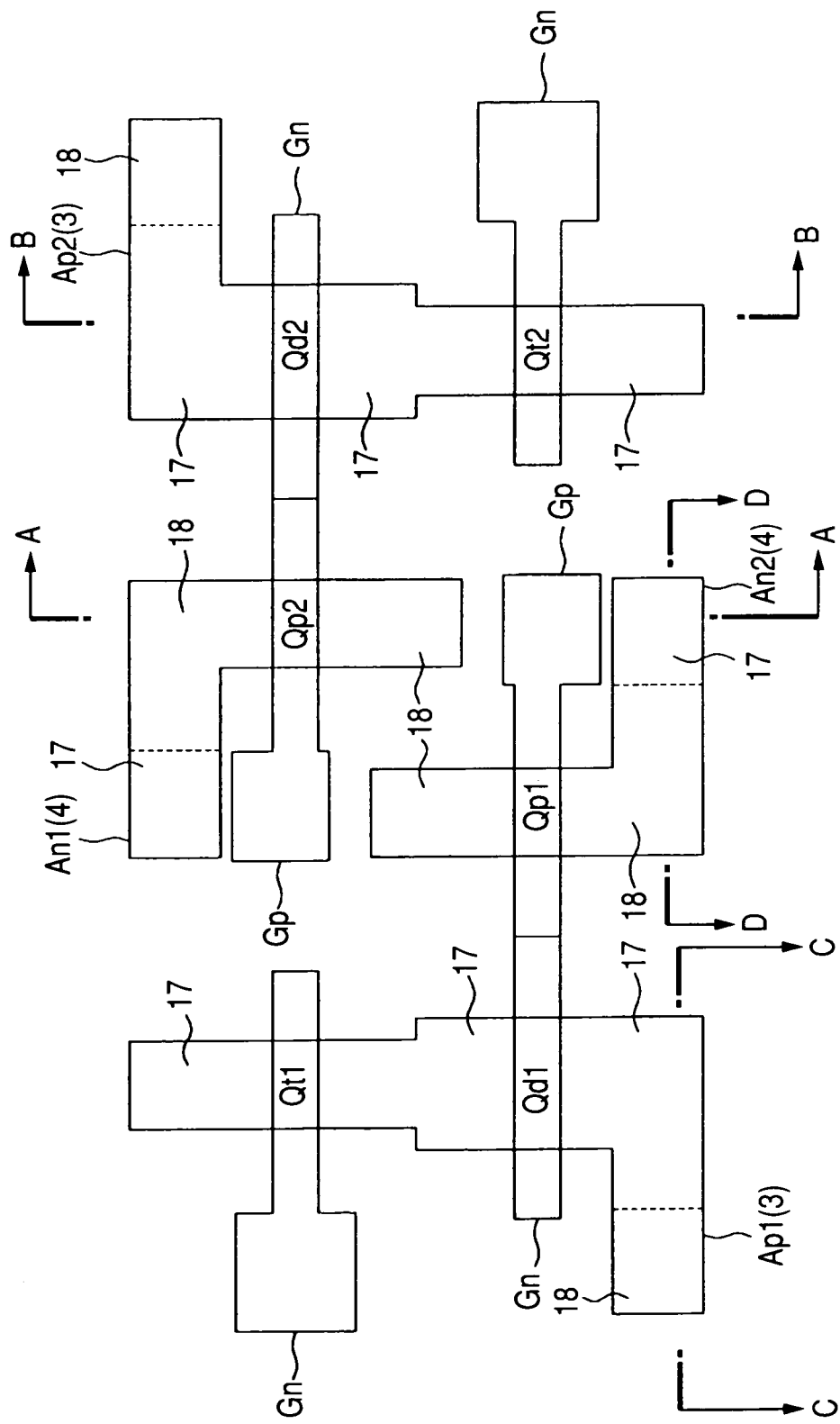
FIG. 68 is a plan view of the principal portions of the substrate, showing the configuration of the SRAM memory cell of the third embodiment, at a step in the fabrication thereof.
Figure 69:
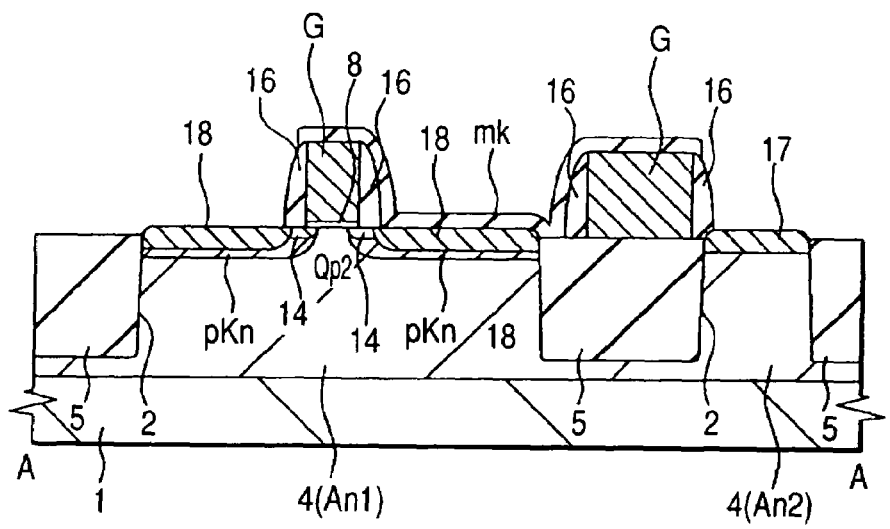
FIG. 69 through FIG. 72 are cross-sectional diagrams showing the principal portions of the substrate of the SRAM memory cell of the third embodiment, as seen along lines A—A, B—B, C—C and D—D, respectively, in FIG. 73, during a step in the fabrication thereof.
Figure 70:
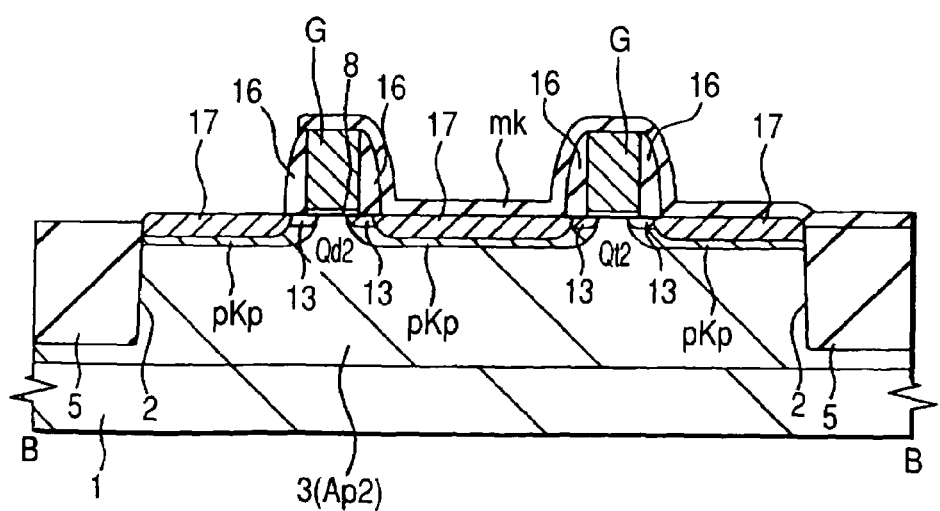
Figure 71:
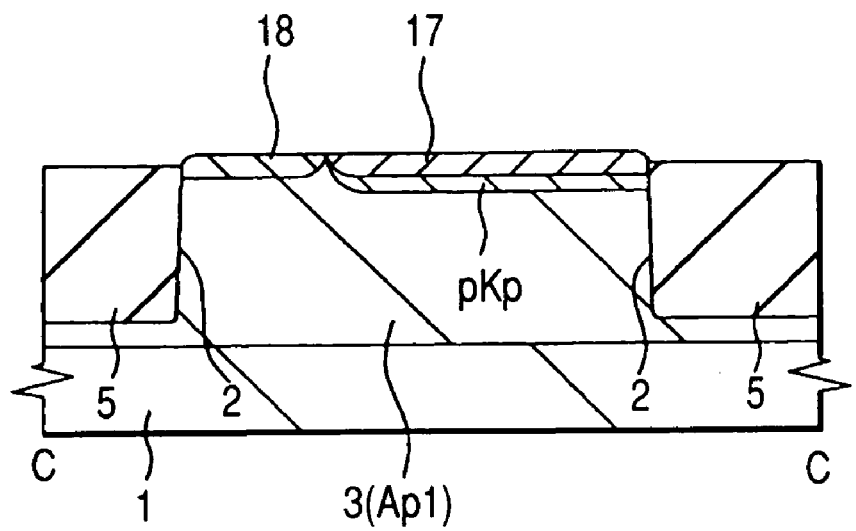
Figure 72:
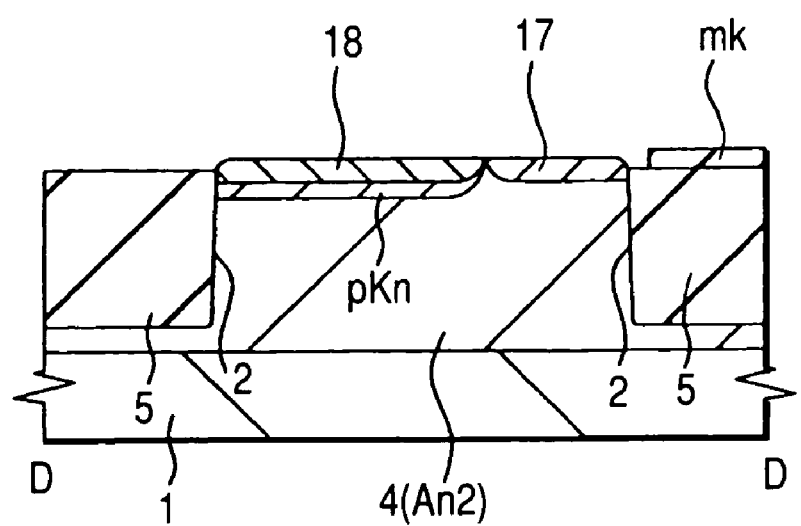

Next, pocket ion regions pKp and pKn, side wall spacers 16, $n^+$-type semiconductor regions 17 (source and drain) and $p^+$-type semiconductor regions 18, and semiconductor regions (17,18) for feeding the voltages to the wells are formed in the same manner as the first embodiment. The semiconductor regions (17,18) are formed as shown in FIG. 64 through FIG. 68. FIG. 68 is a plan view of the substrate 1, showing the area where one memory cell is formed, and FIG. 64, FIG. 65, FIG. 66 and FIG. 67 show the cross sections taken along the lines A—A, B—B, C—C and D—D, respectively, of FIG. 68.

Figure 73:
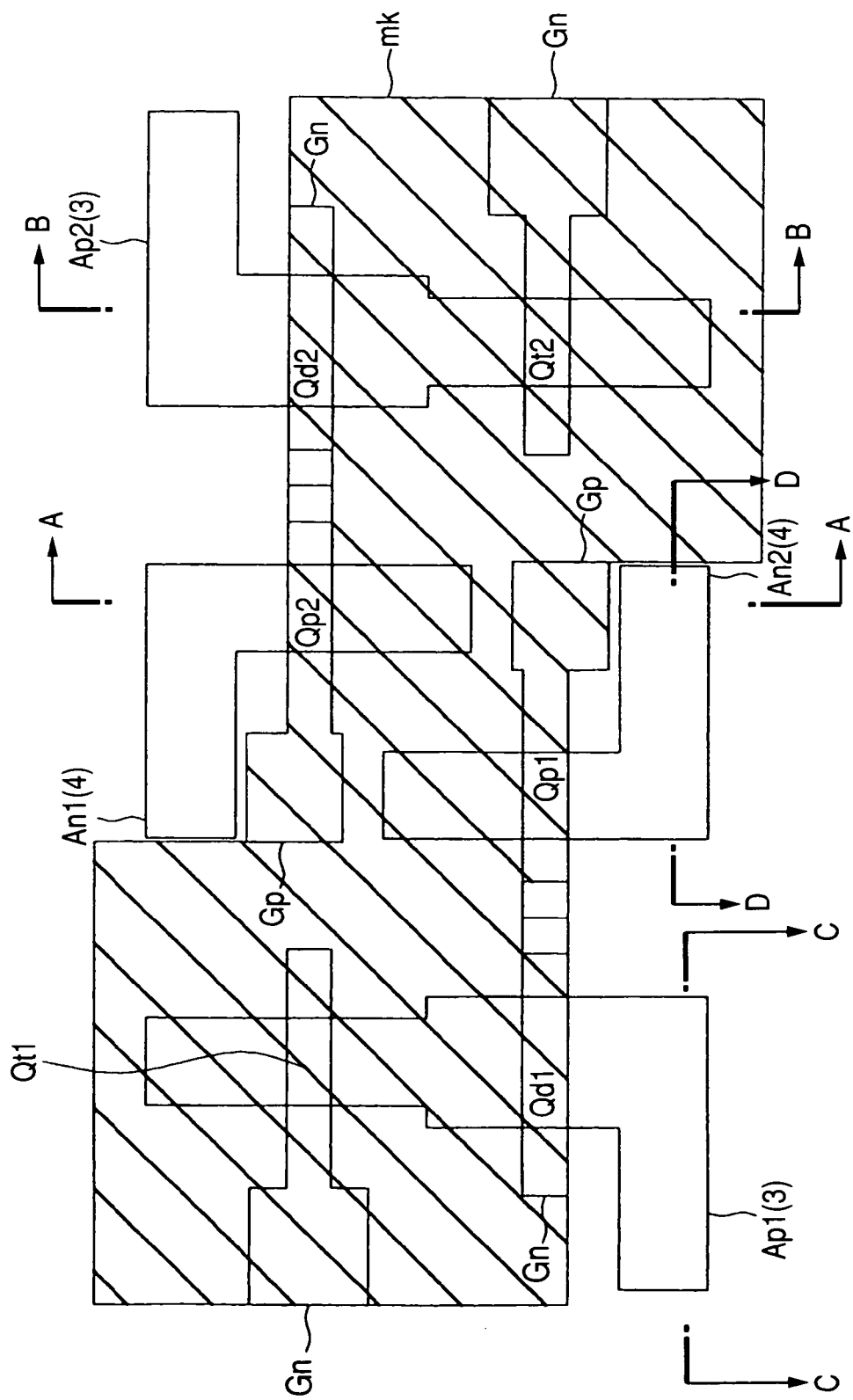
FIG. 73 is a plan view of the principal portions of the substrate, showing the configuration of the SRAM memory cell of the third embodiment, at a step in the fabrication thereof.
Figure 74:
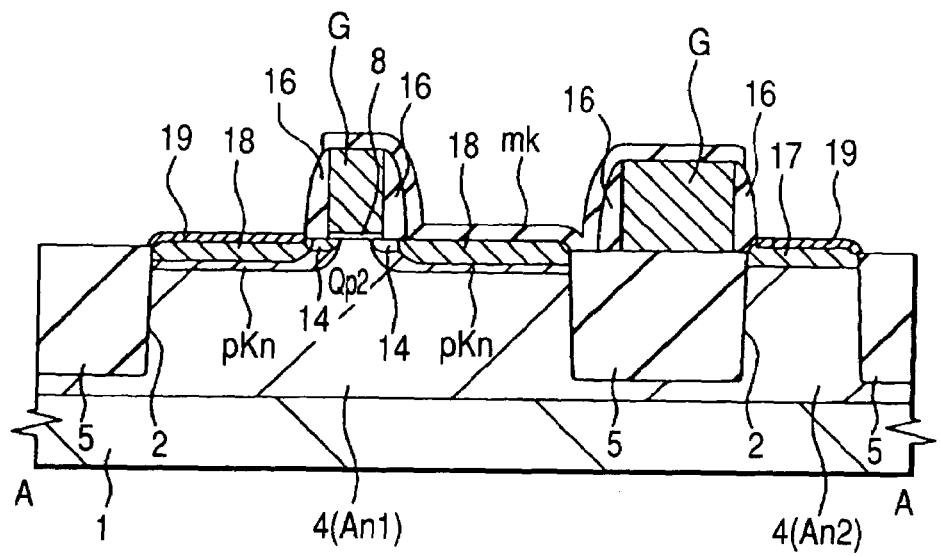
FIG. 74 through FIG. 77 are cross-sectional diagrams showing the principal portions of the substrate of the SRAM memory cell of the third embodiment, as seen along lines A—A, B—B, C—C and D—D, respectively, in FIG. 78, during a step in the fabrication thereof.
Figure 75:
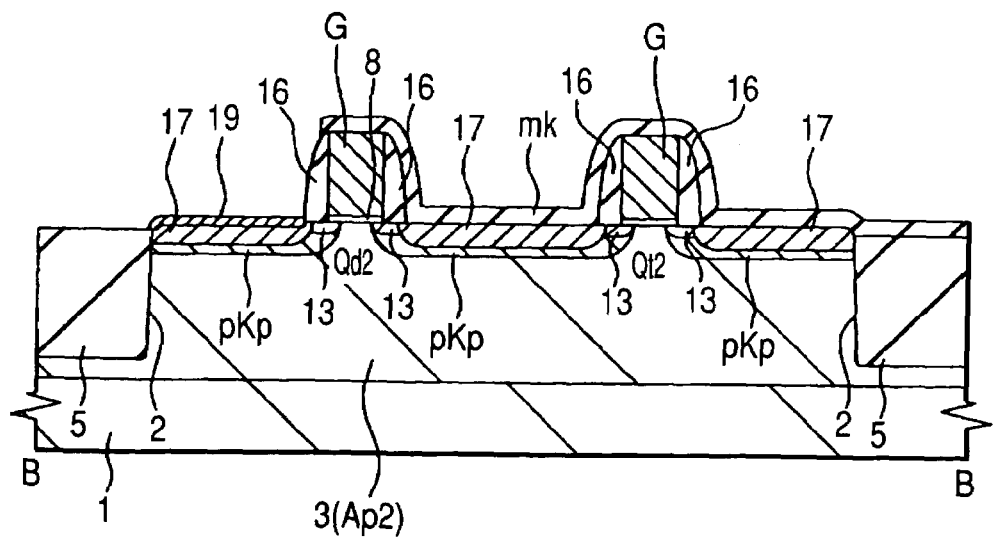
Figure 76:
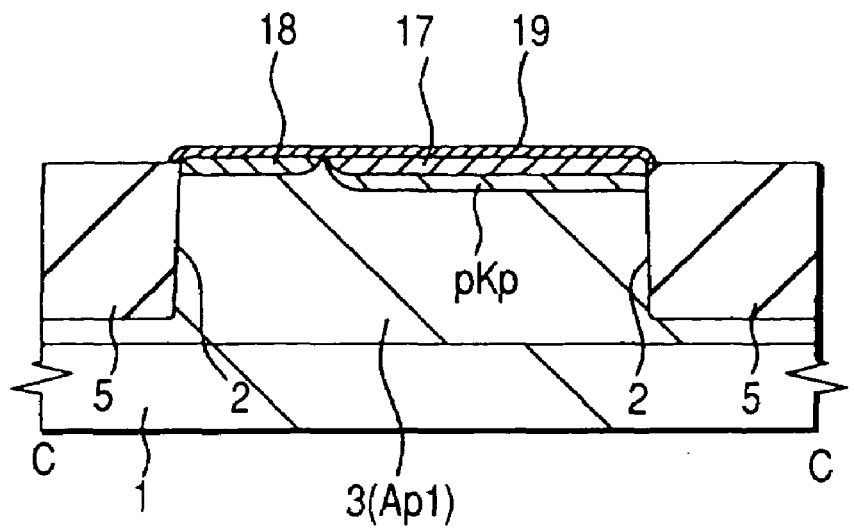
Figure 77:
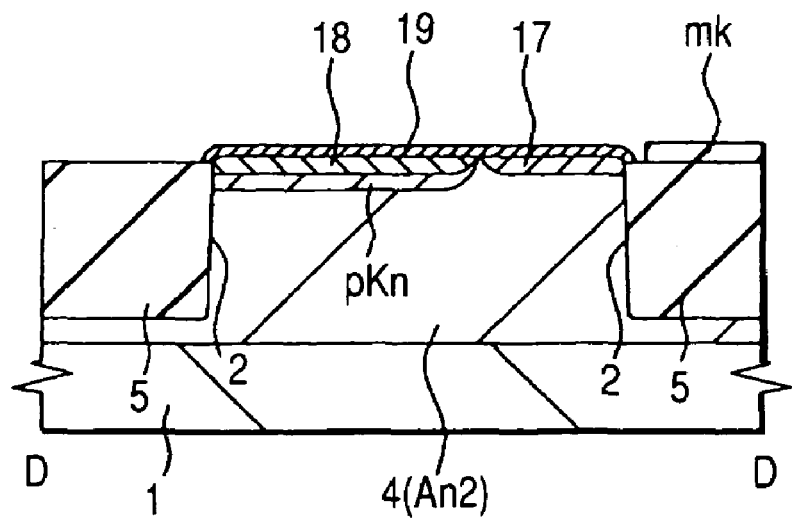

Next, a silicon oxide film is deposited on the substrate 1 by the CVD process, and it is treated for dry etching with a mask of photoresist film (not shown), thereby to form a mask film mk of silicon oxide, as shown in FIG. 69 through FIG. 73. FIG. 73 is a plan view of the substrate 1, showing the area where one memory cell is formed, and FIG. 69, FIG. 70, FIG. 71 and FIG. 72 show the cross sections taken along the lines A—A, B—B, C—C and D—D, respectively, of FIG. 73.

The mask film mk covers the drain regions of the load MISFETs Qp1 and Qp2 and drive MISFETs Qd1 and Qd2, the other ends (on the side of data line connection) of the transfer MISFETs Qt1 and Qt2, and the gate electrodes, excluding the junction regions mentioned previously. Using the through film of ion implantation for the mask film mk can simplify the process also in this embodiment.

Next, a metallic film, e.g., a Co film, is deposited on the substrate 1 by a sputtering process. The substrate 1 is treated for annealing at 600° C. for 1 minute, thereby to form a CoSi layer 19 to cover the contact sections between the exposed portions of substrate 1 ($n^+$-type semiconductor regions 17 and $p^+$-type semiconductor regions 18) and the Co film and between the gate electrodes G and the Co film.

The silicide layer 19 is absent on the load MISFETs Qp1 and Qp2 and drive MISFETs Qd1 and Qd2 due to the presence of the mask film mk on these regions, as described above. The silicide layer 19 is also absent on the other ends (on the side of data line connection) of the transfer MISFETs Qt1 and Qt2 and the gate electrodes, excluding the junction regions, due to the presence of the mask film.

The silicide layer 19 covers the source regions of the load MISFETs Qp1 and Qp2 and drive MISFETs Qd1 and Qd2 and the semiconductor regions 17 and 18 for feeding the voltages to the wells, as in the case of the second embodiment, and it also covers the junction regions of the gate electrodes.

Accordingly, even if the pn-junction creates a depletion layer, as mentioned previously, the voltage is conducted to the gate electrodes through the silicide film. In case a dual gate structure is not adopted, the silicide layer 19 can be absent on the entire region of the gate electrodes.

Figure 78:
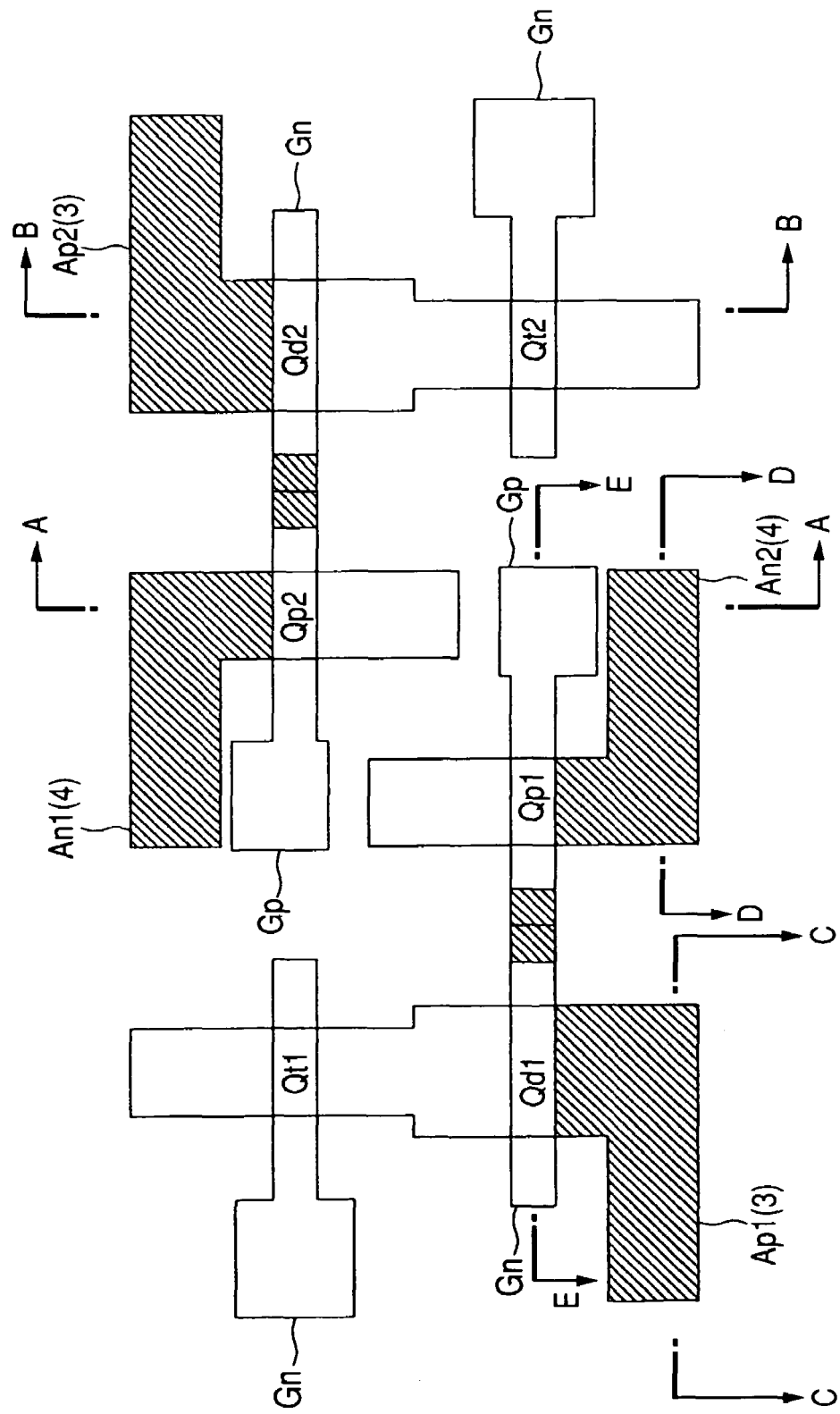
FIG. 78 is a plan view of the principal portions of the substrate, showing the configuration of the SRAM memory cell of the third embodiment, at a step in the fabrication thereof.

Next, the remaining Co film is etched off, and the substrate 1 is treated for annealing at 700–800° C. for about 1 minute so that the silicide layer 19 is made to have a reduced resistivity. The silicide layer 19 is formed as shown in FIG. 74 through FIG. 79. FIG. 78 is a plan view of the substrate 1, showing the area where one memory cell is formed, and FIG. 74, FIG. 75 FIG. 76 and FIG. 77 show the cross sections taken along the lines A—A, B—B, C—C and D—D, respectively, of FIG. 78. The areas where the silicide layer 19 is formed are shown by hatching in FIG. 78 (mask film mk is not shown).

In this embodiment, the silicide layer 19 is absent on the gate electrodes, except for the junction regions, and patterning of the mask film mk can be simplified, in addition to the effect of leak current reduction achieved by the first and second embodiments.

Figure 55:
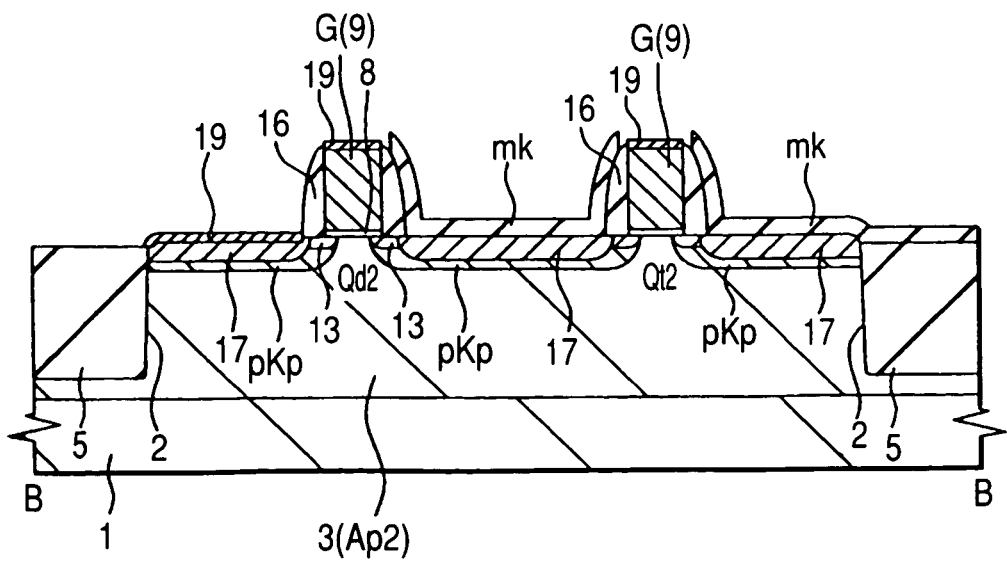
Figure 80:
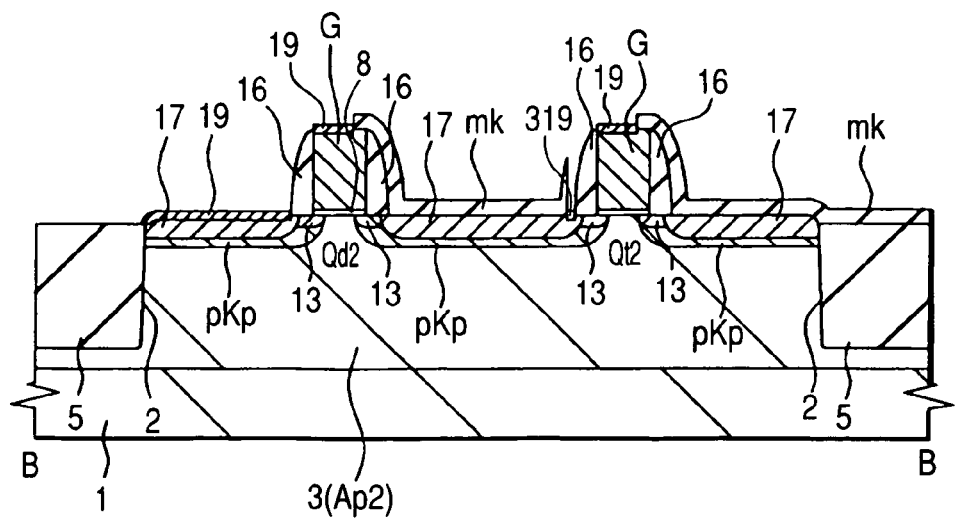
FIG. 80 is a cross-section diagram which illustrates the effectiveness achieved by the third embodiment.
Figure 81:
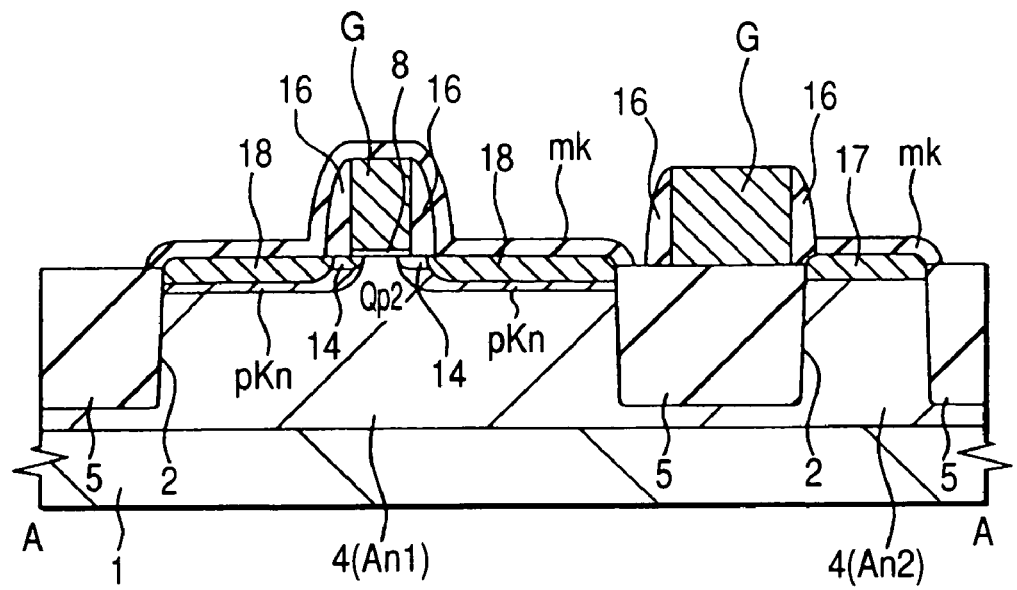
FIG. 81 through FIG. 84 are cross-sectional diagrams showing the principal portions of the substrate of an SRAM memory cell based on a fourth embodiment of this invention, as seen along lines A—A, B—B, C—C and D—D, respectively, in FIG. 85, during a step in the fabrication thereof.
Figure 82:
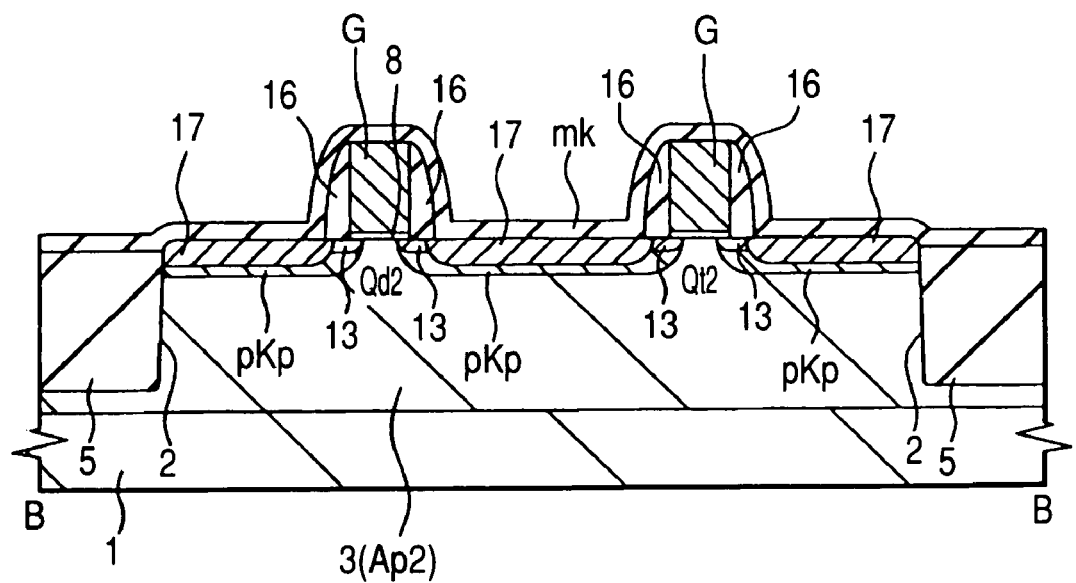
Figure 83:
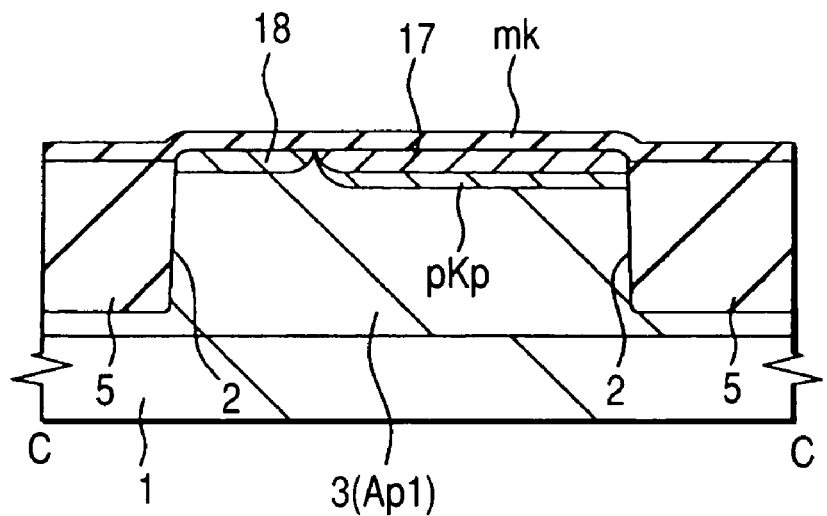
Figure 84:
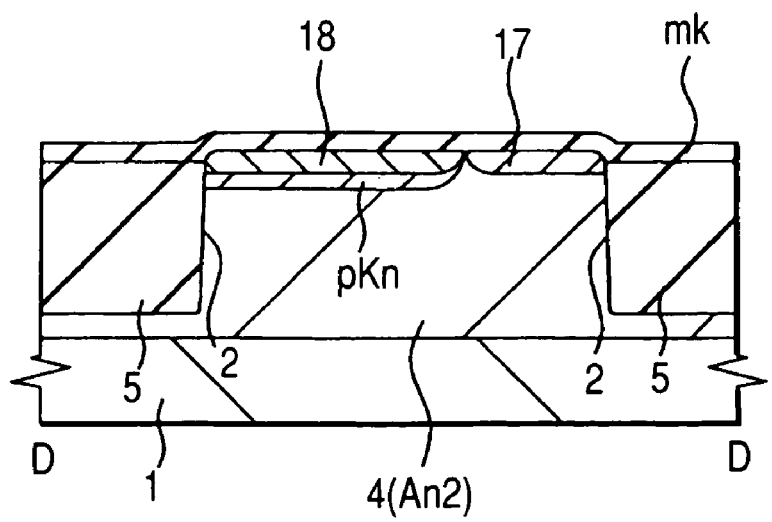

Otherwise, in the case of the second embodiment, for example, the mask film mk must be shaped in accordance with a fine gate electrode pattern, and the misalignment of mask film mk will create an unwanted silicide layer 319 in the source-drain regions (17) at both ends of the gate electrode G, as shown in FIG. 80 (corresponding to the B—B cross section of FIG. 55). This silicide layer can possibly penetrate into the shallow n⁻-type semiconductor region 13; and, if it is formed on drains (at both ends of drains in the case of transfer MISFETs) having a voltage difference relative to the substrate (well), an increased leakage current will result.

In this embodiment, however, the silicide layer 19 is absent on the gate electrodes G except for the junction regions for current conduction, which facilitates the patterning of mask film mk and fosters a reduction the leakage current. The junction regions are located above the isolation 2, and the above-mentioned problem does not arise.

The semiconductor integrated circuit device of this embodiment does not have the silicide layer 19 formed on the gate electrodes, except for the junction regions, and so it is suitable for application in fields where the demand for reduced power consumption is more intense than the speed-up of operation.

The remaining process is identical to that covered in the explanation provided in conjunction with FIG. 27 through FIG. 46 of the first embodiment, and so a repeated explanation thereof will be omitted.

Fourth Embodiment

An SRAM memory cell based on a fourth embodiment of this invention will be explained in connection with its process of fabrication with reference to FIG. 81 through FIG. 92. The processing steps, except for those which involve the formation of mask film mk and silicide layer 19, are identical to the first embodiment described in conjunction with FIG. 2 through FIG. 16 and FIG. 27 through FIG. 46, and so a repeated explanation thereof will be omitted.

Figure 85:
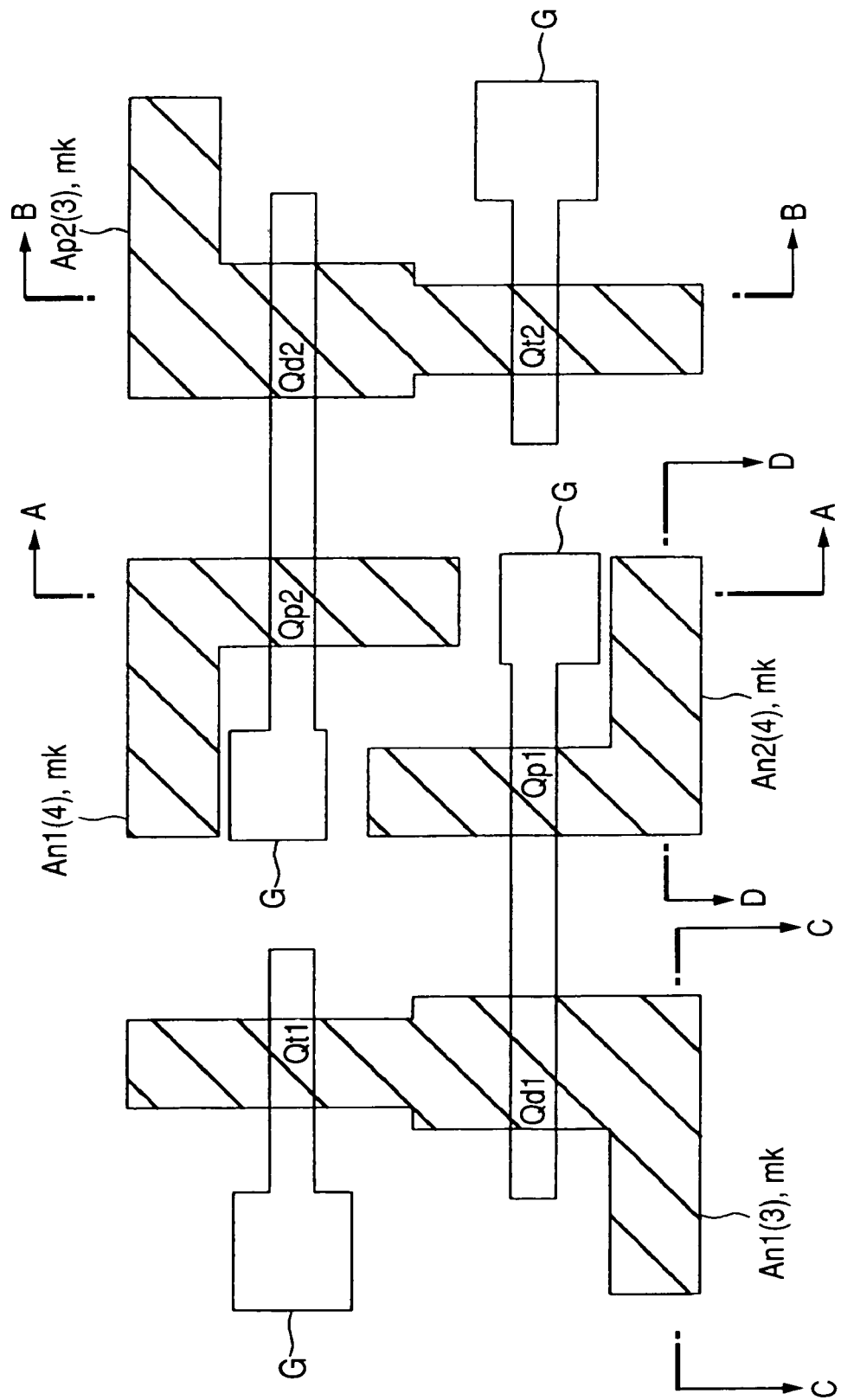
FIG. 85 is a plan view of the principal portions of the substrate, showing the configuration of the SRAM memory cell of the fourth embodiment, at a step in the fabrication thereof.
Figure 86:
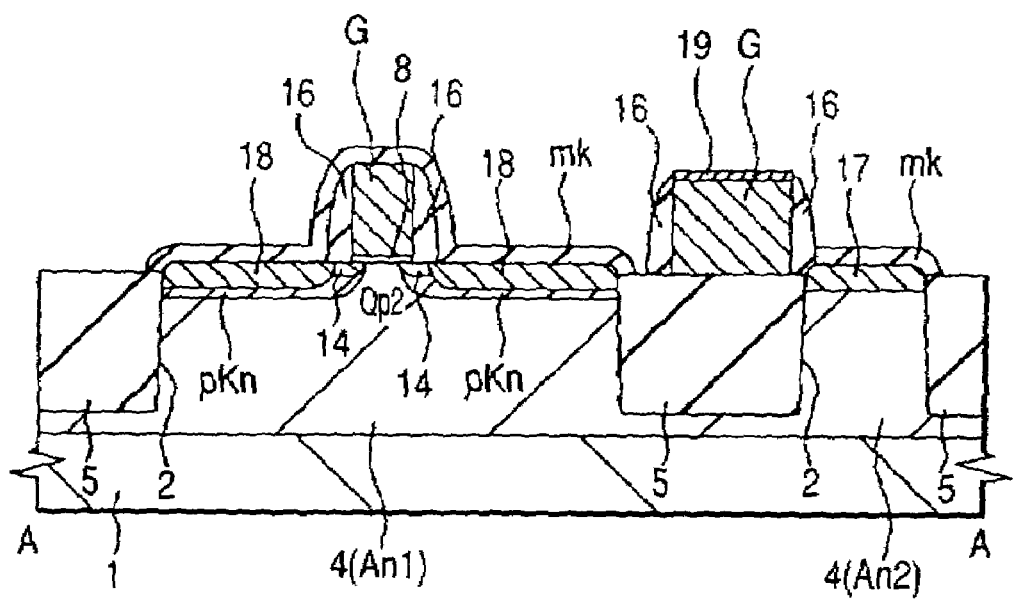
FIG. 86 through FIG. 89 are cross-sectional diagrams showing the principal portions of the substrate of the SRAM memory cell of the fourth embodiment, as seen along lines A—A, B—B, C—C and D—D, respectively, in FIG. 90, during a step in the fabrication thereof.
Figure 87:
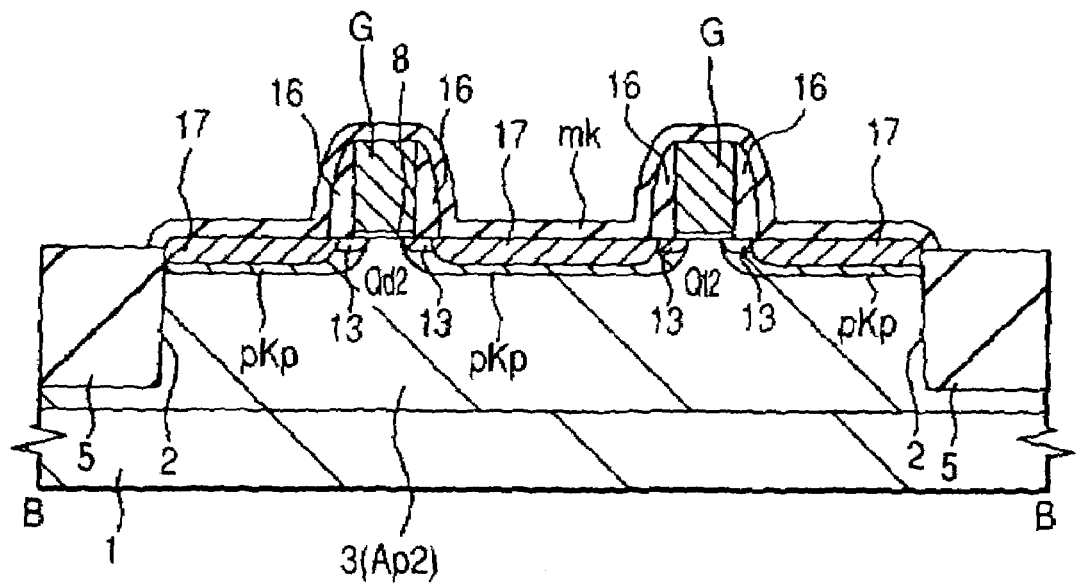
Figure 88:
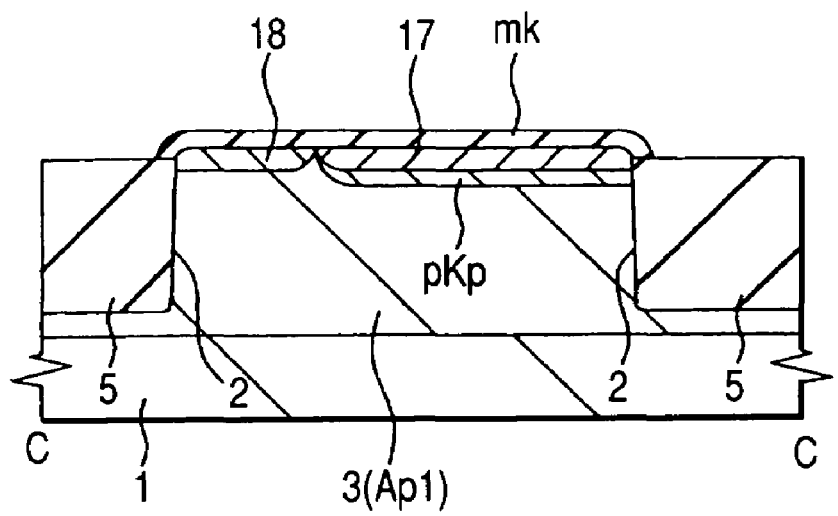
Figure 89:
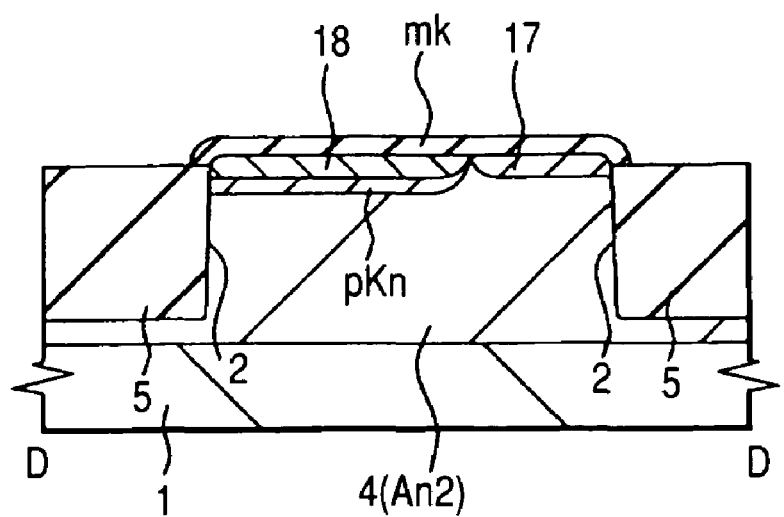

First, a semiconductor substrate 1 is prepared in a manner identical to that described in conjunction with FIG. 12 through FIG. 16 for the first embodiment, and a silicon oxide film is deposited on it by a CVD process. The silicon oxide film is treated for dry etching with a mask of photoresist (not shown), thereby to form a mask film mk of silicon oxide, as shown in FIG. 81 through FIG. 85. FIG. 85 is a plan view of the substrate 1, showing an area where one memory cell is formed, and FIG. 81, FIG. 82, FIG. 83 and FIG. 84 show the cross sections taken along the lines A—A, B—B, C—C and D—D, respectively, of FIG. 85.

The mask film mk is formed on the substrate 1, except for the gate electrodes G on the isolation 2, e.g., it is formed on the active regions (An1, An2, Ap1, Ap2), so that it covers the source-drain regions of the load MISFETs Qp1 and Qp2, drive MISFETs Qd1 and Qd2, and transfer MISFETs Qt1 and Qt2, as shown in FIG. 85. Using the through film of ion implantation for the mask film mk can simplify the process also in this embodiment.

Next, a metallic film, e.g., a Co film, is deposited on the substrate 1 by the sputtering process. The substrate 1 is treated for annealing at 600° C. for 1 minute, thereby to form a silicide layer 19 to cover the contact sections between the exposed portions of the substrate 1 (n⁺-type semiconductor regions 17 and p⁺-type semiconductor regions 18) and the Co film and between the gate electrodes G and the Co film.

The silicide layer 19 is absent on the regions except for the gate electrodes G on the isolation 2 due to the presence of the mask film mk on these regions, as described above.

Figure 90:
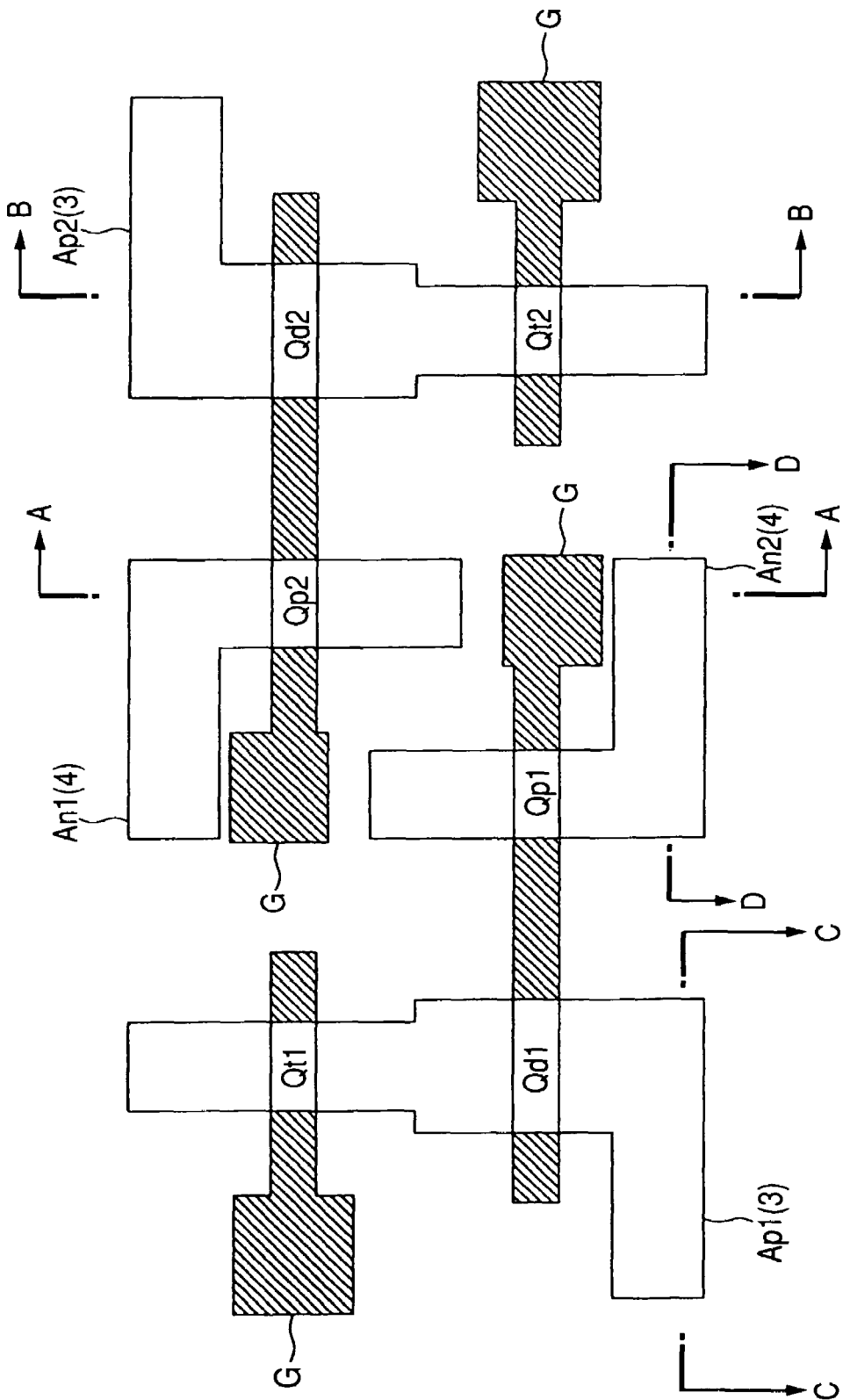
FIG. 90 is a plan view of the principal portions of the substrate, showing the configuration of the SRAM memory cell of the fourth embodiment, at a step in the fabrication thereof.

Next, the remaining Co film is etched off, and the substrate 1 is treated for annealing at 700–800° C. for about 1 minute, so that the silicide layer 19 is made to have a reduced resistivity. The silicide layer 19 is formed as shown in FIG. 86 through FIG. 90. FIG. 90 is a plan view of the substrate 1, showing the area where one memory cell is formed, and FIG. 86, FIG. 87 FIG. 88 and FIG. 89 show the cross sections taken along the lines A—A, B—B, C—C and D—D, respectively of FIG. 90. The areas where the silicide layer 19 is formed are shown by hatching in FIG. 90 (mask film mk is not shown).

Figure 91:
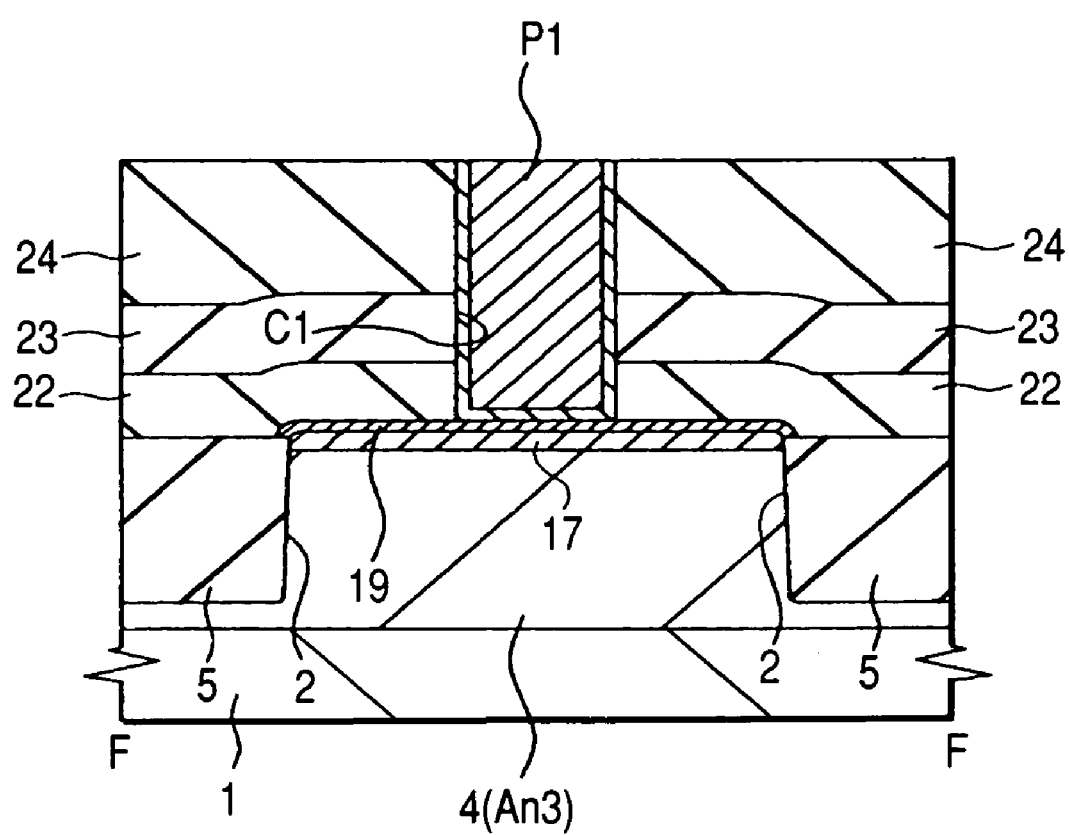
FIG. 91 is a cross-sectional diagram of the principal portion showing the substrate of the SRAM memory cell of the fourth embodiment, as seen along line F—F in FIG. 92, during a step in the fabrication thereof.
Figure 92:
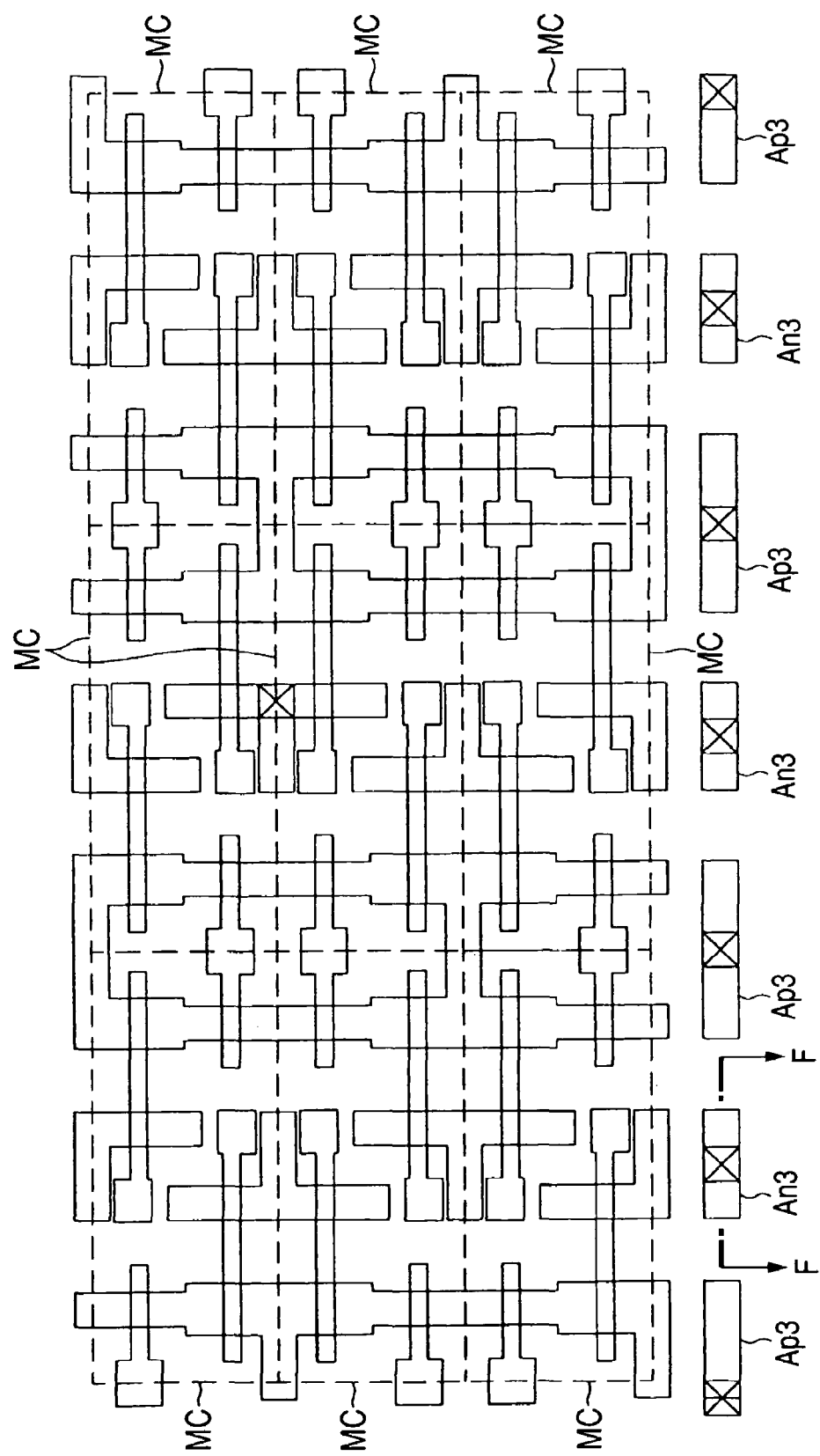
FIG. 92 is a plan view of the principal portions of the substrate, showing the configuration of the SRAM memory cell of the fourth embodiment, at a step in the fabrication thereof.

In this embodiment, the silicide layer 19 is absent on the source regions of the load MISFETs Qp1 and Qp2 and drive MISFETs Qd1 and Qd2 and on one end of the transfer MISFETs Qt1 and Qt2, and the power supply voltages cannot be fed to the wells (active regions An1, An2, Ap1, Ap2) by use of the silicide layer 19. Therefore, it is necessary to provide well-feed regions An3 and Ap3 for each unit block of memory cells (e.g. 32 bits), as shown in FIG. 91 and FIG. 92. FIG. 91 shows the cross section taken along the line F—F of FIG. 92.

The n-type wells and p-type wells (e.g., Ap1) are each connected beneath the isolation 2. Memory cells, each having a unit area defined by dashed lines, are laid out in line-symmetric arrangement, as shown in FIG. 92. The well-feed regions An3 and Ap3 are disposed in a peripheral section of the memory cell array. The n-type well 4 (An3) is supplied with the power supply voltage Vcc through the plug P1, as shown in FIG. 91. The well-feed region An3 is connected beneath the isolation 2 to the active regions An1 and An2 within the memory cell, as mentioned previously. The p-type well 3 (Ap3) is supplied with the ground voltage Vss, although this is not shown in the figure.

The remaining process is identical to the explanation in conjunction with FIG. 27 through FIG. 46 of the first embodiment, and so a repeated explanation thereof will be omitted.

In this embodiment, the silicide layer 19 is absent on the source-drain regions of the six MISFETs, and the leakage current of these regions can be reduced.

Based on the absence of the silicide layer 19 on the gate electrodes G above the active region, the problem caused by the misalignment of mask film mk described in the third embodiment can be prevented, and the leakage current can be reduced as a result.

Based on the formation of the silicide layer 19 on the gate electrodes G above the isolation 2, the operation can be sped up as compared with the third embodiment.

In the foregoing embodiments, although the silicon oxide film is formed on the mask film mk immediately, the silicon oxide film may be deposited after removing the mask film mk following the formation of the silicide layer. It is sufficient to form the mask film mk at least on the regions to be covered above the active regions and gate electrodes, and the mask film mk may be formed to reach the top of the isolation 2 where the silicide layer 19 is absent. The mask film mk can be shaped variably for the expedience of patterning.

Fifth Embodiment

A semiconductor integrated circuit device based on a fifth embodiment of this invention will be explained in connection with its process of fabrication with reference to FIG. 93 through FIG. 104. This semiconductor integrated circuit device has a memory cell forming area where an SRAM memory cell is formed and a peripheral circuit forming area where an n-channel MISFET Qn and a p-channel MISFET Qp of a logic circuit are formed.

Figure 93:
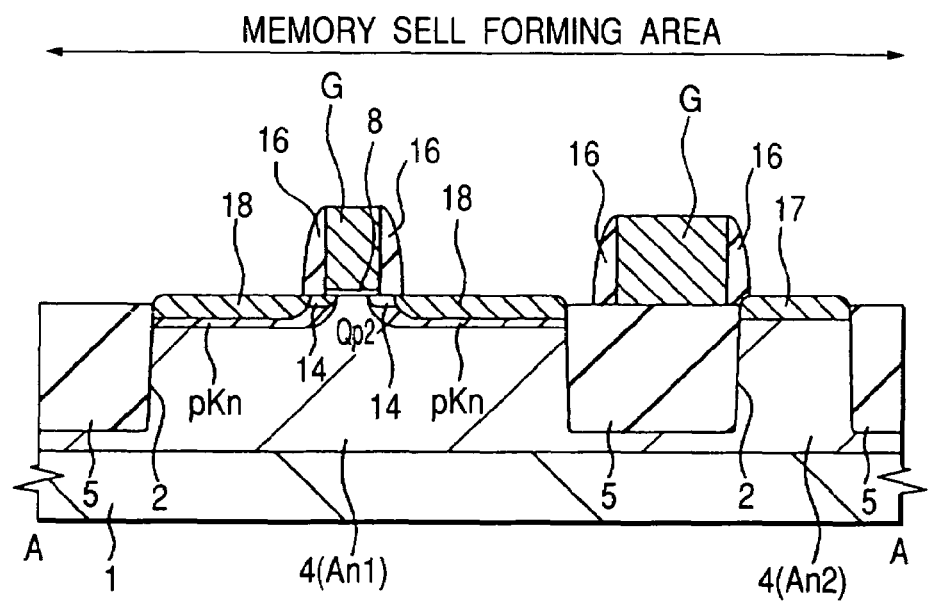
FIG. 93 and FIG. 94 are cross-sectional diagrams of the principal portions showing the substrate of a semiconductor integrated circuit device based on a fifth embodiment of this invention, as seen along lines A—A and B—B, respectively, in FIG. 95, during a step in the fabrication thereof.
Figure 94:
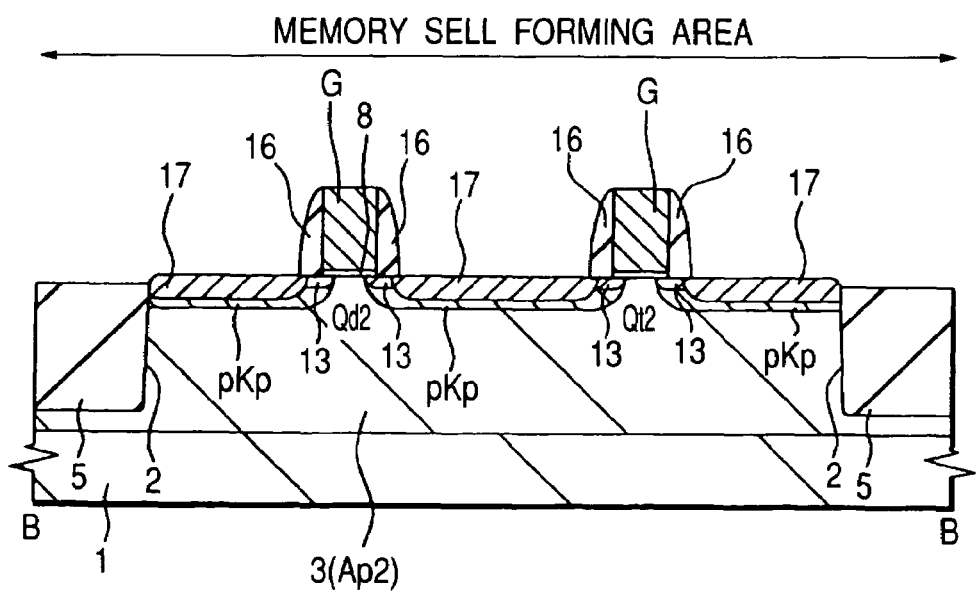
Figure 95:
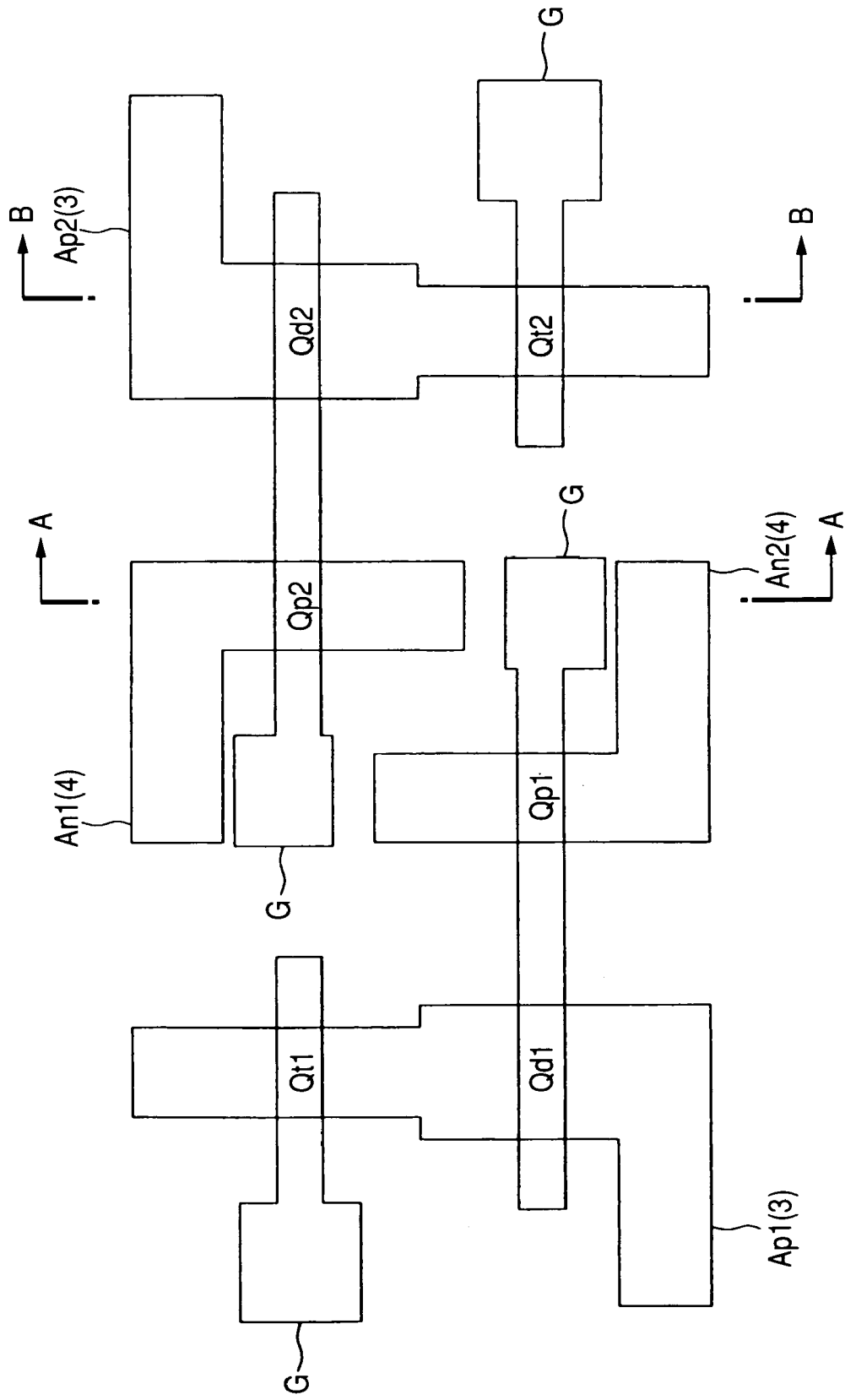
FIG. 95 is a plan view of the principal portions of the substrate, showing the configuration of the semiconductor integrated circuit device of the fifth embodiment, at a step in the fabrication thereof.

In the memory cell forming area, six MISFETs of one SRAM memory cell are formed as shown in FIG. 93 through FIG. 95. FIG. 95 is a plan view of a substrate, showing an area where one memory cell is formed, and FIG. 93 and FIG.

94 show the cross sections taken along the lines A—A and B—B, respectively, of FIG. 95. The processing steps of forming the gate electrodes G and source-drain regions (17,18) are identical to the explanation in conjunction with FIG. 2 through FIG. 16 for the first embodiment, and so a repeated explanation thereof will be omitted.

Figure 96:
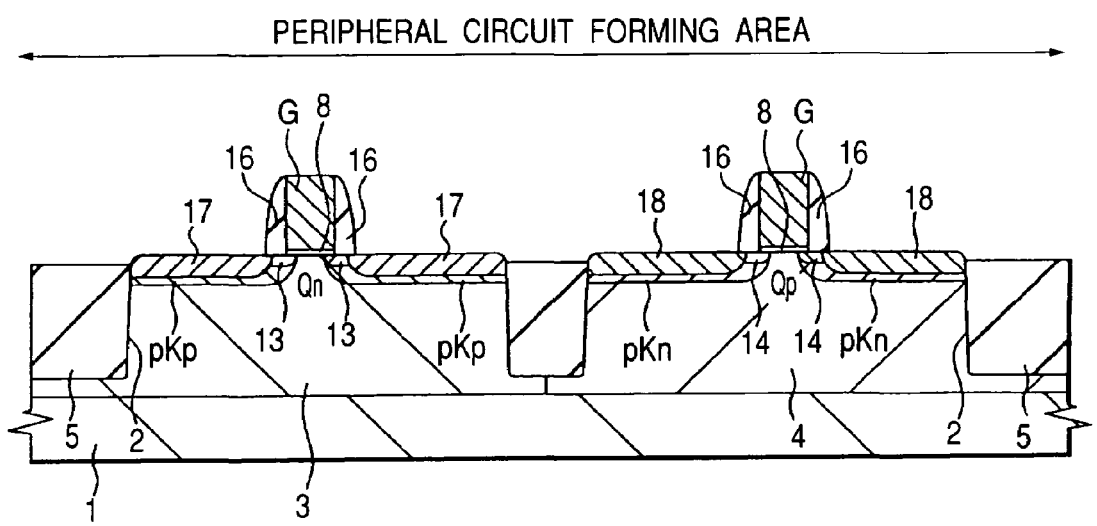
FIG. 96 through FIG. 98 are cross-sectional diagrams showing the principal portions of the substrate of the semiconductor integrated circuit device of the fifth embodiment, as seen along lines A—A, B—B, C—C and D—D, respectively, in FIG. 99, respectively, during a step in the fabrication thereof.

In the peripheral circuit forming area, an n-channel MISFET Qn and p-channel MISFET Qp for a logic circuit are formed as shown in FIG. 96. The processing steps employed in forming the gate electrodes G and source-drain regions are identical to the processing steps used for producing the six MISFETs of the SRAM memory cell, and so a repeated explanation thereof will be omitted.

Figure 97:
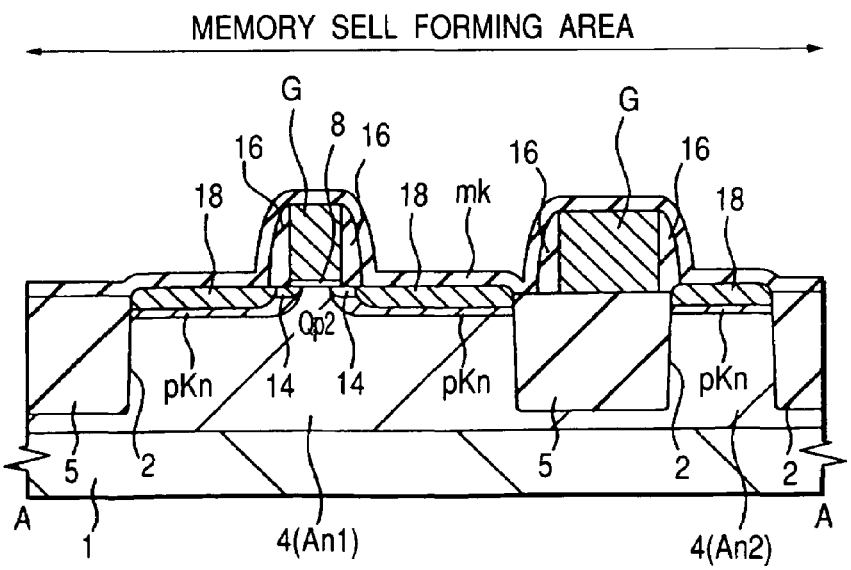
Figure 98:
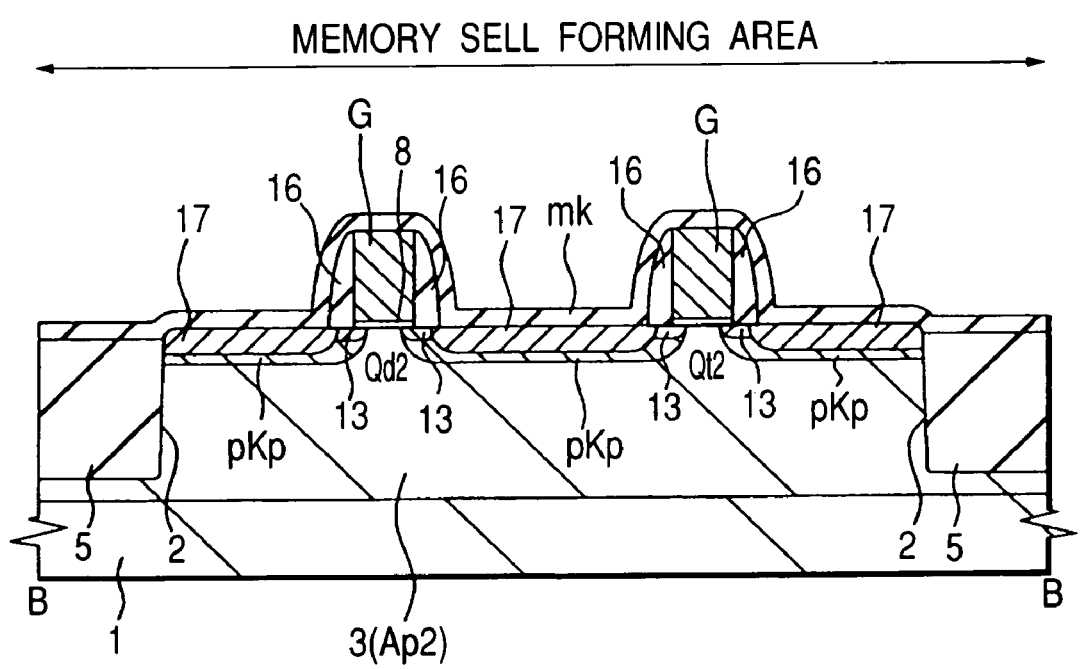
Figure 99:
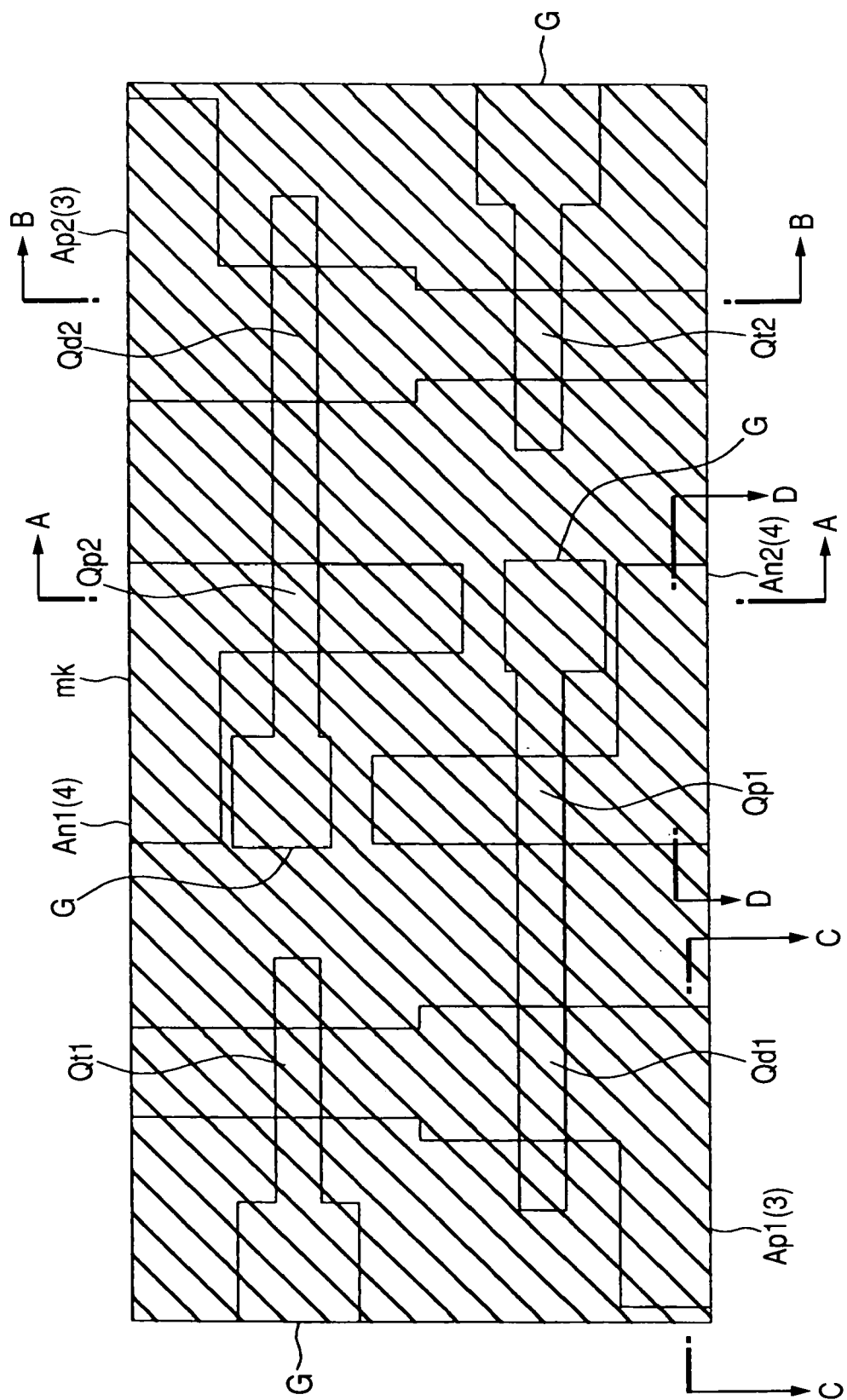
FIG. 99 is a plan view of the principal portions of the substrate, showing the configuration of the semiconductor integrated circuit device of the fifth embodiment, at a step in the fabrication thereof.
Figure 100:
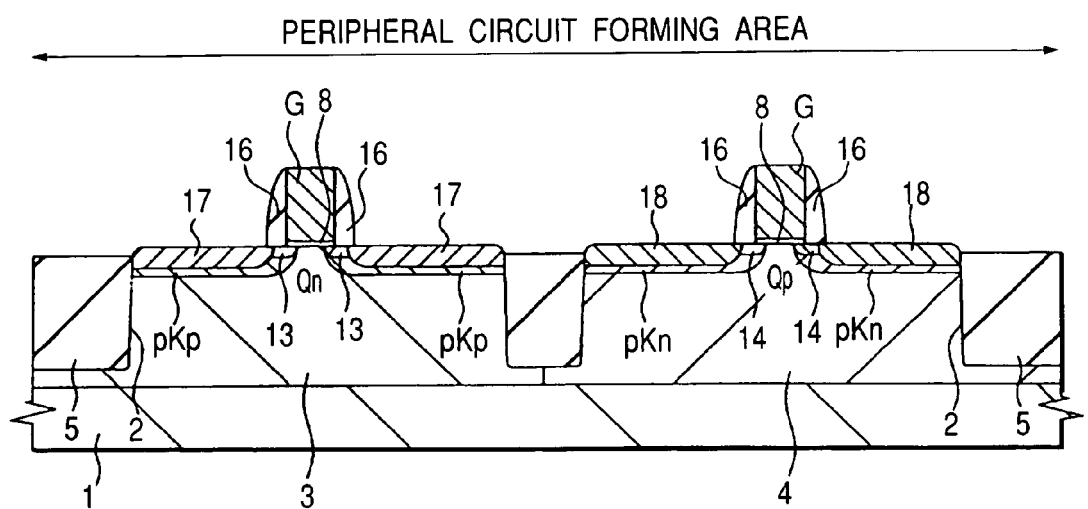
FIG. 100 through FIG. 102 are cross-sectional diagrams showing the principal portions of the substrate of the semiconductor integrated circuit device of the fifth embodiment, as seen along lines A—A, B—B, C—C and D—D, respectively, in FIG. 103, respectively, during a step in the fabrication thereof.

A silicon oxide film is deposited on the substrate 1 by a CVD process, as shown in FIG. 93 through FIG. 96. Next, the silicon oxide film of the logic circuit area is treated for dry etching with a photoresist film (not shown), so that a mask film mk of silicon oxide is left to cover the memory cell forming area. FIG. 99 is a plan view of the substrate 1, showing the memory cell forming area where one memory cell is formed, and FIG. 97 and FIG. 98 show the cross sections taken along the lines A—A and B—B, respectively, of FIG. 99. FIG. 100 shows the cross section of the n-channel MISFET Qn and p-channel MISFET Qp of the logic circuit (same as FIG. 96 and FIG. 104).

Using the through film of ion implantation for the mask film mk can simplify the process also in this embodiment.

Next, a metallic film, e.g., a Co film, is deposited on the substrate 1 by a sputtering process. The substrate 1 is treated for annealing at 600° C. for 1 minute, thereby to form a silicide layer 19 to cover the contact sections between the exposed portions of substrate 1 ($n^+$-type semiconductor regions 17 and $p^+$-type semiconductor regions 18) and the Co film and between the gate electrodes G and the Co film.

The silicide layer 19 is absent on the memory cell forming area due to the presence of the mask film mk on this region, whereas the silicide layer 19 is formed to cover the peripheral circuit area where the mask film mk is absent, as mentioned previously.

Figure 101:
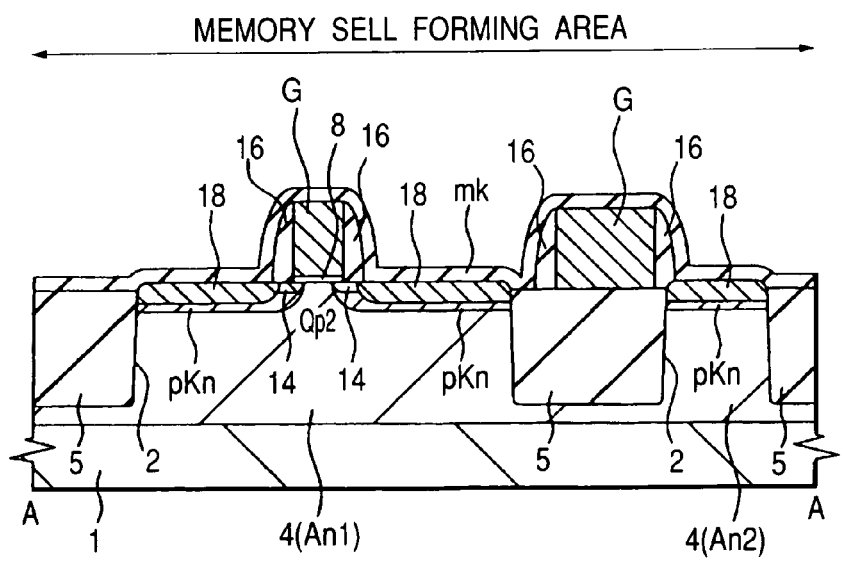
Figure 102:
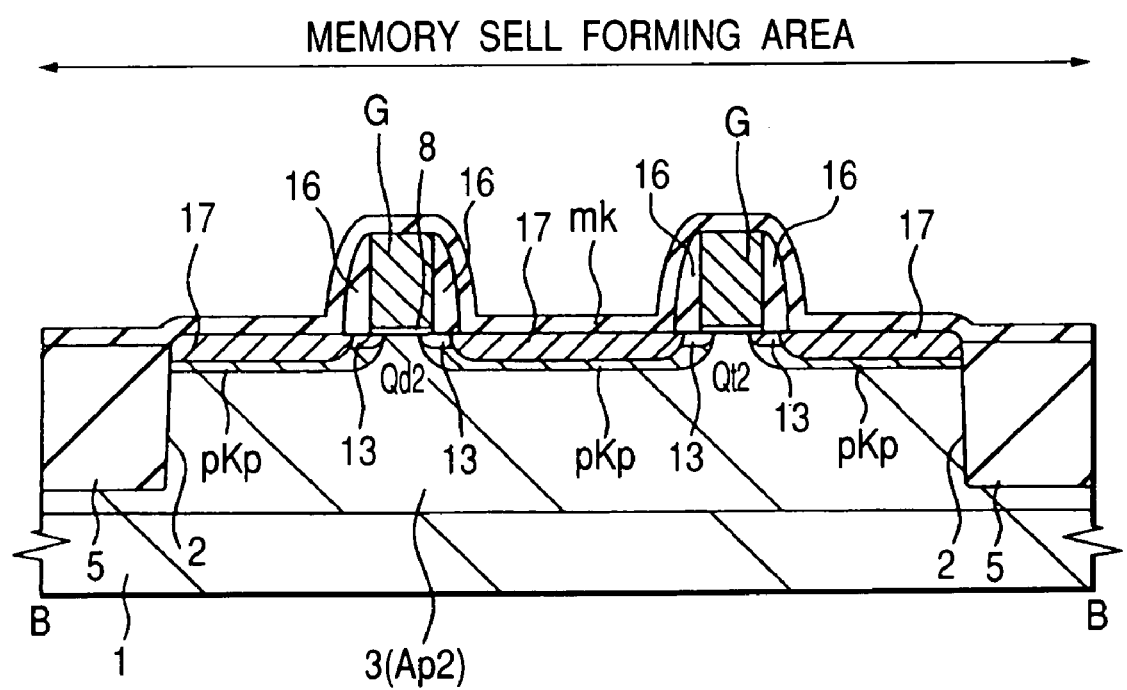
Figure 103:
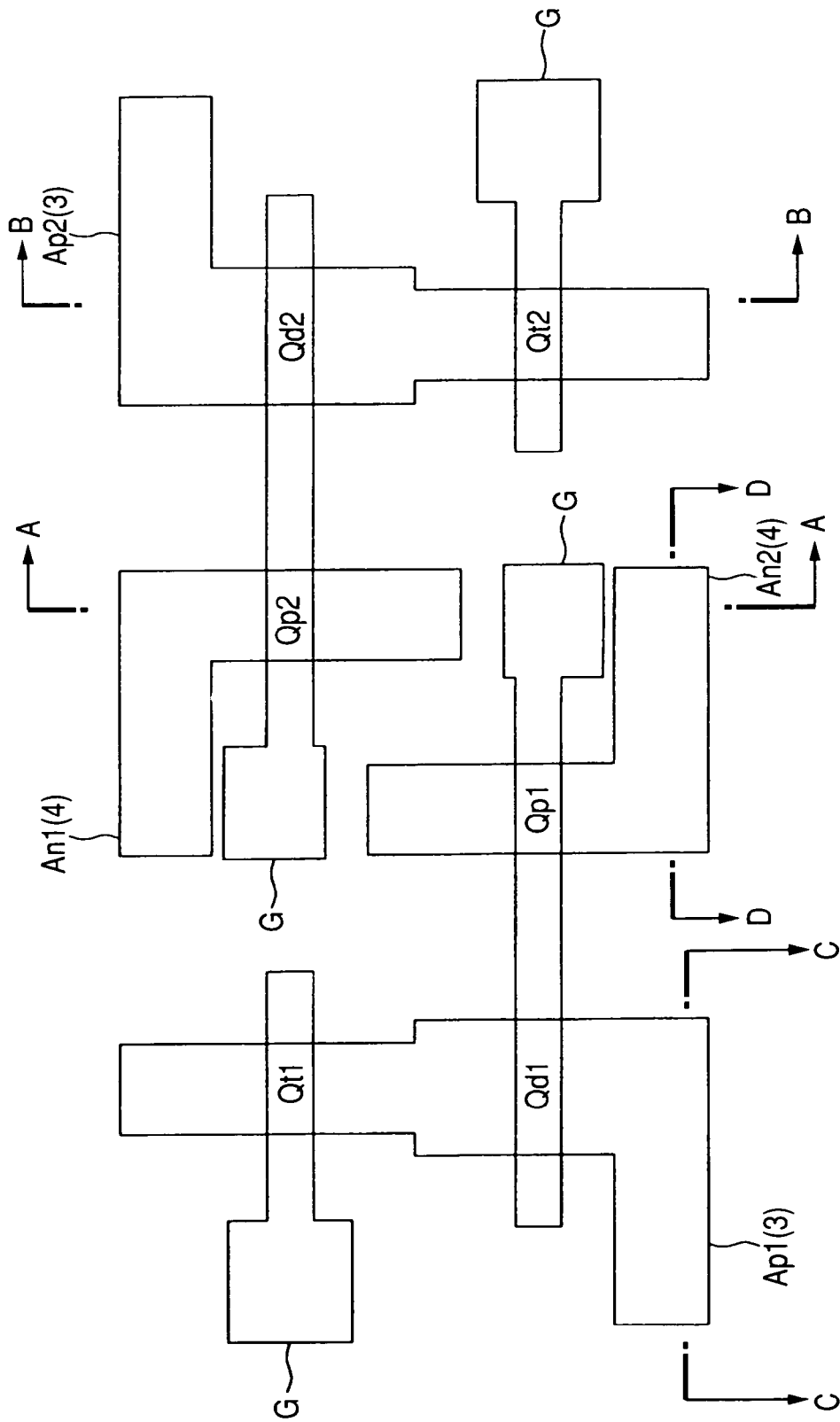
FIG. 103 is a plan view of the principal portions of the substrate, showing the configuration of the semiconductor integrated circuit device of the fifth embodiment, at a step in the fabrication thereof.
Figure 104:
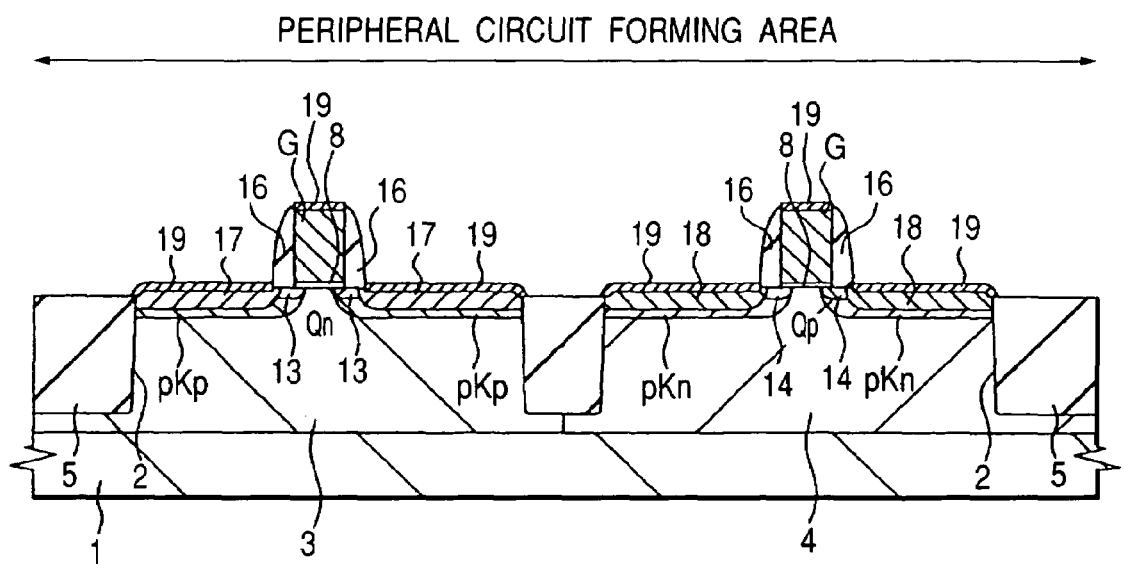
FIG. 104 is a cross-sectional diagram showing the principal portion of the substrate of the semiconductor integrated circuit device of the fifth embodiment in the peripheral circuit forming area.

Next, the remaining Co film is etched off, and the substrate 1 is treated for annealing at 700–800° C. for about 1 minute so that the silicide layer 19 is made to have a reduced resistivity. The silicide layer 19 is formed as shown in FIG. 101 through FIG. 104. FIG. 103 is a plan view of the substrate 1, showing the memory cell forming area where one memory cell is formed, and FIG. 101 and FIG. 102 show the cross sections taken along the lines A—A and B—B, respectively, of FIG. 103.

In this embodiment, the silicide layer 19 is absent in the memory cell forming area, enabling the reduction of a leakage current which is prone to arise particularly in the microstructured memory cell area.

In this embodiment, the silicide layer 19 is present in the peripheral circuit area, enabling reduction of the gate resistance and source-drain connection resistance of the n-channel MISFET Qn and p-channel MISFET Qp of the logic circuit and, thus, enabling the speed-up of operation. Due to the absence of the silicide layer 19 in the memory cell forming area, it is necessary to provide well-feed regions, as in the case of the fifth embodiment.

Although in this embodiment, the silicide layer is not formed at all in the memory cell forming area, it is also possible to combine the logic circuit of this embodiment with the SRAM memory cell of the first through fourth embodiments.

In this embodiment, although an SRAM is arranged in the memory cell forming area, a DRAM (Dynamic Random Access Memory) may be arranged in the cell forming area.

In this embodiment, although the silicon oxide film is formed on the mask film mk immediately, the silicon oxide film may be deposited after removing the mask film mk following the formation of the silicide layer.

Sixth Embodiment

Figure 105:
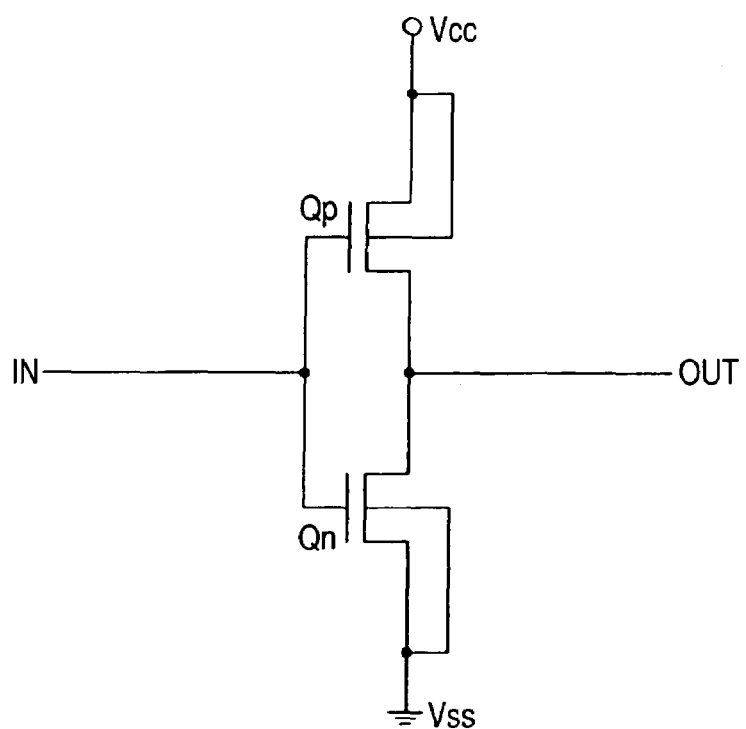
FIG. 105 is a schematic circuit diagram showing the circuit arrangement in a semiconductor integrated circuit device based on a sixth embodiment of this invention.

A semiconductor integrated circuit device based on a sixth embodiment of this invention will be explained with reference to FIG. 105 through FIG. 107. FIG. 105 shows the circuit arrangement of an inverter which is included in the semiconductor integrated circuit device of this embodiment. The inverter is formed of a p-channel MISFET QP and an n-channel MISFET QN connected in series between the power supply voltage Vcc and ground voltage Vss. The inverter has its input terminal IN connected to the gate electrodes of the MISFETs QP and QN, with the connection node of the MISFETs QP and QN being led out to the output terminal OUT. The p-channel MISFET QP has its back gate supplied with the power supply voltage Vcc, and the n-channel MISFET QN has its back gate supplied with the ground voltage Vss.

When the output terminal OUT is at high level, i.e., when the drain of the n-channel MISFET QN is high, while it is supplied with ground voltage Vss on its back gate, a voltage difference occurs between the drain of the n-channel MISFET QN and the semiconductor substrate (well). When the output terminal OUT is at low level, i.e., when the drain of the p-channel MISFET QP is low, while it is supplied with power supply voltage Vcc on its back gate, a voltage difference occurs between the drain of the p-channel MISFET QP and the substrate (well).

Figure 106:
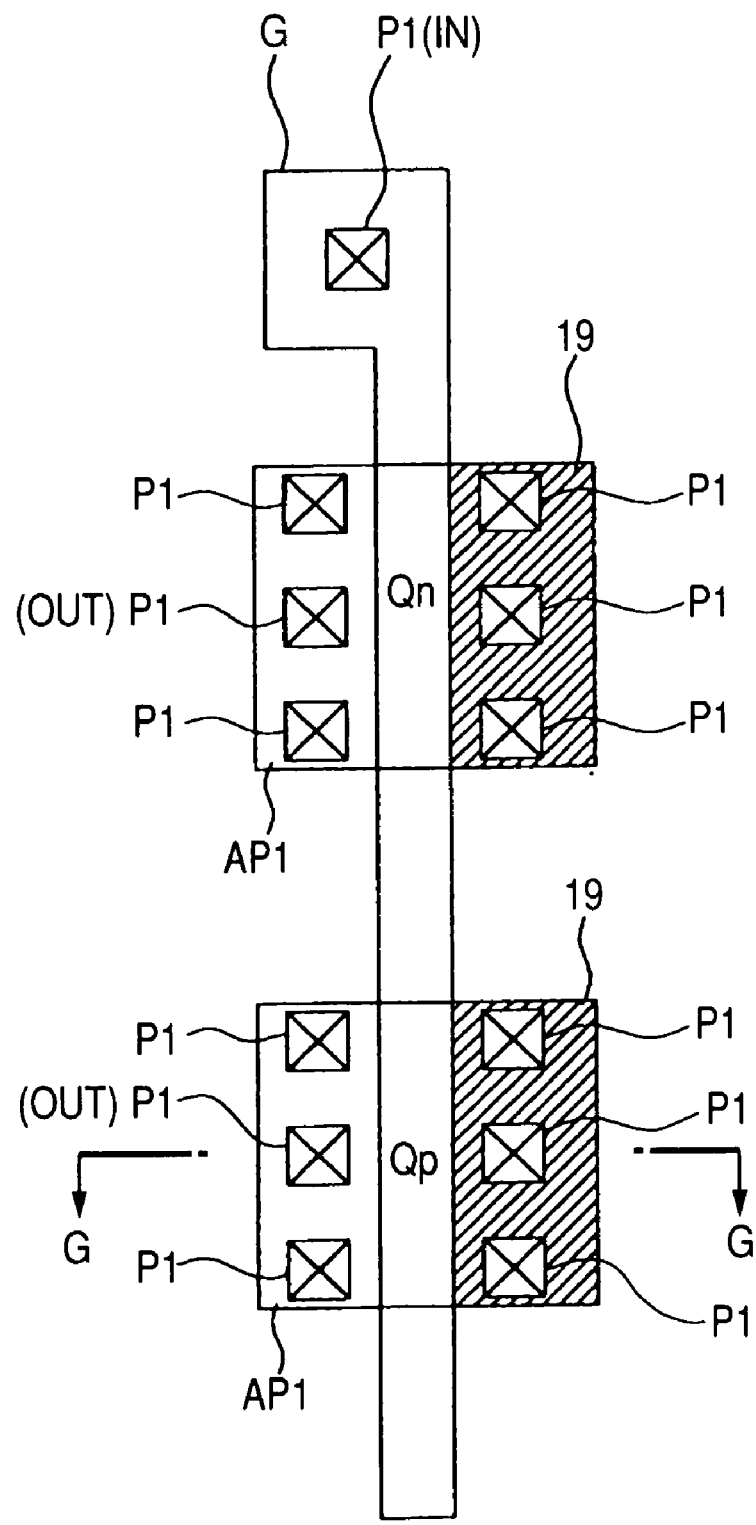
FIG. 106 is a plan view of the principal portion of the substrate of the semiconductor integrated circuit device of the sixth embodiment.
Figure 107:
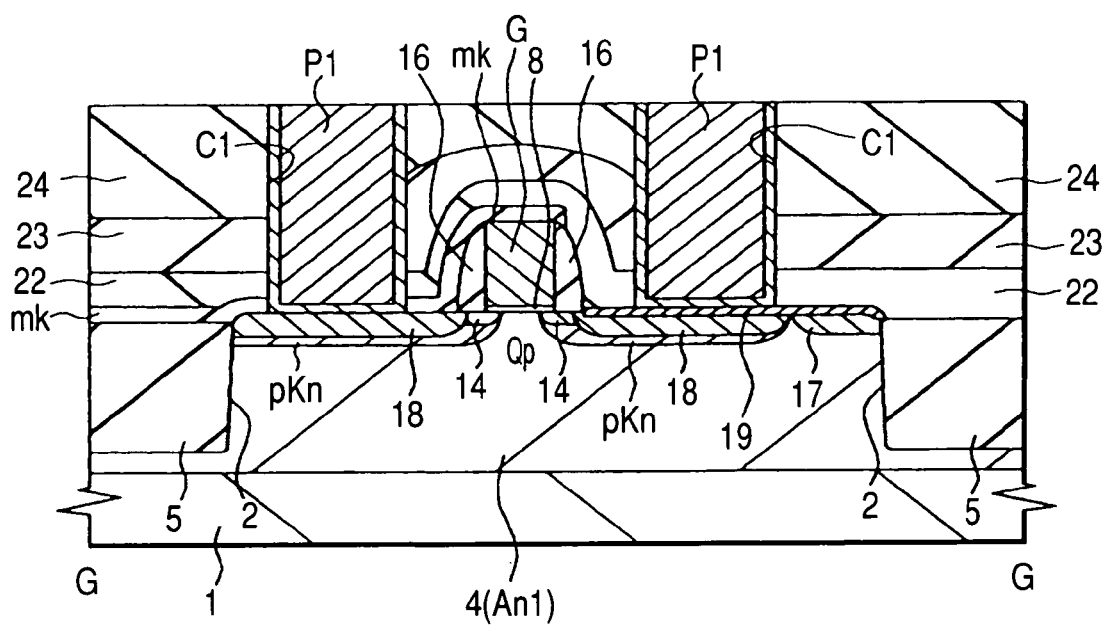
FIG. 107 is a cross-sectional diagram showing the principal portion of the substrate of the semiconductor integrated circuit device of the sixth embodiment, as seen along line G—G in FIG. 106.

In this embodiment, as shown in FIG. 106 and FIG. 107, the silicide layer 19 is absent on the drain regions (regions on the left-hand side of gate electrode G in FIG. 106) of the p-channel MISFET QP and n-channel MISFET QN, and, consequently, the leakage current can be reduced. Specifically, based on the absence of the silicide layer on the region where a leakage current is prone to arise due to the presence of a voltage difference between the drain and the substrate (well), the leakage current can be reduced. FIG. 107 shows the cross section taken along the line G—G of FIG. 106.

Based on the formation of the silicide layer 19 on the source regions, the voltages can be fed to the n-type well 4 and p-type well 3 through the silicide layer 19.

The n-channel MISFET QN has the same cross section, except for the opposite conductivity type, as the p-channel MISFET QP shown in FIG. 106, and so the illustration thereof is omitted. The p-channel MISFET QP and n-channel MISFET QN of this embodiment can be formed by the same process as the MISFETs (Qp, Qn) formed in the peripheral circuit forming area of the fifth embodiment, and so a repeated explanation of the process of fabrication thereof will be omitted.

Seventh Embodiment

Figure 108:
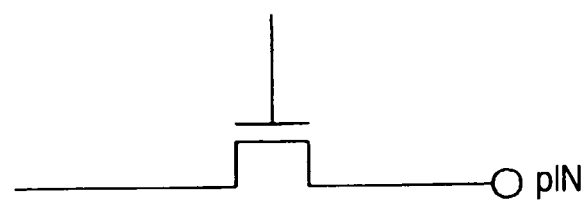
FIG. 108 is a schematic circuit diagram showing the circuit arrangement in a semiconductor integrated circuit device based on a seventh embodiment of this invention.

A semiconductor integrated circuit device based on a seventh embodiment of this invention will be explained with reference to FIG. 108 through FIG. 110. FIG. 108 shows the circuit arrangement of a MISFET included in the semiconductor integrated circuit device of this embodiment. The MISFET has its one end connected to the external input pin PIN, which is connected with an external lead line (not shown).

The MISFET receives an external signal through the external input pin PIN, and, therefore, it is subject to a surge voltage. On this account, as shown in FIG. 109 and FIG. 110, the silicide layer 19 is not formed on the source-drain regions on the side of the external input pin PIN (upper regions above the gate electrode G in FIG. 109) so as to prevent static breakdown of the MISFET FIG. 110 shows the cross section taken along the line H—H in FIG. 109.

Figure 109:
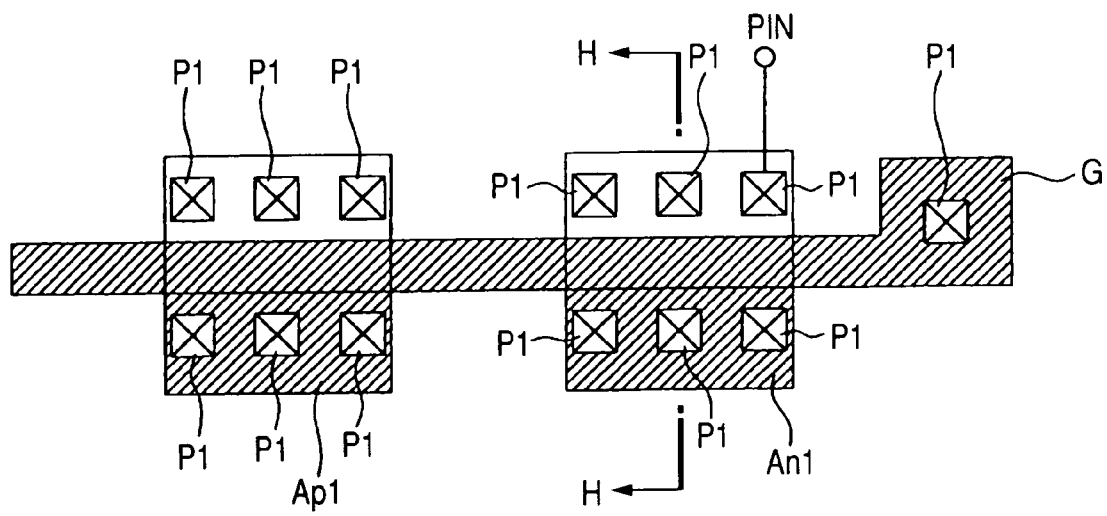
FIG. 109 is a plan view of the principal portion of the substrate of the semiconductor integrated circuit device of the seventh embodiment.
Figure 110:
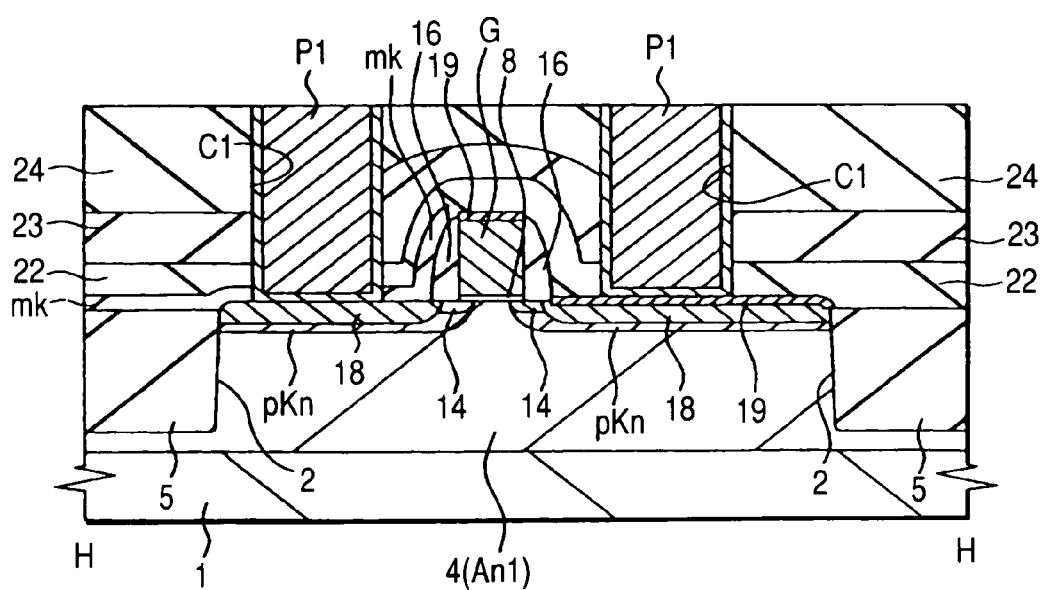
FIG. 110 is a cross-sectional diagram showing the principal portion of the substrate of the semiconductor integrated circuit device of the seventh embodiment, as seen along line H—H in FIG. 109.

While a p-channel MISFET has been described and shown in FIG. 109 and FIG. 110, an n-channel MISFET can have the same structure, except for the opposite conductivity type. The MISFET of this embodiment can be formed by the same process as the MISFETs (Qp, Qn) formed in the peripheral circuit forming area of the fifth embodiment.

Although the present invention has been described in connection with the specific embodiments, the invention is not confined to these embodiments, but various alterations are obviously possible without departing from the essence of the invention.

Among the aspects of the present invention disclosed in this specification, the major effectiveness can be summarized as follows.

(1) A memory cell is formed of a pair of n-channel MISFETs having their gate electrodes and drains connected in a crisscross manner and being formed with and without the formation of a metal silicide layer on the gate electrodes and source regions and on the drain regions, respectively, whereby the leakage current can be reduced.

(2) A memory cell is formed of a pair of inverters having their input and output points connected in a crisscross manner, each inverter being formed of a drive n-channel MISFET and a load p-channel MISFET, and a pair of transfer n-channel MISFETs which are connected to the input points and output points of the inverters and are formed with and without the formation of a metal silicide layer on the gate electrodes and on the source-drain regions, respectively, whereby the leakage current can be reduced.

(3) A memory cell is formed of a pair of inverters having their input and output points connected together, each inverter being formed of an n-channel MISFET and a p-channel MISFET having their gate electrodes connected together and being formed with the formation of a metal silicide layer on the gate electrode connecting region, whereby the operation speed of the memory cell can be improved.

(4) A memory cell is formed of a pair of inverters having their input and output points connected together, each inverter being formed of an n-channel MISFET and a p-channel MISFET, which are formed in a first semiconductor region and second semiconductor region, respectively, isolated by a isolation region, and have gate electrodes extending from the first and second semiconductor regions up to the top of the isolation region, and they are formed with and without the formation of a metal silicide layer on the gate electrode portions above the isolation region and on the gate electrode portions above the first and second semiconductor regions, respectively, whereby the leakage current can be reduced, and the operation speed of memory cell can be improved.

(5) A semiconductor integrated circuit device has a first area (memory cell forming area) for forming a memory cell, which is formed of a pair of n-channel MISFETs having their gate electrodes and drains connected in a crisscross manner, and a second area (peripheral circuit forming area) for forming an n-channel MISFET and p-channel MISFET of a logic circuit, and which is formed with and without the formation of a metal silicide layer on the gate electrodes and source-drain regions of the MISFETs of logic circuit and on the gate electrodes and source-drain regions of the n-channel MISFET pair, respectively, whereby the leakage current can be reduced.

(6) A semiconductor integrated circuit device comprises an inverter which is formed of an n-channel MISFET and a p-channel MISFET, which are formed with and without the formation of a metal silicide layer on the gate electrodes and source regions and on the drain regions, respectively, whereby the leakage current can be reduced.

(7) A semiconductor integrated circuit device comprises a MISFET having its one end connected to an external terminal and being formed with and without the formation of a metal silicide layer on the gate electrode and one source-drain region unconnected to the external terminal, out of the source-drain regions, and on another source-drain region connected to the external terminal, respectively, whereby static breakdown can be prevented.

The invention claimed is:

1. A semiconductor integrated circuit device, comprising memory cells, each formed of a pair of inverters having their input and output points connected in a crisscross manner and which are each formed of an n-channel MISFET and a p-channel MISFET, said n-channel MISFET and p-channel MISFET each including:

a gate electrode, which is made from a silicon film and is formed on a silicon substrate, between which a gate insulation film is interposed;

source and drain regions formed in said silicon substrate on both side regions of said gate electrode;

a metal silicide layer respectively formed on said gate electrode and on said source region, an interlayer insulating film formed over the source and drain regions, the gate electrode and the silicide layers;

a first contact hole formed in said interlayer insulating film, exposing the silicide layer formed on the source region;

a second contact hole formed in said interlayer insulating film, exposing the drain region;

a first conductor film formed in said first contact hole, which is electrically connected to the source region and the silicide layer formed on the source region; and a second conductor film formed in said second contact hole, which is electrically connected to the drain region, wherein said metal silicide layer is absent on said drain region.

2. A semiconductor integrated circuit device according to claim 1, wherein said p-channel MISFET has its source connected to a power voltage point and said n-channel MISFET has its source connected to a ground voltage point.

3. A semiconductor integrated circuit device according to claim 1, wherein an n-channel MISFET for driving and a p-channel MISFET for loading are formed in a first semiconductor region and a second semiconductor region, which are isolated by an isolation region, respectively, said first semiconductor region is supplied with a ground voltage and said second semiconductor region is supplied with a power voltage, respectively.

4. A semiconductor integrated circuit device according to claim 1, wherein an n-channel MISFET for driving and a p-channel MISFET for loading are formed in a first semiconductor region and a second semiconductor region, which are isolated by an isolation region, respectively, said first semiconductor region is supplied through said metal silicide layer on the source region with a voltage which is supplied to the source region of said drive n-channel MISFET and said second semiconductor region is supplied through said metal silicide layer with a voltage which is supplied to the source region of said load p-channel MISFET.

5. A semiconductor integrated circuit device according to claim 1, wherein said first conductor in said first contact hole is contacting the silicide layer formed on the source region, and said second conductor in said second contact hole is contacting the drain region.

* * * * *